United States Patent
Kawakubo et al.

[11] Patent Number: 5,989,761
[45] Date of Patent: Nov. 23, 1999

[54] EXPOSURE METHODS FOR OVERLAYING ONE MASK PATTERN ON ANOTHER

[75] Inventors: Masaharu Kawakubo; Ryoichi Kaneko, both of Kanagawa-ken, Japan

[73] Assignee: Nikon Corporation, Tokyo, Japan

[21] Appl. No.: 09/236,090

[22] Filed: Jan. 25, 1999

Related U.S. Application Data

[63] Continuation of application No. 08/654,419, May 28, 1996.

[30] Foreign Application Priority Data

| May 29, 1995 | [JP] | Japan | 7-130131 |
| Jun. 20, 1995 | [JP] | Japan | 7-152856 |
| Aug. 4, 1995 | [JP] | Japan | 7-199676 |
| Aug. 9, 1995 | [JP] | Japan | 7-203276 |

[51] Int. Cl.$^6$ ............................................. G03F 9/00
[52] U.S. Cl. ................................................ 430/22; 430/30
[58] Field of Search .................................. 430/22, 30

[56] References Cited

U.S. PATENT DOCUMENTS

| 4,708,466 | 11/1987 | Isohata et al. | 355/537 |
| 4,734,746 | 3/1988 | Ushida | 355/77 |
| 4,792,693 | 12/1988 | Yamaguchi et al. | 250/538 |
| 5,434,026 | 7/1995 | Takatsu et al. | 430/30 |
| 5,468,580 | 11/1995 | Tanaka | 430/22 |

*Primary Examiner*—Christopher G. Young
*Attorney, Agent, or Firm*—Armstrong, Westerman, Hattori, McLeland & Naughton

[57] ABSTRACT

An exposure method in which mask patterns are overlaid on one another on a substrate, which is an object to be exposed, by using a first and second exposure apparatuses having respective exposure fields of different sizes. The exposure method includes the steps of: sequentially transferring a first mask pattern onto the substrate in the form of a first array in units of a shot area of a predetermined size by using the first exposure apparatus; detecting at least either one of a perpendicularity error of the first array from a design value and a mean value of rotation angles of the shot areas in the first array when a second mask pattern is to be sequentially transferred onto the substrate in the form of a second array in units of a shot area different in size from the unit shot area of a predetermined size by using the second exposure apparatus; and rotating the second mask pattern and the substrate relative to each other through an angle corresponding to a result of the detection, and thereafter, sequentially transferring the second mask pattern onto the substrate.

28 Claims, 28 Drawing Sheets

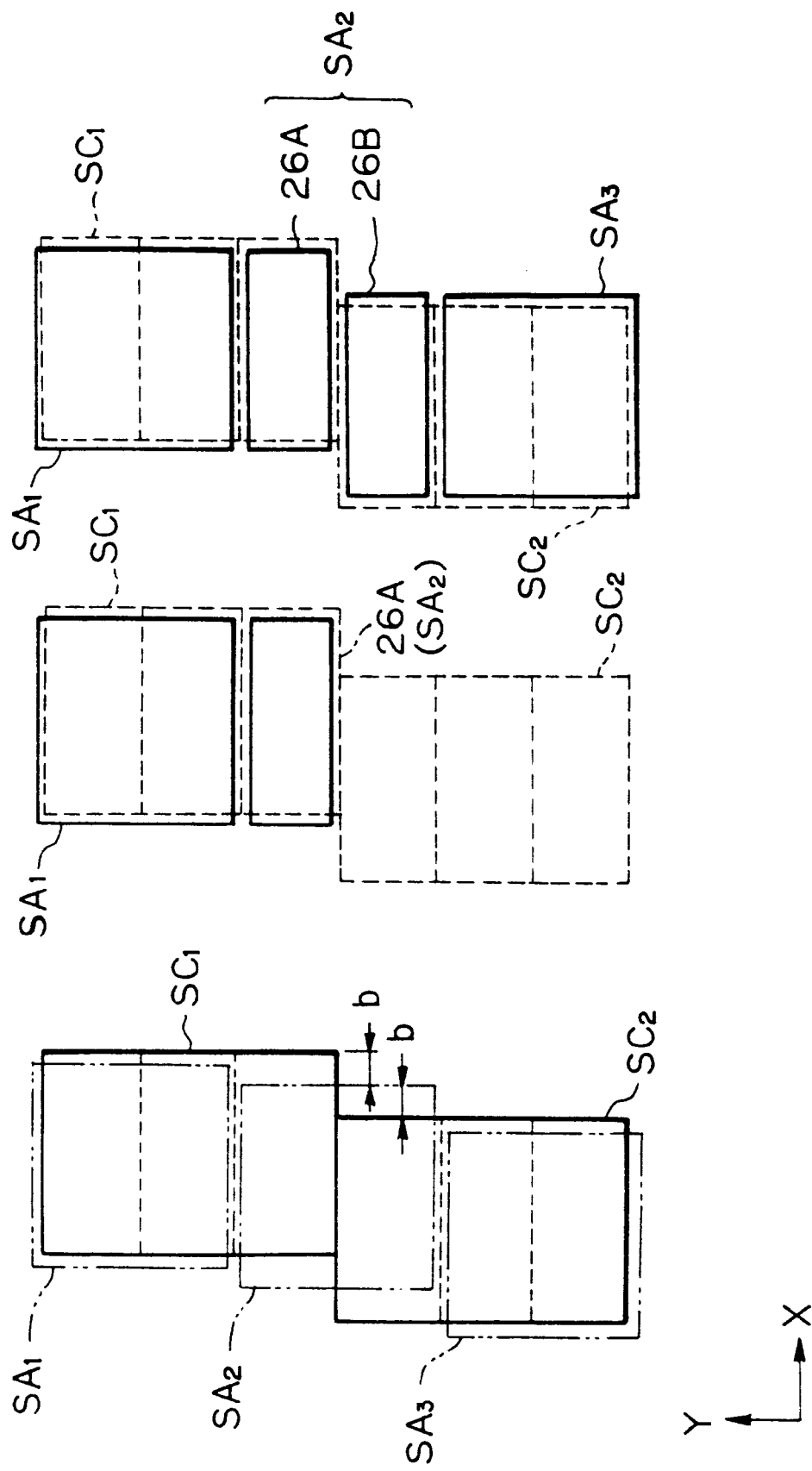

Fig. 25(a)  Fig. 25(b)  Fig. 25(c)
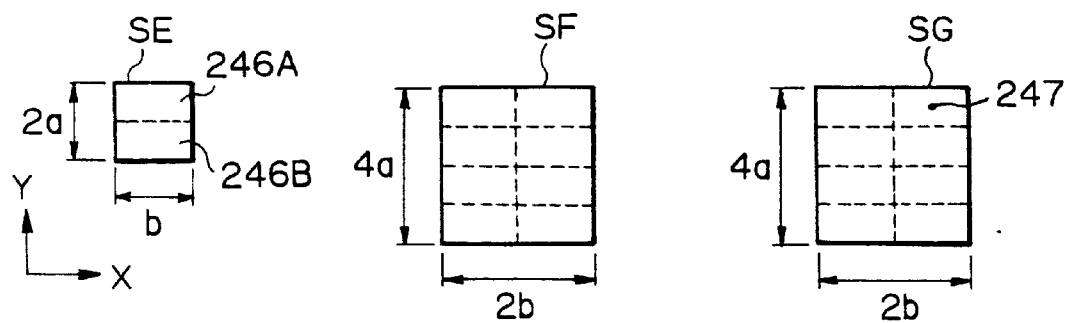
Fig. 26(a)  Fig. 26(b)  Fig. 26(c)
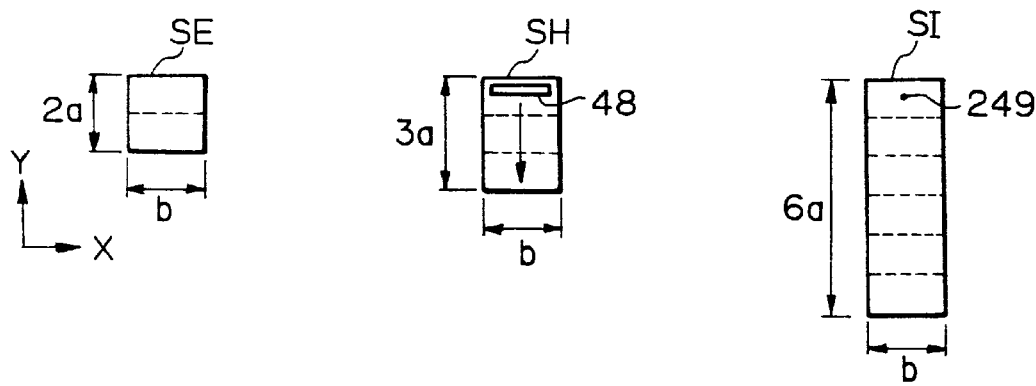
Fig. 27(a)
Fig. 27(b)
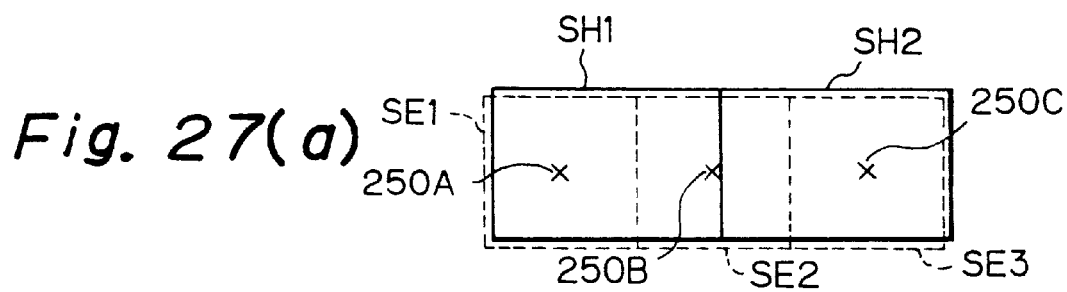

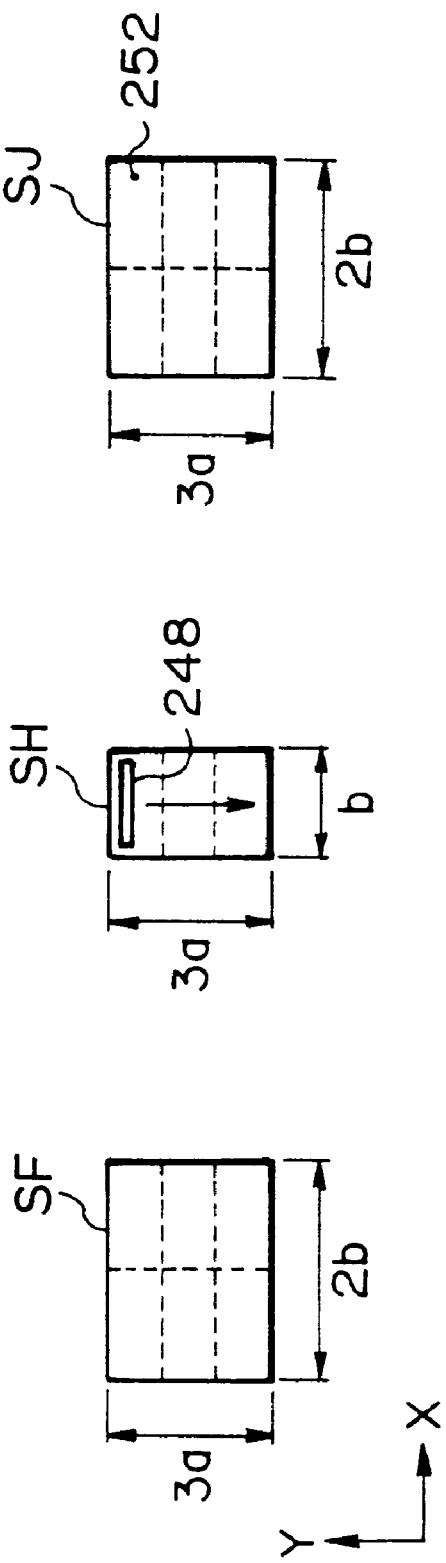

EXPOSURE METHODS FOR OVERLAYING ONE MASK PATTERN ON ANOTHER

This application is a Continuation of prior application Ser. No. 08/654,419 filed May 28, 1996.

BACKGROUND OF THE INVENTION

1. Field of the Invention

The present invention relates to an exposure method for transferring a mask pattern onto a photosensitive substrate during photolithography processes in the manufacture of semiconductor devices, liquid crystal display devices, imaging devices (e.g. CCD), thin-film magnetic heads, etc. More particularly, the present invention relates to an exposure method which is suitably applied to a process in which exposure is sequentially carried out by the mix-and-match method with respect to two layers, that is, a layer called "middle layer", which requires no high resolution, such as an ion-implanted layer used in production of a semiconductor memory or the like, and a layer called "critical layer", which requires high resolution.

2. Related Background Art

Exposure apparatuses, e.g. step-and-repeat reduction projection type exposure apparatuses (steppers), are used in photolithography processes for producing semiconductor devices, liquid crystal display devices, etc. Generally, a semiconductor device such as a VLSI is formed by stacking a multiplicity of pattern layers on a wafer while effecting alignment for each layer. Among the pattern layers, a layer that needs the highest resolution is called "critical layer", and a layer that needs no high resolution, e.g. an ion-implanted layer used in production of a semiconductor memory or the like, is called "middle layer". In other words, the line width of a pattern which is exposed for the middle layer is wider than the line width of a pattern exposed for the critical layer.

There has been an increasing tendency for recent VLSI manufacturing factories to carry out exposure operations for different layers by using respective exposure apparatuses in a process for producing a single type of VLSI in order to increase the throughput (i.e. the number of wafers processed per unit time) in the production process. Under these circumstances, it has become common practice to carry out what is called "mix-and-match" exposure. In the mix-and-match exposure process, exposure for the critical layer is carried out by using a first stepper of high resolution which performs one-shot exposure with a demagnification ratio of 5:1, and exposure for the middle layer is carried out by using a second stepper of intermediate resolution which performs one-shot exposure with a demagnification ratio of 2.5:1. In this case, the size of the exposure field of the second stepper is twice as large as that of the first stepper in both lengthwise and breadthwise directions, and the throughput of the second stepper in the exposure process is approximately four times that of the first stepper. This will be explained below with reference to FIG. 35.

Assuming that, as shown in FIG. 35, exposure units on a wafer which are to be exposed by the first stepper are square shot areas $SA_{11}$, $SA_{12}$, $SA_{13}$, $SA_{14}$, . . . each surrounded by sides which are parallel to X- and Y-axes perpendicularly intersecting each other, an exposure area which is to be exposed by the second stepper is a shot area $SB_1$ which is so large as to substantially contain the four shot areas $SA_{11}$ to $SA_{14}$. When exposure is to be carried out by the second stepper over the four shot areas $SA_{11}$, $SA_{12}$, $SA_{13}$ and $SA_{14}$ exposed by the first stepper, the second stepper effects alignment of the shot area $SB_1$, which corresponds to the exposure field of the second stepper, on the basis of alignment marks (wafer marks) attached to the shot areas $SA_{11}$ to $SA_{14}$.

There is another conventional exposure method in which, for example, a step-and-scan type scanning exposure apparatus with a demagnification ratio of 4:1 is combined with either the above-described first or second stepper. The step-and-scan exposure is a process in which a shot area on a wafer which is to be exposed is stepped to a scanning start position, and thereafter a reticle, which serves as a mask, and the wafer are synchronously scanned with respect to a projection optical system, thereby sequentially transferring a pattern on the reticle onto the shot area. The exposure field of the scanning exposure apparatus is equal, for example, in the width of the non-scanning direction to the exposure field of the first stepper, but the exposure field width in the scanning direction of the scanning exposure apparatus is 1.5 times that of the first stepper. It should be noted that there are various combinations of different exposure field sizes of a plurality of exposure apparatuses used in the mix-and-match exposure method in addition to the above-described combinations.

Thus, the throughput of an exposure process can be increased by carrying out a mix-and-match exposure process using different exposure apparatuses in combination according to the resolution required for each layer on a wafer as described above. However, when exposure apparatuses having respective exposure fields of different sizes are used in combination, if a perpendicularity error remains in the array of shot areas (i.e. shot array) of the preceding layer, i.e. if the angle between the X- and Y-axes of the shot array deviates from 90°, a given overlay error arises. Such a perpendicularity error is due to the fact that the feed directions of the wafer stage driven by motors are not accurately perpendicular to each other.

For example, assuming that in FIG. 35 the imaginary straight line 23A passing through the centers of the shot areas $SA_{13}$ and $SA_{14}$ in the four shot areas of the preceding layer is parallel to the X-axis, if the angle between the X- and Y-axes of the shot array deviates from 90° by an angle (perpendicularity error) W, the imaginary straight line 24 passing through the centers of the shot areas $SA_{11}$ and $SA_{13}$ tilts by the perpendicularity error W [rad] relative to the Y-axis. In this case, if exposure is carried out with the center of the subsequent shot area $SB_1$ aligned with the center 25 of the four shot areas $SA_{11}$, $SA_{12}$, $SA_{13}$ and $SA_{14}$, which have the perpendicularity error W, a uniform overlay error Δx arises in the direction X between the pattern in the shot area $SB_1$ and the pattern in each of the shot areas $SA_{11}$ to $SA_{14}$ of the preceding layer. Assuming that the length of each side of the shot area $SA_{11}$ is L, the overlay error Δx is approximately L·W/2.

In a case where each shot area of the preceding layer has a shot rotation (chip rotation) also, an overlay error arises which is similar to that in a case where the angle between the X- and Y-axes of the shot array deviates from 90°.

FIG. 36 shows the four shot areas $SA_{11}$ to $SA_{14}$ in a situation where the perpendicularity error of the shot array is zero, but the shot rotation is θ [rad]. Let us assume that the shot rotation θ is of the same size as the perpendicularity error W in FIG. 35. In the case of FIG. 36, even if the subsequent shot area $SB_1$ is exposed by rotating it simply through an angle corresponding to the shot rotation θ, a uniform overlay error Δx of the same size as that in the case of FIG. 35 arises in the direction of the shot rotation between the pattern in the shot area SB$_1$ and the pattern in each of the shot areas SA$_{11}$ to SA$_{14}$ of the preceding layer.

That is, when exposure is sequentially carried out by using exposure apparatuses having respective exposure fields of different sizes, if the array of shot areas of the preceding layer has a perpendicularity error or a shot rotation, a uniform overlay error arises if the subsequent shot areas are simply aligned with respect to the preceding shot areas.

On the other hand, in the above-described mix-and-match method, in which after a layer on a wafer has been exposed by a first exposure apparatus, overlay exposure is carried out on the preceding layer by using a second exposure apparatus, the second exposure apparatus may effect alignment by an enhanced global alignment (hereinafter referred to as "EGA") method as disclosed, for example, in Japanese Patent Application Unexamined Publication (KOKAI) (hereinafter referred to as "JP(A)") No. 61-44429 (corresponding to U.S. Pat. No. 4,780,617). In this case, however, some problems are experienced, which will be explained below with reference to FIGS. 37(a) to 38(c).

FIGS. 37(a), 37(b) and 37(c) illustrate a related art in which exposure is carried out by the mix-and-match method using two exposure apparatuses having respective exposure fields of the same size. First, a pattern image of a reticle RA shown in FIG. 37(b) is transferred onto each of shot areas 129A, 129B, . . . , 129I of a first layer, which are shown by the chain lines in FIG. 37(a), on a wafer 20 by using a first exposure apparatus. In this case, it is assumed that a coordinate system that defines each particular travel position of a wafer stage of the first exposure apparatus (i.e. stage coordinate system) comprises an X1-axis and a Y1-axis, and that the Y1-axis is tilted by an angle W clockwise from an ideal Y1*-axis which is perpendicular to the X1-axis. Further, the reticle RA has two identical circuit patterns 112A and 112B (i.e. two-chip pattern) formed in a pattern area 42A. The rotation angle of the reticle RA has been set so that the circuit patterns 112A and 112B are arrayed in a direction perpendicular to the X1-axis when exposure is carried out.

As a result, the shot areas 129A to 129I of the first layer are arrayed at a predetermined pitch along each of the X1- and Y1-axes, and the shot array has a perpendicularity error W. Further, two identical circuit pattern images are transferred onto each of the shot areas 129A to 129I in such a manner as to lie in side-by-side relation to each other in a direction perpendicular to the X1-axis.

Next, a pattern image of a reticle RC shown in FIG. 37(c) is transferred onto each of shot areas of a second layer on the wafer 20 by using a second exposure apparatus. In this case, it is assumed that a stage coordinate system of the second exposure apparatus comprises an X2- axis and a Y2-axis, and that a direction corresponding to the X1-axis of the first layer on the wafer 20 has been set parallel to the X2-axis by pre-alignment carried out in the second exposure apparatus. Although the origins of the coordinate systems (X1,Y1) and (X2,Y2) in FIG. 37(a) have been set at the center of the wafer 20 for the sake of explanation, it should be noted that the origins of these coordinate systems may be set at any positions. The reticle RC also has two identical circuit patterns 127A and 127B formed in a pattern area 42C, and the image of the pattern area 42A of the reticle RA as projected on the wafer 20 (i.e. exposure field) and the projected image (exposure field) of the pattern area 42C of the reticle RC are of the same size.

In this case, the second exposure apparatus effects alignment by the above-described EGA method. That is, array coordinates of wafer marks (not shown) provided for a predetermined number of shot areas (sample shots) selected from the first layer on the wafer 20 are measured to thereby calculate array coordinates of all the shot areas in the stage coordinate system (X2,Y2). Thus, the second exposure apparatus can recognize that the perpendicularity error W is present in the shot array on the first layer.

In the second exposure apparatus, therefore, the rotation angle of the reticle RC is set so that the two circuit patterns 127A and 127B are arrayed in a direction perpendicular to the X2-axis, as shown in FIG. 37(c), and thereafter, a shot array of a second layer is set by taking into consideration the perpendicularity error W. Then, exposure is carried out. As a result, the circuit pattern images of the reticle RC are transferred onto each of shot areas 130A, 130B, . . . , 130I of the second layer, shown by the solid lines in FIG. 37(a), on the wafer 20. Thus, the shot array of the second layer is accurately overlaid on the shot array of the first layer.

In a case where the exposure fields (shot areas) of two exposure apparatuses have the same size as described above, even if the shot array of the first layer has a perpendicularity error, the overlay accuracy between the first and second layers can be maintained at high level by effecting alignment according to the EGA method, for example.

However, if the shot array of the first layer has a perpendicularity error in a case where the exposure fields of the two exposure apparatuses have different sizes, the overlay accuracy between the two layers cannot be increased above a certain level by an ordinary exposure method.

FIGS. 38(a), 38(b) and 38(c) illustrate a related art in which exposure is carried out by the mix-and-match method using two exposure apparatuses having respective exposure fields of different sizes. First, a pattern image of a two-chip reticle RA, which has two identical patterns 112A and 112B written in a pattern area 42A as shown in FIG. 38(b), is transferred onto each of shot areas of a first layer on a wafer 20 by using a first exposure apparatus. Next, a pattern image of a three-chip reticle RB, which has three identical circuit patterns 113A to 113C written in a pattern area 42B as shown in FIG. 38(c), is transferred onto each of shot areas of a second layer on the wafer 20 by a second exposure apparatus. The image of the reticle RB as projected on the wafer 20 has the same horizontal width as that of the projected image of the reticle RA, but the vertical width of the projected image of the reticle RB is 3/2 times that of the reticle RA.

In this case also, the stage coordinate system of the first exposure apparatus is denoted by (X1,Y1), and the stage coordinate system of the second exposure apparatus is denoted by (X2,Y2), and it is assumed that alignment and exposure are carried out with the X2-axis aligned with the X1-axis. When exposure is carried out with the first exposure apparatus by setting the reticle RA so that the two circuit patterns of the reticle RA are arrayed in a direction perpendicular to the X1-axis, the circuit patterns are transferred onto each of shot areas 129A, 129B, . . . , 129I of the first layer, shown by the chain lines in FIG. 38(a), on the wafer 20. In this case also, the array of the shot areas 129A to 129I has a perpendicularity error in the same way as in the example shown in FIGS. 37(a) to 37(c).

Thereafter, the wafer 20 is aligned by the EGA method using a second exposure apparatus, and then exposure is carried out in such a manner that the three circuit patterns of the reticle RB are arrayed in a direction perpendicular to the X2-axis. Consequently, the three circuit patterns are transferred onto each of shot areas 131A to 131F of the second layer on the wafer 20, as shown by the solid lines in FIG. 38(a). However, because each shot area of the first layer has two circuit patterns transferred thereto, while each shot area of the second layer has three circuit patterns transferred thereto, the shot array of the first layer and the shot array of the second layer undesirably differ from each other in the number of rows in a direction approximately perpendicular to the X1-axis. As a result, it becomes impossible to eliminate the effect of a perpendicularity error, which is an error between the rows or columns of a shot array. For example, in FIG. 38(a), if the shot area 129A and the shot area 131A are aligned in the direction X1 (or X2), a large overlay error arises in the direction X1 between the shot area 129B and the shot area 131A.

Meanwhile, if both a first and second exposure apparatuses employ the EGA method, the following problems arise. The problems will be explained below with reference to FIGS. 39(a) to 41(b).

In this EGA process, array coordinates of a predetermined number of shot areas (sample shots), which have previously been selected from among shot areas on a wafer, are measured to determine, for example, six coordinate transformation parameters for calculating array coordinates in a stage coordinate system, in which the wafer stage is to be positioned, from the design array coordinates of all the shot areas.

However, when a pattern for a middle layer is transferred onto a critical layer by the mix-and-match exposure method, for example, a given overlay error may remain if the coordinate transformation parameters obtained by the EGA method (hereinafter occasionally referred to as "EGA parameters") are used as they are because different projection exposure apparatuses are used for the critical and middle layers. This means that the EGA parameters may have residual errors. In order to correct such residual errors, the conventional practice is to measure overlay errors by conducting test printing using marks for overlay accuracy measurement (hereinafter referred to as "vernier marks"), as described below.

FIG. 39(a) shows a wafer 20 having vernier marks formed by a projection exposure apparatus for exposure of a critical layer. In FIG. 39(a), shot areas SE1, SE2, . . . , SEM (M is an integer of 12 or more, for example) are arrayed on the wafer 20 at a predetermined pitch along each of the X- and Y-axes of an orthogonal coordinate system (X,Y). In each shot area SEm (m=1 to M), alignment marks (wafer marks) and overlay accuracy measuring vernier marks have been formed.

FIG. 39(b) is an enlarged view showing the mark arrangement in a shot area SEm. In FIG. 39(b), the shot area SEm has a wafer mark 221X for the X-axis formed at an end in the direction +Y. The wafer mark 221X comprises line-and-space patterns arranged at a predetermined pitch in the direction X. The shot area SEm further has a wafer mark 221Y for the Y-axis formed at an end in the direction +X. The wafer mark 221Y comprises line-and-space patterns arranged at a predetermined pitch in the direction Y. The wafer marks 221X and 221Y are marks which are detected by an imaging detection method (FIA method). Further, the shot area SEm has vernier marks 222A to 222E formed therein at respective positions which are distributed in a cross shape. The vernier marks 222A to 222E are, for example, box-in-box marks which are detected by an imaging detection method (image processing detection method).

Next, predetermined vernier marks are overlaid on the wafer 20 shown in FIG. 39(a) by exposure using a projection exposure apparatus for a middle layer. For the overlay exposure, it is necessary to obtain array coordinates of each shot area SEm (m=1 to M) on the wafer 20 in the stage coordinate system of the projection exposure apparatus for a middle layer. Therefore, it is assumed that the wafer marks 221A and 221Y of each shot area SEm (m=1 to M) indicate the coordinates of the center of the corresponding shot area. It is further assumed that the design array coordinates of the center of each shot area SEm (m=1 to M) in the coordinate system on the wafer 20 (i.e. the sample coordinate system) are (Dxn,Dyn), and that the computational array coordinates of each shot area SEm (m=1 to M) in the stage coordinate system of the projection exposure apparatus for a middle layer are (Fxn,Fyn). In this case, the X component Dxn and Y component Dyn of the design array coordinates of the center of each shot area SEm are the X coordinate of the corresponding wafer mark 221X and the Y coordinate of the corresponding wafer mark 221Y, respectively, which may be approximately expressed by the following equation (1):

$$\begin{bmatrix} Fxn \\ Fyn \end{bmatrix} = \begin{bmatrix} Rx & -Rx(W+\Theta) \\ Ry \cdot \Theta & Ry \end{bmatrix} \begin{bmatrix} Dxn \\ Dyn \end{bmatrix} + \begin{bmatrix} Ox \\ Oy \end{bmatrix} \quad (1)$$

The transformation matrix in Eq. (1) has as elements six coordinate transformation parameters (EGA parameters), including scaling parameters RX and Ry, rotation $\Theta$, perpendicularity W, and offsets Ox and Oy. The scaling parameters Rx and Ry are linear expansion and contraction quantities in the directions X and Y, respectively. The rotation $\Theta$ is an angle of rotation of the wafer 20. The perpendicularity W is a perpendicularity error, that is, a deviation of the intersection angle between the X- and Y-axes from 90°. The offsets Ox and Oy are shift quantities in the directions X and Y, respectively. Next, in order to determine values of the six coordinate transformation parameters, the projection exposure apparatus for a middle layer measures array coordinates in the stage coordinate system of the wafer marks 221X and 221Y provided for each of, for example, 10 shot areas (sample shots) SEa, SEb, SEc, . . . , SEj selected from among the shot areas on the wafer 20 shown in FIG. 39(a). The sample shots SEa to SEj are disposed at the vertices of an approximately regular polygon on the surface of the wafer 20 or at uniformly dispersed random positions.

In this case, the measured values of the array coordinates in the stage coordinate system of the wafer marks 221X and 221Y obtained by the n-th measuring operation (n=1 to 10), that is, the measured array coordinates of the center of the n-th sample shot, are assumed to be (Mxn,Myn). Next, the design array coordinates (Dxy,Dyn) of the wafer marks 221X and 221Y are substituted into the right-hand side of Eq. (1) to obtain computational array coordinate values (Fxn,Fyn). Then, deviations of the measured coordinate values (Mxn,Myn) from the computational array coordinate values (Fxn,Fyn), that is, alignment errors (Exn,Eyn)(= (Mxn−Fxn,Myn−Fyn)), are obtained. Thereafter, values of the six EGA parameters are determined so as to minimize the sum of the squares of the alignment errors obtained for all the sample shots, that is, the residual error component.

Assuming that the number of measured sample shots is K (K=10 in FIG. 39(a)), the residual error component is expressed by the following equation (2). For example, values of the six EGA parameters (scaling parameters Rx, Ry, wafer rotation $\Theta$, perpendicularity W, and offset quantities Ox, Oy) are obtained by solving simultaneous equations established by setting the result of partial differentiation of Eq. 2 with respect to each of the six EGA parameters equal to zero.

$$\text{Residual error component} = \sum_{n=1}^{K} \{(Mxn - FXn)^2 + (Myn - Fyn)^2\} \quad (2)$$

Next, the six EGA parameter values thus obtained and the design array coordinate values (Dxm,Dym) of each shot area SEm (m=1 to M) are sequentially substituted into the right-hand side of Eq. (1), thereby obtaining array coordinate values in the stage coordinate system of each shot area SEm of the critical layer on the wafer 20. Assuming that the demagnification ratio for the critical layer is 5:1, while the demagnification ratio for the middle layer is 2.5:1, that is, the exposure field of the projection exposure apparatus for the middle layer is 2 times as large as the exposure field of the projection exposure apparatus for the critical layer in both the directions X and Y, each middle layer shot area contains four critical layer shot areas.

Therefore, when exposure is to be carried out by the middle layer projection exposure apparatus, the critical layer shot areas SEm (m=1 to M) shown in FIG. 39(a) are divided into a plurality of blocks each comprising two shot areas in the direction X and two shot areas in the direction Y, and array coordinates in the stage coordinate system of the center of each block are obtained from the computational array coordinates of the four shot areas in the block. Thereafter, the array coordinates of the center of each block on the wafer 20 are sequentially aligned with the center of the exposure field of the middle layer projection exposure apparatus, and a pattern image of a reticle for the middle layer, which contains vernier marks, is transferred onto each block by exposure. After the exposure process, the wafer 20 is subjected to development process.

FIG. 40(a) shows the wafer 20 having overlaid vernier marks formed by the middle layer projection exposure apparatus. In FIG. 40(a), shot areas SF1, SF2, . . . , SFN (N is an integer of 3 or more, for example) of the middle layer are arrayed on the wafer 20 at a predetermined pitch along each of the X- and Y-axes, and each shot area SFn (n=1 to N) contains four critical layer shot areas. Further, the center 261 of each shot area SFn is approximately coincident with the center of the corresponding block of four critical layer shot areas. Each shot area SFn has 20 (=4×5) vernier marks corresponding to a total of 20 vernier marks of the critical layer, that is, four groups of five vernier marks 222A to 222E (see FIG. 40(b)).

Here, four shot areas SFa to SFd (shaded shot areas in FIG. 40(a)) are defined as objects to be measured, and amounts of positional displacement of the middle layer vernier marks relative to the critical layer vernier marks are measured, for example, at measuring points 262 to 265 selected at random in the shot areas SFa to SFd. FIG. 40(b) shows the shot area SFa among the four. In FIG. 40(b), the middle layer shot area SFa has middle layer vernier marks 224A to 224E, 226A to 226E, 228A to 228E, and 230A to 230E formed to surround the vernier marks, respectively, which belong to four critical layer shot areas SEp, SE(p+1), SEq and SE(q+1), which underlie the shot area SFa. Accordingly, at the measuring point 262 in the shot area SFa, an amount of positional displacement in the direction X or Y of the middle layer vernier mark 226C relative to the critical layer vernier mark 222C in the shot area SE(p+1) is measured. Similarly, an amount of positional displacement between the two corresponding vernier marks is measured at each of the measuring points 263 to 265.

Consequently, if all the critical layer vernier marks are displaced, for example, by a predetermined amount 6x in the direction X relative to the middle layer vernier marks at all the measuring points 262 to 265, in FIG. 40(a), it is revealed that the X-axis offset Ox in the EGA parameters has a residual error δX. Therefore, the residual error is previously stored in a control system of the middle layer projection exposure apparatus as a system constant to correct an alignment result, thereby making it possible to form a middle layer pattern over the critical layer by exposure with high overlay accuracy.

Thus, residual errors of the EGA parameters can be corrected by measuring amounts of positional displacement between the critical layer vernier marks and the middle layer vernier marks. However, no particular consideration has heretofore been given to the arrangement of measuring points for measuring amounts of positional displacement between the critical layer vernier marks and the middle layer vernier marks, as shown by the measuring points 262 to 265 in FIG. 40(a). Accordingly, when the projected image for the middle layer has a magnification error or a rotation error, for example, the magnification or rotation error may be erroneously judged to be a residual error of the EGA parameters.

The above problem will be explained below with reference to FIGS. 40(a) to 41(b). FIG. 41(a) shows a state where the middle layer shot area SFa is slightly enlarged relative to a projected image 266 obtained when there is no magnification error. As shown in FIG. 41(a), in the central portion at the right end of the first quadrant of the shot area SFa (i.e. the critical layer shot area SE(p+1)), the middle layer vernier mark 226C is displaced relative to the critical layer vernier mark 222C by Δx1 and Δy1 in the directions X and Y, respectively. In the center portion at the right end of the second quadrant (i.e. the shot area SEp), the middle layer vernier mark 224C is displaced relative to the critical layer vernier mark 222C by approximately Δy1 in the direction Y, but the amount of displacement in the direction X of the middle layer vernier mark 224C is so small as to be ignorable. Similarly, in the third quadrant (i.e. the shot area SEq) and the fourth quadrant (i.e. the shot area SE(q+1)), the two vernier marks are displaced in symmetric relation to those in the second and first quadrants, respectively.

When a projected image of the middle layer has such a magnification error, if an amount of positional displacement in the direction X between the two corresponding vernier marks is measured at the measuring point 265 in the first quadrant of the shot area SFd, shown in FIG. 40(a), and at the measuring point 263 in the second quadrant of the shot area SFb, shown in FIG. 40(a), the results of the measurement are Δx1 and 0, respectively. Accordingly, if residual errors of the EGA parameters of Eq. (1) are obtained by simply processing these amounts of positional displacement, predetermined errors remain in the scaling parameter Rx and offset Ox in the direction X, respectively.

If an amount of positional displacement in the direction X between the two corresponding vernier marks is measured at the measuring point 262 in the first quadrant of the shot area SFa, shown in FIG. 40(a), and at the measuring point 264 in the second quadrant of the shot area SFc, shown in FIG. 40(a), the results of the measurement are Δx1 and 0, respectively. Accordingly, if residual errors of the EGA parameters of Eq. (1) are obtained by simply processing these amounts of positional displacement, predetermined errors remain in the perpendicularity W and the offset Ox in the direction X, respectively. That is, if an amount of positional displacement in the direction X between two corresponding vernier marks is measured at measuring points in middle layer shot areas defined as objects to be measured, which measuring points are in different columns on the critical layer, the magnification error of the middle layer may be mistaken for a residual error (linear error) in the EGA parameters. Such erroneous recognition may also occur in the case of measuring an amount of positional displacement in the direction Y between two corresponding vernier marks.

FIG. 41(b) shows a state where the middle layer shot area SFa has been rotated counterclockwise relative to the projected image 266 obtained when there is no error (i.e. a state where the shot area SFa has a shot rotation error). As shown in FIG. 41(b), in the central portion at the right end of the first quadrant of the shot area SFa, the middle layer vernier mark 226C is displaced relative to the critical layer vernier mark 222C by $-\Delta x2$ and $\Delta y2$ in the directions X and Y, respectively. In the central portion at the right end of the second quadrant (i.e. the shot area SEp), the middle layer vernier mark 224C is displaced relative to the critical layer vernier mark 222C by approximately $-\Delta x3$ in the direction X, but the amount of displacement in the direction Y of the middle layer vernier mark 224C is so small as to be ignorable. Similarly, in the third and fourth quadrants, the two corresponding vernier marks are displaced in symmetric relation to those in the second and first quadrants, respectively.

When a projected image of the middle layer has such a rotation error, if an amount of positional displacement in the direction X between two corresponding vernier marks is measured at the measuring point 265 in the first quadrant of the shot area SFd, shown in FIG. 40(a), and at the measuring point 263 in the second quadrant of the shot area SFb, shown in FIG. 40(a), the results of the measurement are $-\Delta x2$ and $-\Delta x3$, respectively. Accordingly, if residual errors in the EGA parameters of Eq. (1) are obtained by simply processing these amounts of positional displacement, an error remains in a parameter other than the offset Ox among the EGA parameters of Eq. (1). When an amount of positional displacement in the direction Y between two corresponding vernier marks is measured at each of the measuring points 265 and 263, an error similarly remains in an EGA parameter other than the offset Oy. Thus, it will be understood that, when amounts of positional displacement between the critical layer vernier marks and the middle layer vernier marks are measured to correct residual errors of the EGA parameters, a mere magnification error or rotation error of a middle layer shot area may be mistaken for a residual error of an EGA parameter other than the offsets Ox and Oy depending upon the selection of the positions of measuring points in middle layer shot areas as objects to be measured.

When critical layer shot areas (chip patterns) have a magnification error or a rotation error (chip rotation), such an error may also be mistaken for a residual error of an EGA parameter other than the offsets Ox and Oy depending upon the selection of measuring points for measuring amounts of positional displacement between the corresponding vernier marks.

As has been described above, residual errors of the EGA parameters can be corrected by measuring amounts of positional displacement between the critical layer vernier marks and the middle layer vernier marks. However, there may be residual errors not only in the above-described coordinate transformation parameters related to the whole wafer but also in so-called in-shot parameters comprising shot magnifications (i.e. linear expansion and contraction of each chip pattern in the directions X and Y) rx and ry, shot rotation (i.e. a rotation angle of each chip pattern) $\theta$, and shot perpendicularity (i.e. a perpendicularity error of the coordinate system in each chip pattern) w.

To obtain a correction value for the shot magnification rx, for example, it is conceivable to measure an amount of positional displacement between two corresponding vernier marks at each of the two opposite measuring points 262 and 266 in the shot area SFa shown in FIG. 40(a). A residual shot magnification error, i.e. a correction value for the shot magnification rx, should be calculable from the difference between the X components of the amounts of positional displacement measured at the two measuring points 262 and 266. Similarly, a residual shot rotation error should be calculable.

In actual practice, however, the vernier mark positions on the critical layer may have different stepping errors because the measuring points 262 and 266 belong to different shot areas SE(p+1) and SEp on the critical layer. That is, if no consideration is given to the arrangement of measuring points at which vernier marks are to be read, variation due to the stepping accuracy of the wafer stage may be mistaken for a residual shot magnification error or a residual shot rotation error. If an erroneous correction value is used to correct the corresponding in-shot parameter, the alignment accuracy reduces disadvantageously.

SUMMARY OF THE INVENTION

In view of the above-described problems, an object of the present invention is to provide an exposure method capable of minimizing an overlay error when a preceding layer has a perpendicularity error in an array of shot areas or a shot rotation in a case where exposure is carried out by the mix-and-match method using a plurality of exposure apparatuses having respective exposure fields of different sizes.

Another object of the present invention is to provide an exposure method capable of minimizing an overlay error when a perpendicularity error remains in a shot array on a first layer in a case where exposure is carried out by the mix-and-match method using a plurality of exposure apparatuses which are different from each other in the size of exposure field (shot area) on a photosensitive substrate.

Still another object of the present invention is to provide an exposure method capable of increasing an overlay accuracy between a critical layer pattern and a middle layer pattern in a case where exposure is carried out by the mix-and-match method with respect to a substrate where a critical layer and a middle layer are mixedly present.

The present invention provides an exposure method in which mask patterns are overlaid on one another on a substrate, which is an object to be exposed, by using a first and second exposure apparatuses having respective exposure fields of different sizes. The exposure method includes the steps of: sequentially transferring a first mask pattern onto the substrate in the form of a first array in units of a shot area of a predetermined size by using the first exposure apparatus; detecting at least either one of a perpendicularity error of the first array from a design value and a mean value of rotation angles of the shot areas in the first array when a second mask pattern is to be sequentially transferred onto the substrate in the form of a second array in units of a shot area different in size from the unit shot area of a predetermined size by using the second exposure apparatus; and rotating the second mask pattern and the substrate relative to each other through an angle corresponding to a result of the detection, and thereafter, sequentially transferring the second mask pattern onto the substrate.

The function of the above-described exposure method according to the present invention will be explained below. Let us assume that the perpendicularity of the first array, which is an array of shot areas to which the first mask pattern is to be transferred, has an angle W of deviation from a design value (90° in general). Further, it is assumed that each of these shot areas has a square outer shape, and that one shot area in a second shot array to which a second mask pattern is to be transferred is laid over four shot areas in the first array. In this case, according to the present invention, the second mask pattern and the substrate are rotated relative to each other so that the angle $\delta$ of rotation of the shot area in the second array, which is defined about the center of the four shot areas, is W/4. By doing so, the overlay error between the first mask pattern image and the second mask pattern image on the substrate is reduced to a minimum on the average.

On the other hand, when the perpendicularity error of the first array is zero and the shot rotation of the four shot areas is W, the rotation angle $\delta$ of the shot area over the four shot areas is also set at W/4, whereby the overlay error between the first mask pattern image and the second mask pattern image on the substrate is reduced to a minimum on the average.

In addition, the present invention provides another exposure method in which mask patterns are overlaid on one another on a substrate, which is an object to be exposed, by using a first exposure apparatus having a first exposure field of a predetermined size, and a second exposure apparatus which scans a mask and the substrate synchronously to sequentially transfer a pattern formed on the mask onto the substrate, and which has a second exposure field different in size from the first exposure field. The exposure method includes the steps of: sequentially transferring a first mask pattern onto the substrate in the form of a first array in units of a shot area of a predetermined size by using the first exposure apparatus; detecting at least either one of a perpendicularity error of the first array from a design value and a mean value of rotation angles of the shot areas in the first array when a second mask pattern is to be sequentially transferred onto the substrate in the form of a second array over the first array in units of a shot area different in size from the unit shot area of a predetermined size by using the second exposure apparatus; and displacing the second mask pattern and the substrate relative to each other in a direction perpendicular to a scanning direction of the second exposure apparatus by a distance corresponding to a result of the detection, and thereafter, sequentially transferring the second mask pattern onto the substrate by a scanning exposure method.

In this case, it is desirable to rotate the second mask pattern and the substrate relative to each other through an angle corresponding to the result of detection of at least either one of a perpendicularity error of the first array from a design value and a mean value of rotation angles of the shot areas in the first array.

In the above-described exposure method according to the present invention, a scanning type exposure apparatus such as a step-and-scan exposure apparatus is used as the second exposure apparatus. Let us assume that the width in one direction (e.g. a direction Y) of each shot area in the first array is L, and that the first array has a perpendicularity error W. Further, the width in the direction Y of each shot area in the second array formed by the second exposure apparatus is assumed to be (3/2)L. In this case, if exposure is carried out with the centers of shot areas in the second array being merely aligned with the center line of the first array, an overlay error of a predetermined maximum width occurs between the first and second mask pattern images.

Therefore, in the above-described method according to the present invention, exposure is carried out with the centers of shot areas in the second array being displaced relative to the center line of the first array in a direction perpendicular to the direction Y by a width d ($\approx$L·W/4). By doing so, the overlay error between the first mask pattern image and the second mask pattern image on the substrate is reduced to a minimum on the average. In a case where the first array has a shot rotation also, the overlay error can be minimized by displacing the position of each shot area in the second array.

Further, if the rotation that is used in the first exposure method is used in the second exposure method, the overlay error is further reduced.

In addition, the present invention provides another exposure method in which a first mask pattern is transferred onto a photosensitive substrate in the form of a predetermined array by using a first exposure apparatus having a first exposure field of a predetermined shape, and a second mask pattern is transferred onto the photosensitive substrate over the first mask pattern array by using a second exposure apparatus having a second exposure field different from the first exposure field in length in a predetermined direction. In the exposure method, when the first mask pattern is to be transferred onto the photosensitive substrate by using the first exposure apparatus, an array of a plurality of shot areas to each of which the first mask pattern is to be transferred is set on the photosensitive substrate along a direction (X1) corresponding to the direction in which the first exposure field is different in length from the second exposure field.

According to the above-described exposure method of the present invention, the array of a plurality of shot areas to which the first mask pattern is to be transferred is such that an imaginary straight line passing through shot areas which are adjacent to each other in the direction X1, which corresponds to the direction in which the first exposure field is different in length from the second exposure field, is parallel to the direction X1. As a result, when shot areas of a second layer are arrayed over the shot areas of the first layer by using the second exposure apparatus, the overlay error is minimized even if the shot array of the first layer has a perpendicularity error.

In this exposure method, when the first mask pattern is to be transferred onto the photosensitive substrate by using the first exposure apparatus, the photosensitive substrate and the first mask pattern have previously been rotated through 90° from their ordinary positions. By doing so, even if a perpendicularity error is present in the shot array of the first layer, the shot areas of the first layer can be arrayed in a straight-line form along the direction (X1) corresponding to the direction in which the first exposure field is different in length from the second exposure field.

One example of the second exposure apparatus is a scanning exposure type exposure apparatus; in this case, it is desirable that the above-described predetermined direction should be the scanning direction. The reason for this is that the exposure field of a scanning exposure type exposure apparatus can be readily lengthened in the scanning direction.

In addition, the present invention provides another exposure method in which mask patterns are overlaid on one another on a photosensitive substrate, which is an object to be exposed, by using a first exposure apparatus having a first exposure field of a predetermined size on the photosensitive substrate, and a second exposure apparatus having a second exposure field which is $M_1/N_1$ times ($M_1$ and $N_1$ are integers; $M_1 > N_1$) as large as the first exposure field in a first direction and which is $M_2/N_2$ times ($M_2$ and $N_2$ are integers; $M_2 \geq N_2$) as large as the first exposure field in a second direction which is perpendicular to the first direction. The exposure method has the first step of sequentially transferring an image of a first mask pattern, which has an alignment mark and a first overlay accuracy measuring mark, onto the photosensitive substrate in the form of a two-dimensional array extending in the first and second directions in units of the first exposure field by using the first exposure apparatus.

The exposure method according to the present invention further has: the second step of transferring an image of a second mask pattern, which has a second overlay accuracy measuring mark, over a plurality of images of the first mask pattern, which have been transferred onto the photosensitive substrate in the first step, in a two-dimensional array extending in the first and second directions on the photosensitive substrate in units of the second exposure field with reference to the position of the image of the alignment mark by using the second exposure apparatus; and the third step of dividing an exposure area on the photosensitive substrate into a plurality of reference measurement areas in units of an area which is $N_1$ times as large as the width of the second exposure field in the first direction on the photosensitive substrate and which is $N_2$ times as large as the width of the second exposure field in the second direction on the photosensitive substrate, and measuring an amount of positional displacement between the images of the first and second overlay accuracy measuring marks lying at the mutually identical positions in a predetermined number of reference measurement areas selected from among the plurality of reference measurement areas, thereby obtaining a correction value which is used when the position of the alignment mark image transferred by the first exposure apparatus is detected by the second exposure apparatus on the basis of the amount of positional displacement measured as described above. Thereafter, the exposure position is corrected by using the correction value obtained in the third step when overlay exposure is carried out by using the second exposure apparatus with respect to the surface of the photosensitive substrate exposed by the first exposure apparatus.

In this case, it is desirable for the second exposure apparatus to calculate the exposure position on the basis of the alignment mark image and by use of a predetermined coordinate transformation parameter (EGA parameter) and to obtain a correction value for the coordinate transformation parameter in the third step.

According to the above-described exposure method of the present invention, the first exposure apparatus is used, for example, for exposure of a critical layer, and the second exposure apparatus is used, for example, for exposure of a middle layer because the second exposure field is larger than the first exposure field. Further, because the second exposure field is $M_1/N_1$ times and $M_2/N_2$ times as large as the first exposure field in the first and second directions, respectively, if the widths in the first and second directions of the first mask pattern image formed by the first exposure apparatus are denoted by d and c, respectively, the widths in the first and second directions of the second mask pattern image formed by the second exposure apparatus are $dM_1/N_1$ and $cM_2/N_2$, respectively.

Assuming that the integers $M_1$ and $N_1$ have no common divider other than 1, and the integers $M_2$ and $N_2$ also have no common divider other than 1, an area on the photosensitive substrate which has a size regarded as being the least common multiple of the sizes of the first and second mask pattern images is an area which has a width $dM_1$ in the first direction and a width $cM_2$ in the second direction, that is, a reference measurement area which is $N_1$ times and $N_2$ times as large as the width of the second exposure field in the first and second directions, respectively. Such a reference measurement area contains an integer number of first and second mask pattern images in each of the first and second directions.

If $M_1=2$, $N_1=1$, $M_2=2$, and $N_2=1$, for example, the second mask pattern image itself is the reference measurement area. In such a case, in the present invention, if an amount of positional displacement between two corresponding alignment mark images is measured at a measuring point in the top right portion of the first reference measurement area, an amount of positional displacement between two corresponding alignment mark images is similarly measured at a measuring point in the top right portion of each of the second to fourth reference measurement areas. Thus, a magnification error or rotation error of the second exposure field is approximately equally introduced into all the measured amounts of positional displacement. Accordingly, there is no likelihood that a magnification error or rotation error of the second exposure field will be mistaken for an error component other than an offset component in the amount of positional displacement between the first and second mask pattern images. Thus, the overlay accuracy improves.

In this case, if an alignment method in which coordinate transformation parameters are employed, e.g. the EGA method, is used for the exposure process carried out by the second exposure apparatus, there is no likelihood that a magnification error or rotation error of the second exposure field will be mistaken for a coordinate transformation parameter other than an offset.

In addition, the present invention provides another exposure method in which mask patterns are overlaid on one another on a photosensitive substrate by using a first and second exposure apparatuses having respective exposure fields of different sizes. In the exposure method, images of a first and second mask patterns containing overlay accuracy measuring marks are sequentially transferred onto a photosensitive substrate for evaluation, being overlaid on one another, by using the first and second exposure apparatuses, and an amount of positional displacement between the overlaid images of the overlay accuracy measuring marks is measured at a predetermined measuring point in a reference measurement area on the evaluation photosensitive substrate in which a shot area formed in units of the exposure field of the first exposure apparatus and a shot area formed in units of the exposure field of the second exposure apparatus are overlaid on one another such that neither of the overlaid shot areas extends over beyond a part of the reference measurement area (or neither of the overlaid shot areas extends over a plurality of shot areas).

On the basis of the result of the measurement, alignment or correction of image-formation characteristics is effected when exposure is to be carried out by the second exposure apparatus with respect to the surface of the photosensitive substrate exposed by the first exposure apparatus.

In the above-described exposure method according to the present invention, the reference measurement area does not extend over a plurality of shot areas in either of two layers. Therefore, the amount of positional displacement measured at a measuring point in the reference measurement area contains no effect of stepping error of either of the exposure apparatuses. Accordingly, a high overlay accuracy is obtained by carrying out exposure after a parameter for alignment or a parameter indicating image-formation characteristics has been corrected on the basis of the measured amount of positional displacement.

In addition, the present invention provides another exposure method in which mask patterns are overlaid on one another on a photosensitive substrate, which is an object to be exposed, by using a first exposure apparatus having a first exposure field of a predetermined size on the photosensitive substrate, and a second exposure apparatus having a second exposure field which is $M_1/N_1$ times ($M_1$ and $N_1$ are integers; $M_1 \neq N_1$) as large as the first exposure field in a first direction and which is $M_2/N_2$ times ($M_2$ and $N_1$ are integers) as large as the first exposure field in a second direction which is perpendicular to the first direction. The exposure method has: the first step of sequentially transferring an image of a first mask pattern, which has an alignment mark and a first overlay accuracy measuring mark, onto a plurality of first shot areas arrayed on the photosensitive substrate in units of the first exposure field by using the first exposure apparatus; and the second step of sequentially transferring an image of a second mask pattern, which has a second overlay accuracy measuring mark, onto a plurality of second shot areas arrayed on the photosensitive substrate, exposed in the first step, in units of the second exposure field with reference to the image of the alignment mark by using the second exposure apparatus.

Further, the exposure method according to the present invention has the third step of defining a plurality of reference measurement areas on the photosensitive substrate in each of which any one of the first shot areas and any one of the second shot areas are overlaid on one another such that neither of the overlaid shot areas extends over beyond a part of the reference measurement area, and measuring an amount of positional displacement between the images of the first and second overlay accuracy measuring marks lying at the mutually identical positions in a predetermined number of reference measurement areas selected from among the plurality of reference measurement areas, thereby obtaining a correction value which is used when the position of the alignment mark image transferred by the first exposure apparatus is detected by the second exposure apparatus on the basis of the amount of positional displacement measured as described above.

In this case, the first exposure apparatus is used, for example, for a critical layer, and the second exposure apparatus is used, for example, for a middle layer. In the exposure method, if a plurality of measuring points for measuring an amount of positional displacement between a pair of overlay accuracy measuring marks are set in each reference measurement area in order to obtain a linear expansion and contraction error or the like in a shot area, the distribution of the measuring points does not extend over a plurality of first shot areas nor a plurality of second shot areas. Accordingly, the linear expansion and contraction error or the like can be accurately obtained without being affected by stepping errors of the critical and middle layers, and the overlay accuracy between the critical and middle layers is improved by correcting the linear expansion and contraction error at the middle layer.

In this case, each alignment mark and each first overlay accuracy measuring mark may be the same mark.

One example of the correction value obtained in the third step is a correction value for a parameter indicating a predetermined image-formation characteristic calculated on the basis of the positions of the alignment mark images. One example of such a parameter is at least one parameter selected from a parameter group consisting of shot magnifications rx and ry, shot rotation θ, and shot perpendicularity w. In this case, it is desirable to correct the image-formation characteristic by using the correction value obtained in the third step when overlay exposure is to be carried out thereafter by using the second exposure apparatus with respect to the surface of the photosensitive substrate exposed by the first exposure apparatus.

Further, one example of the first exposure apparatus is a one-shot exposure type projection exposure apparatus, and one example of the second exposure apparatus is a scanning exposure type projection exposure apparatus.

BRIEF DESCRIPTION OF THE DRAWINGS

FIGS. 8(a), 8(b) and 8(c) illustrate an alignment method for overlay exposure in which short shot areas are overlaid on an array of long shot areas in the second example of the first embodiment.

FIGS. 25(a), 25(b) and 25(c) show an example of reference measurement areas used in a case where a plurality of chip patterns fit in each shot area of a critical layer.

FIGS. 26(a), 26(b) and 26(c) show an example of reference measurement areas used in a case where shot areas of a middle layer are exposed by a scanning exposure method.

FIGS. 27(a) and 27(b) show that the expansion and contraction quantity of shot areas of a middle layer differs according to measuring points in the example shown in FIGS. 26(a) to 26(c).

FIGS. 28(a), 28(b) and 28(c) show an example of reference measurement areas used in a case where shot areas of a middle layer are exposed by a scanning exposure method, and shot areas of a critical layer are wider than the middle layer shot areas.

FIGS. 41(a) and 41(b) illustrate a background art related to the present invention, in which FIG. 41(a) shows a shot area of a middle layer which has a magnification error, and FIG. 41(b) shows a middle layer shot area which has a rotation error.

DETAILED DESCRIPTION OF PREFERRED EMBODIMENTS

A first example of a first embodiment of the exposure method according to the present invention will be described below with reference to FIGS. 1 to 5. In this embodiment, two exposure apparatuses are used: a first exposure apparatus of the stepper type (one-shot exposure type) with a demagnification ratio of 5:1, and a second exposure apparatus of the stepper type with a demagnification ratio of 2.5:1. In this case, one shot area exposed by the second exposure apparatus corresponds to four shot areas exposed by the first exposure apparatus.

Figure 1:
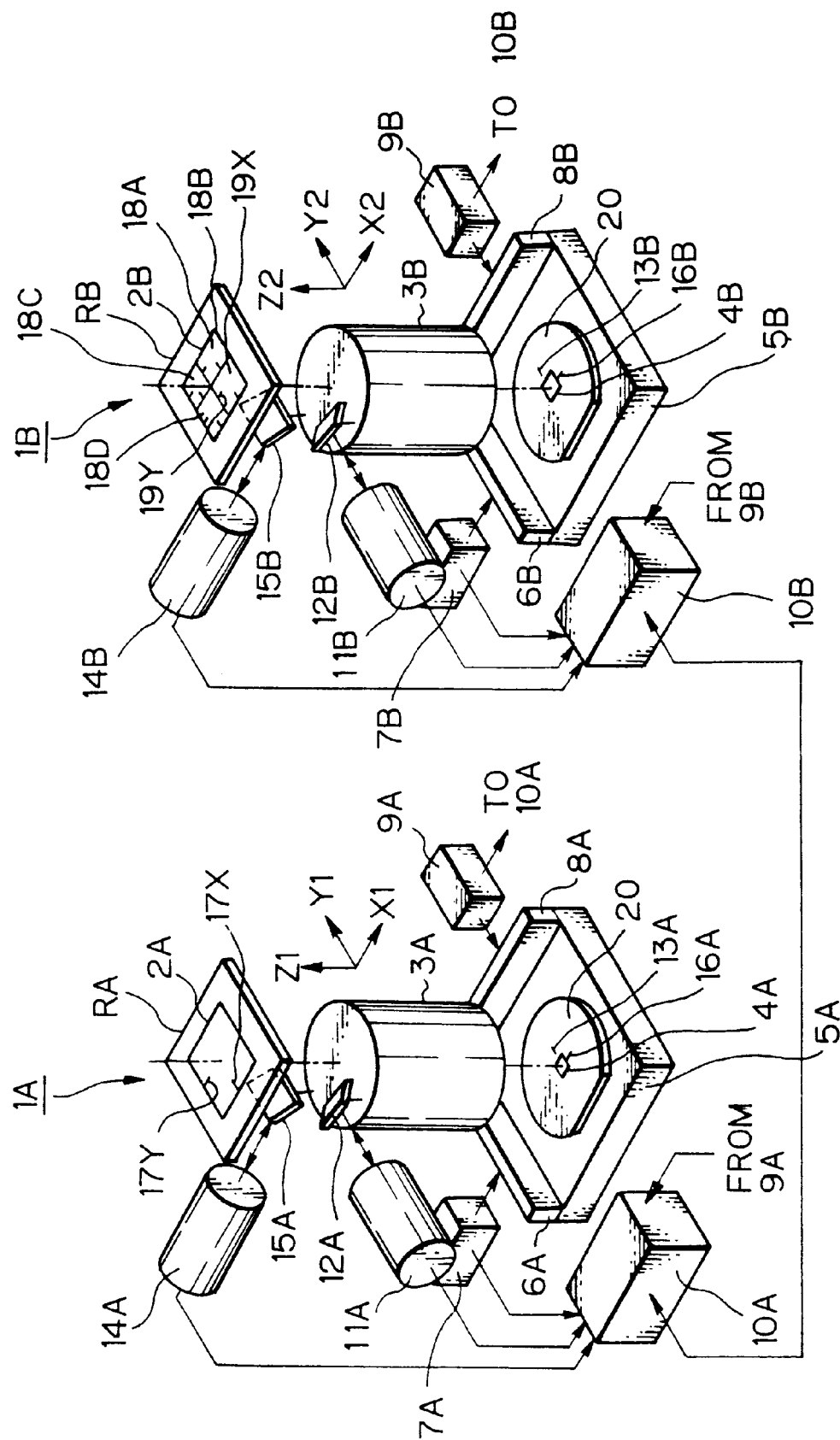
FIG. 1 is a perspective view schematically showing an exposure system used in a first example of a first embodiment of the exposure method according to the present invention.

FIG. 1 shows an exposure system used in an exposure method according to the first embodiment of the present invention. In the exposure system shown in FIG. 1 are installed a first exposure apparatus 1A of the stepper type which has a small exposure field, and a second exposure apparatus 1B of the stepper type which has a large exposure field. In this embodiment, the exposure apparatus 1A is a high-resolution exposure apparatus, while the exposure apparatus 1B is a low-resolution exposure apparatus. The high-resolution exposure apparatus 1A is used to carry out exposure for a critical layer on a wafer, and the low-resolution exposure apparatus 1B is used to carry out exposure for a middle layer on the wafer. However, the exposure apparatus 1A may be a low-resolution exposure apparatus or the exposure apparatus 1B may be a high-resolution exposure apparatus according to the kind of semiconductor device to be produced.

First, in the exposure apparatus 1A, a pattern area 2A on a reticle RA is illuminated by exposure light from an illumination optical system (not shown), and an image of a pattern formed in the pattern area 2A is formed on an exposure field 4A on a wafer 20 as a projected image reduced to ⅕ by a projection optical system 3A. A Z1-axis is taken in a direction parallel to an optical axis of the projection optical system 3A, and two axes of an orthogonal coordinate system set in a plane perpendicular to the Z1-axis are defined as an X1-axis and a Y1-axis, respectively. The reticle RA has an alignment mark 17X for the X1-axis formed at an end of the pattern area 2A in the direction Y1 (e.g. within a masking frame) and also has an alignment mark 17Y for the Y1-axis formed at an end of the pattern area 2A in the direction X1.

The wafer 20 is held on a wafer stage 5A. The wafer stage 5A comprises a Z-stage for moving the wafer 20 in the direction Z1 to set an exposure surface of the wafer 20 which is to be exposed at the best focus position, and an XY-stage for positioning the wafer 20 in both the directions of the X1- and Y1-axes. A pair of moving mirrors 6A and 8A which are perpendicular to each other are fixed on the wafer stage 5A. The coordinate in the direction X1 of the wafer stage 5A is measured by a combination of the moving mirror 6A and a laser interferometer 7A which is installed outside the wafer stage 5A. The coordinate in the direction Y1 of the wafer stage 5A is measured by a combination of the moving mirror 8A and a laser interferometer 9A which is installed outside the wafer stage 5A. The coordinates measured by the laser interferometers 7A and 9A are supplied to a controller 10A which controls operations of the whole apparatus. The controller 10A drives the wafer stage 5A to step in both the directions X1 and Y1 through drive units (not shown), thereby positioning the wafer 20. In this case, the stepping drive of the wafer 20 is effected according to an array of shot areas (i.e. unit areas to each of which a pattern image of the pattern area 2A is to be projected by exposure) set on the exposure surface of the wafer 20, that is, a shot map for a critical layer. The shot map is generated by a map generating unit which comprises a computer in the controller 10A.

The exposure apparatus 1A is provided with alignment systems 11A and 14A both of which are TTL (Through-The-Lens) and laser step alignment type (hereinafter referred to as "LSA type") systems. An LSA type alignment system is disclosed in detail, for example, in JP(A) No. 60-130742.

Therefore, only an outline of the alignment systems 11A and 14A will be given below. A laser beam emitted from the alignment system 11A for the X1-axis is reflected by a mirror 12A, which is disposed between the projection optical system 3A and the reticle RA, and the reflected laser beam enters the projection optical system 3A. The laser beam emanating from the projection optical system 3A is converged onto an area near the exposure field 4A in the form of a slit-shaped light spot 13A elongated in the direction Y1.

Figure 2A:
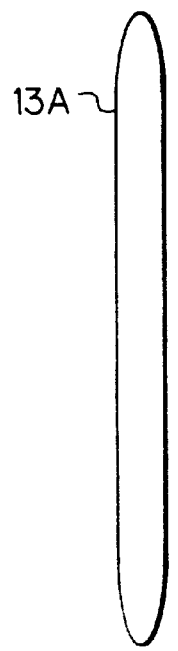
FIG. 2(a) illustrates the detection principle of a laser step alignment type alignment system.

FIG. 2(a) shows a wafer mark MX for the X1-axis which serves as an alignment mark on the wafer 20, which is an object to be exposed. In FIG. 2(a), the wafer mark MX is a dot train pattern comprising recesses and projections, which are arranged at a predetermined pitch in a direction approximately parallel to the slit-shaped light spot 13A.

When the wafer mark MX is scanned in the direction X1 relative to the slit-shaped light spot 13A by driving the wafer stage 5A, shown in FIG. 1, diffracted light is emitted in a predetermined direction as the wafer mark MX coincides with the slit-shaped light spot 13A.

Referring to FIG. 1, the diffracted light returns to the alignment system 11A via the projection optical system 3A and the mirror 12A. In the alignment system 11A, the diffracted light is photoelectrically converted by a light-receiving element to obtain an alignment signal. The alignment signal is supplied to the controller 10A. In the controller 10A, the X1 coordinate of the wafer stage 5A measured when the alignment signal reaches a maximum, for example, is sampled, thereby detecting the position of the wafer mark MX in the direction of the X1-axis.

Similarly, a laser beam emitted from the LSA type alignment system 14A for the Y1-axis enters the projection optical system 3A via a mirror 15A and is converged onto the wafer 20 in the form of a slit-shaped light spot 16A elongated in the direction of the X1-axis. Diffracted light generated from the slit-shaped light spot 16A returns to the alignment system 14A via the projection optical system 3A and the mirror 15A. The alignment system 14A supplies an alignment signal to the controller 10A. Thus, the position in the Y1-axis direction of a wafer mark for the Y1-axis on the wafer 20 is detected on the basis of the alignment signal.

Figure 2B:
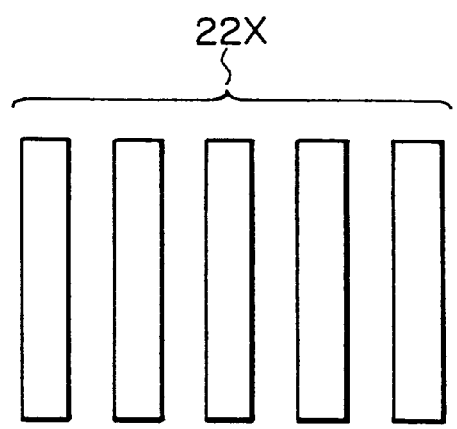
FIG. 2(b) is an enlarged view showing one example of a wafer mark which is used in another type of alignment system.

It should be noted that, as each of the alignment systems 11A and 14A, it is also possible to use a TTL (Through-The-Lens) type alignment system or an off-axis type alignment system which detects the position of a wafer mark without passing a wafer mark detecting light beam through the projection optical system 3A. As a wafer mark detecting method, it is also possible to use an image processing type detection method, or a so-called two-beam interference type detection method in which two light beams are applied to a diffraction grating-shaped wafer mark, and the position of the wafer mark is detected from a signal obtained from interference between a pair of diffracted light beams generated in parallel from the illuminated wafer mark. When such an image processing type or two-beam interference type alignment system is used, a line-and-space pattern 22X as shown in FIG. 2(b) is used. The line-and-space pattern 22X comprises recesses and projections, which are arranged at a predetermined pitch in the measuring direction, for example.

Next, the second exposure apparatus 1B will be explained. The exposure apparatus 1B has an arrangement approximately similar to that of the above-described first exposure apparatus 1A. An image of a pattern formed in a pattern area 2B of a reticle RB is projected through a projection optical system 3B onto an exposure field 4B on a wafer 20 held on a wafer stage 5B as an image reduced to 1/2.5. A Z2-axis is taken in a direction parallel to an optical axis of the projection optical system 3B, and two axes of an orthogonal coordinate system set in a plane perpendicular to the Z2-axis are defined as an X2-axis and a Y2-axis, respectively. The reticle RB has the pattern area divided into two columns in the direction X2 and two rows in the direction Y2 to form partial pattern areas 18A to 18D. The partial pattern areas 18A to 18D each has the same circuit pattern formed therein. Further, the partial pattern areas 18A to 18D are each provided with the same alignment mark 19X for the X2-axis and the same alignment mark 19Y for the Y2-axis. The X2 coordinate of the wafer stage 5B is measured by a combination of a moving mirror 6B and a laser interferometer 7B. The Y2 coordinate of the wafer stage 5B is measured by a combination of a moving mirror 8B and a laser interferometer 9B. The measured coordinates are supplied to a controller 10B. The controller 10B controls the stepping drive of the wafer stage 5B.

The stepping drive of the wafer stage 5B is effected according to an array of shot areas (i.e. areas to each of which a pattern image of the pattern area 2B is to be projected by exposure) set on the exposure surface of the wafer 20, that is, a shot map for a middle layer. The shot map is generated by a map generating unit which comprises a computer in the controller 10B. In this case, the map generating unit in the controller 10A and the map generating unit in the controller 10B have the function of supplying shot map information prepared thereby to each other. When exposure for a middle layer is to be carried out over a critical layer, for example, shot map information for the critical layer prepared by the map generating unit in the controller 10A of the exposure apparatus 1A is transmitted from a communication unit in the controller 10A to a communication unit in the controller 10B. The map generating unit in the controller 10B generates a shot map for the middle layer on the basis of the supplied shot map information. Conversely, when exposure for a critical layer is to be carried out over a middle layer, shot map information for the middle layer prepared by the map generating unit in the controller 10B is supplied to the map generating unit in the controller 10A.

In the exposure apparatus 1B also, an alignment system 11B for the X2-axis is a TTL and LSA type alignment system. A laser beam from the alignment system 11B enters the projection optical system 3B via a mirror 12B. The laser beam is converged through the projection optical system 3B onto the wafer 20 in the form of a slit-shaped light spot 13B elongated in the direction Y2. A laser beam from an alignment system 14B for the Y2-axis enters the projection optical system 3B via a mirror 15B, and the laser beam is converged through the projection optical system 3B onto the wafer 20 in the form of a slit-shaped light spot 16B elongated in the direction X2. Diffracted light beams from the slit-shaped light spots 13B and 16B are received by the corresponding alignment systems 11B and 14B, thereby detecting the positions of the wafer marks for the Y2- and x2-axes on the wafer 20.

Next, an exposure method in this embodiment will be explained with reference to FIGS. 3 to 5. In this embodiment, the exposure process will be explained by way of an example in which a pattern image of a reticle for a middle layer is transferred by using the second exposure apparatus 1B over a critical layer transferred on the wafer 20 by using the first exposure apparatus 1A.

Figure 3:
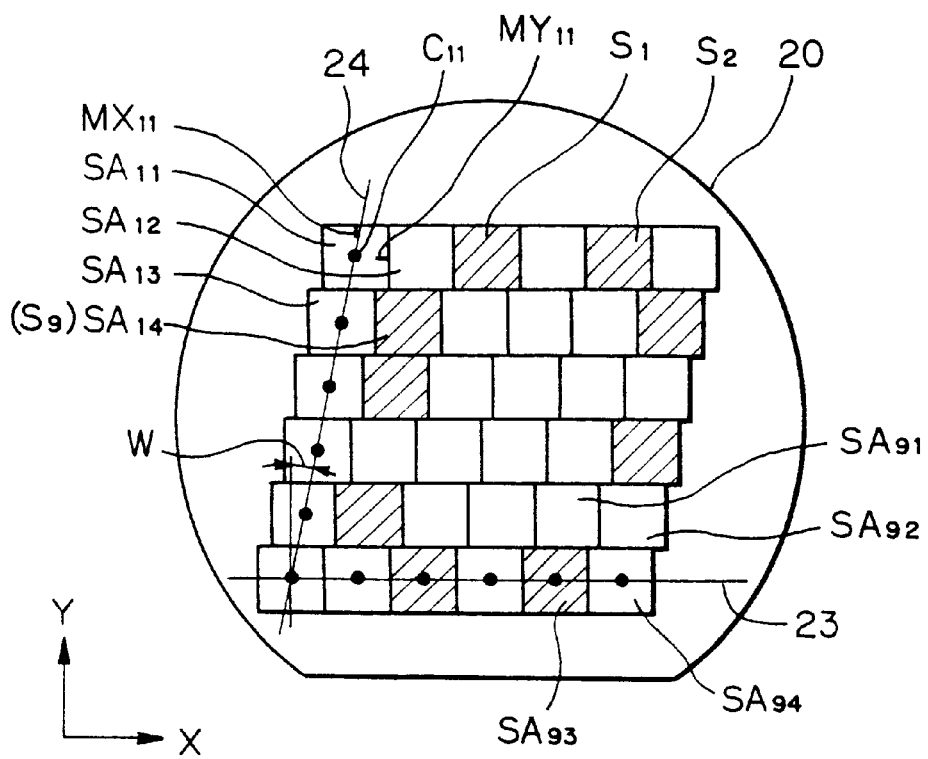
FIG. 3 is a plan view showing a shot array of a critical layer on a wafer in the first example.

FIG. 3 shows a shot array of a critical layer on the wafer 20. In FIG. 3, the surface of the wafer 20 is divided into square shot areas $SA_{11}$, $SA_{12}$, ..., $SA_{94}$ at a predetermined pitch in each of first and second directions. Each side of each square shot area SA has a length L. The shot areas $SA_{11}$ to $SA_{14}$ have approximately the same size as that of the exposure field 4A of the exposure apparatus 1A, shown in FIG. 1. An image of the circuit pattern in the pattern area 2A of the reticle RA is projected onto each of the shot areas $SA_{11}$ to $SA_{14}$ by using the exposure apparatus 1A, shown in FIG. 1. By development and other processes carried out thereafter, the circuit pattern images are made to appear as real circuit patterns. Further, each of the shot areas $SA_{ij}$ (i=1 to 9; j=1 to 4) is provided with images of the alignment marks 17X and 17Y formed on the reticle RA, shown in FIG. 1, as a wafer mark $MX_{ij}$ for the X-axis and a wafer mark $MY_{ij}$ for the Y-axis.

Next, a photoresist is coated over the wafer 20. The wafer 20 coated with the photoresist is loaded onto the wafer stage 5B in the exposure apparatus 1B, shown in FIG. 1, and a circuit pattern image of the reticle RB is projected onto each of shot areas of a middle layer over the critical layer on the wafer 20. In this case, each group of four critical layer shot areas arrayed in two rows and two columns as shown in FIG. 3 corresponds to one middle layer shot area. For example, a group of four shot areas $SA_{11}$ to $SA_{14}$ in the top left corner corresponds to one middle layer shot area $SB_1$. To generate such a shot map for the middle layer, the exposure apparatus 1B first effects EGA alignment. The EGA alignment method is disclosed, for example, in JP(A) No. 4-277612 in addition to JP(A) No. 61-44429.

Here, the X2- and Y2-axes of the coordinate system that define the travel position of the wafer stage 5B of the second exposure apparatus 1B, shown in FIG. 1, are taken as X- and Y-axes, respectively, in FIG. 3, and a coordinate system that is defined by the X- and Y-axes is referred to as "stage coordinate system (X,Y)". From among the critical layer shot areas $SA_{11}$ to $SA_{94}$ on the wafer 20 shown in FIG. 3, a predetermined number N (N is an integer of 3 or more) shot areas (i.e. shaded shot areas in the figure) are selected as sample shots $S_1$ to $S_9$ (in this case, N=9), and coordinate values in the stage coordinate system (X,Y) of the wafer marks attached to the sample shots $S_1$ to $S_9$ are measured by using the alignment systems 11B and 14B, shown in FIG. 1. For the sake of simplicity, it is assumed in the following description that the X coordinate of the X-axis wafer mark $MX_{ij}$ attached to a shot area $SA_{ij}$ and the Y coordinate of the Y-axis wafer mark $MY_{ij}$ attached to the shot area $SA_{ij}$ represent the X and Y coordinates of the center of the shot area $SA_{ij}$.

Further, coordinate axes which constitute the coordinate system on the wafer 20 (i.e. sample coordinate system) are assumed to be an x-axis and a y-axis, respectively. It is further assumed that design coordinate values of the centers of the shot areas $SA_{11}$ to $SA_{94}$ on the critical layer in the sample coordinate system (x,y) have already been supplied to the controller 10B of the second exposure apparatus 1B as a part of shot map data for the critical layer. Under these circumstances, the transformation of array coordinates of an arbitrary point on the wafer 20 in the sample coordinate system (x,y) into array coordinates in the stage coordinate system (X,Y) is approximately expressed by the following equation (3):

$$\begin{bmatrix} X \\ Y \end{bmatrix} = \begin{bmatrix} Rx & -Rx(W+\Theta) \\ Ry \cdot \Theta & Ry \end{bmatrix} \begin{bmatrix} x \\ y \end{bmatrix} + \begin{bmatrix} Ox \\ Oy \end{bmatrix} \quad (3)$$

The transformation matrix in Eq. (3) has as elements six coordinate transformation parameters, including scaling parameters Rx and Ry of the wafer, a rotation Θ [rad] of the shot array, a perpendicularity error W [rad] of the shot array, and offsets Ox and Oy. The scaling parameters Rx and Ry are linear expansion and contraction quantities of the wafer in the directions X and Y, respectively. The rotation Θ is an angle of rotation of the x-axis of the sample coordinate system relative to the X-axis. The perpendicularity error W is an error of the intersection angle between the x- and y-axes of the sample coordinate system from 90°. The offsets Ox and Oy are shift quantities in the directions X and Y, respectively.

Eq. (3) is usable in the present invention; in this embodiment, however, Eq. (3) is approximated with the following equation (4) using 1+Γx and 1+Γy for the scaling parameters Rx and Ry and regarding the values of the new parameters Γx and Γy as small in order to facilitate the calculation:

$$\begin{bmatrix} X \\ Y \end{bmatrix} = \begin{bmatrix} 1+\Gamma x & -(W+\Theta) \\ \Theta & 1+\Gamma y \end{bmatrix} \begin{bmatrix} x \\ y \end{bmatrix} + \begin{bmatrix} Ox \\ Oy \end{bmatrix} \quad (4)$$

To determine values of the six transformation parameters (Γx, Γy, Θ, w, Ox and Oy) in Eq. (4), the controller 108 defines the array coordinate values of the centers (wafer marks) of sample shots $S_i$ measured by the i-th (i=1 to N) measuring operations as $(XM_i, YM_i)$. Next, the design array coordinates $(x_i, y_i)$ of the centers of the sample shots Si are substituted for the coordinates (x,y) on the right-hand side of Eq. (4) to obtain computational array coordinate values $(X_i, Y_i)$. The sum of the squares of deviations of the measured values $(XM_i, YM_i)$ from the array coordinate values $(X_i, Y_i)$ is determined to be a residual error component as expressed by the following equation (5):

$$\text{Residual error component} = \sum_{i=1}^{N} \{(X_i - XM_i)^2 + (Y_i - YM_i)^2\} \quad (5)$$

Then, the controller 10B determines values of the six transformation parameters so that the residual error component is minimized. For example, values of the six parameters are obtained by solving simultaneous equations established by setting the result of partial differentiation of the right-hand side of Eq. 5 with respect to each of the six parameters equal to zero.

In this embodiment, it is assumed that among the transformation parameters obtained as described above, the shot array rotation Θ [rad] is regarded as zero, and the shot array perpendicularity error W [rad] assumes a predetermined finite value. This means that a perpendicularity error W exits in the critical layer shot array. The other parameters, that is, scaling parameters Γx and Γy and offsets Ox and Oy, may assume any values, respectively. In this case, the array of the critical layer shot areas $SA_{11}$ to $SA_{94}$ is as follows: As shown in FIG. 3, for example, an imaginary straight line 23 connecting the centers of shot areas which are adjacent to each other in the direction X is parallel to the X-axis. An imaginary straight line 24 which passes through the center $C_{11}$ of the first shot area $SA_{11}$ and which connects the centers of shot areas which are successively adjacent to the shot area $SA_{11}$ in the direction Y has been rotated clockwise relative to the Y-axis by the perpendicularity error W.

Next, in this embodiment, the reticle RB in the exposure apparatus 1B, shown in FIG. 1, is rotated through a predetermined angle δ [rad] to thereby rotate each shot area of the middle layer by an angle δ in order to reduce an overlay error between the critical and middle layers due to the perpendicularity error W.

Figure 4:
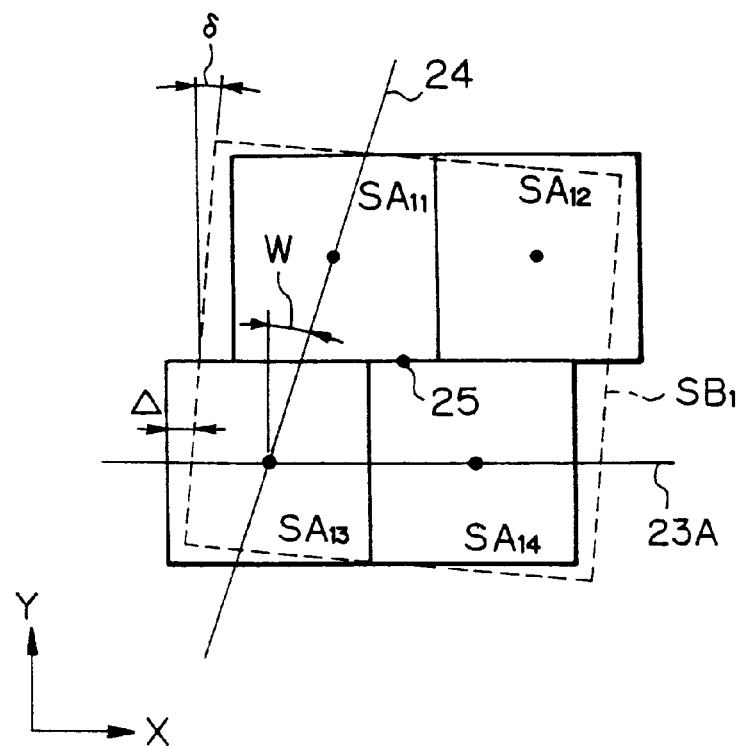
FIG. 4 is an enlarged plan view showing a part of the shot array shown in FIG. 3, together with a shot area of a middle layer exposed over the shot array.

FIG. 4 shows the positional relationship between four shot areas $SA_{11}$ to $SA_{14}$ of the critical layer and one middle layer shot area $SB_1$ over the four critical layer shot areas. In FIG. 4, the shot area $SB_1$ has its adjacent sides rotated through an angle δ clockwise from the respective positions which are parallel to the X- and Y-axes. Further, the controller 10B successively substitutes the design array coordinates of the four shot areas $SA_{11}$ to $SA_{14}$ and the above-determined transformation parameters into the right-hand side of Eq. (4), thereby obtaining center coordinates of the four shot areas $SA_{11}$ to $SA_{14}$ in the stage coordinate system (X,Y), and further obtaining coordinates of the center 25 of the four sets of center coordinates. Then, a circuit pattern image of the reticle RB is projected onto the shot area $SB_1$ with the center 25 made coincident with the center of the exposure field 4B. As a result, exposure is carried out in a state where the center 25 of the array of the four shot areas $SA_{11}$ to $SA_{14}$ is coincident with the center of the shot area $SB_1$, and the shot area $SB_1$ has been rotated through the angle δ.

Figure 5:
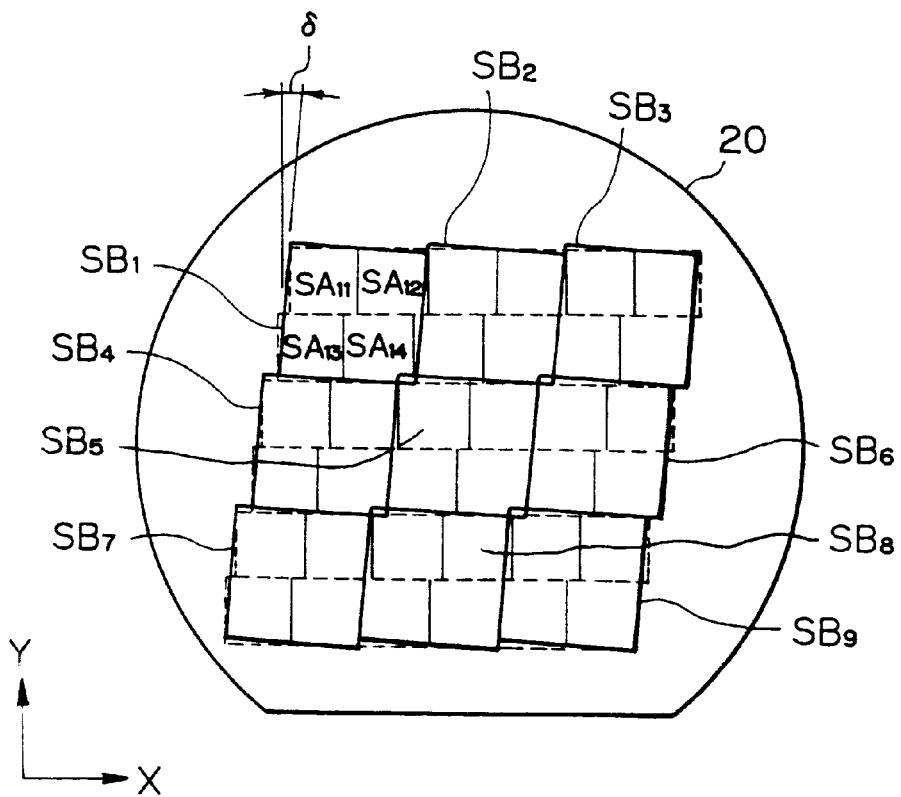
FIG. 5 is a plan view showing a shot array of a middle layer exposed over the shot array shown in FIG. 3 in the first example.

Similarly, as shown in FIG. 5, a circuit pattern image of the reticle RB is sequentially projected onto middle layer shot areas $SB_2$, $SB_3$, . . . , $SB_9$ deployed over the critical layer on the wafer 20.

Let us conduct evaluation of the overlay error in this embodiment with reference to FIG. 4. In this embodiment, in an array of four square shot areas $SA_{11}$ to $SA_{14}$, each side of which has a length L, shot areas which are adjacent to each other in the direction X lie such that an imaginary straight line 23A connecting the centers of these shot areas is parallel to the X-axis, and shot areas which are adjacent to each other in the direction Y lie such that an imaginary straight line 24 connecting the centers of these shot areas intersects the Y-axis at an angle (perpendicularity error) W. Accordingly, assuming that an overlay error between the array of critical layer four shot areas $SA_{11}$ to $SA_{14}$ and the middle layer shot area $SB_1$ is Δ, and that the perpendicularity error W and the rotation angle δ are small, the ranges of X and Y components $\Delta_x$ and $\Delta_y$ of the overlay error Δ concerning the shot area $SA_{11}$ are approximately given by the following equation (6):

$$(\tfrac{1}{2})L \cdot W - L \cdot \delta \leq \Delta_X < (\tfrac{1}{2})L \cdot W \quad 0 \leq \Delta_Y \leq L \cdot 67 \quad (6)$$

Figure 35:
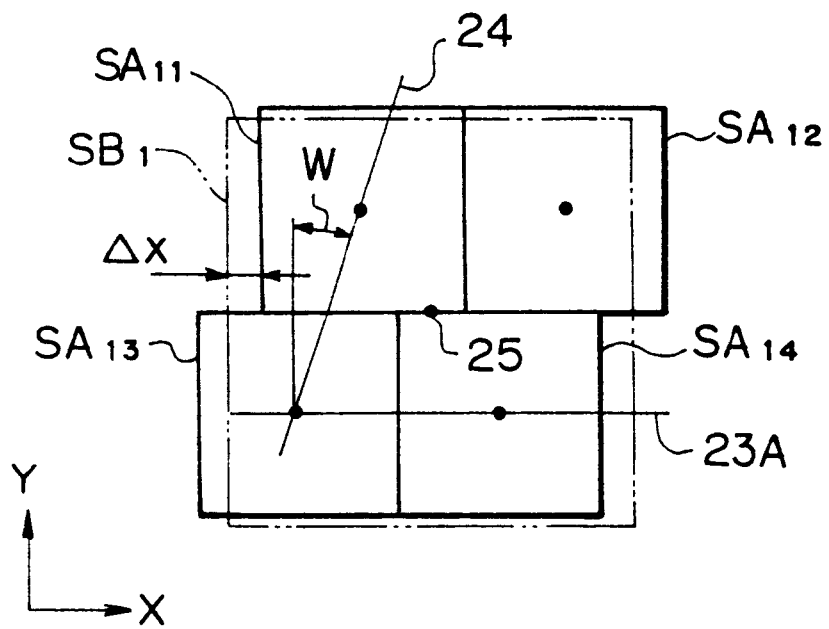
FIG. 35 is a view for explanation of a background art related to the present invention, showing an overlay error due to a perpendicularity error of the shot array on the preceding layer.

In this case, if the rotation angle δ is assumed to be zero as in the related art shown in FIG. 35, the X component $\Delta_x$ of the overlay error A is uniformly $(\tfrac{1}{2})L \cdot W$, and the Y component $\Delta_y$ is uniformly zero. Therefore, in order to reduce the overlay error to a lower level than in the related art as a whole, the rotation angle δ should be set within the range given by the following equation (7):

$$0 < \delta < (\tfrac{1}{2})W \quad (7)$$

The value of the rotation angle δ at which the overlay error reaches a minimum as a whole within the above range is (¼)W. That is, in this case, the ranges of the X and Y components are obtained from Eq. (6) as follows:

$$(\tfrac{1}{4})L \cdot W \leq \Delta_X \leq (\tfrac{1}{2})L \cdot W \quad 0 \leq \Delta_Y \leq (\tfrac{1}{4})L \cdot W$$

Thus, it becomes possible to regard the overlay error as minimum as a whole.

Although in the above-described embodiment the reticle-side part in the exposure apparatus 1B is rotated through the rotation angle δ, the wafer-side part may be rotated through −δ instead of rotating the reticle-side part. However, if the wafer-side part is rotated, the shot area array on the critical layer also changes, and it is therefore necessary to correct the critical layer shot array. That is, rotating the reticle-side part is advantageous because it is possible to omit a corrective calculation which would otherwise be required.

Figure 36:
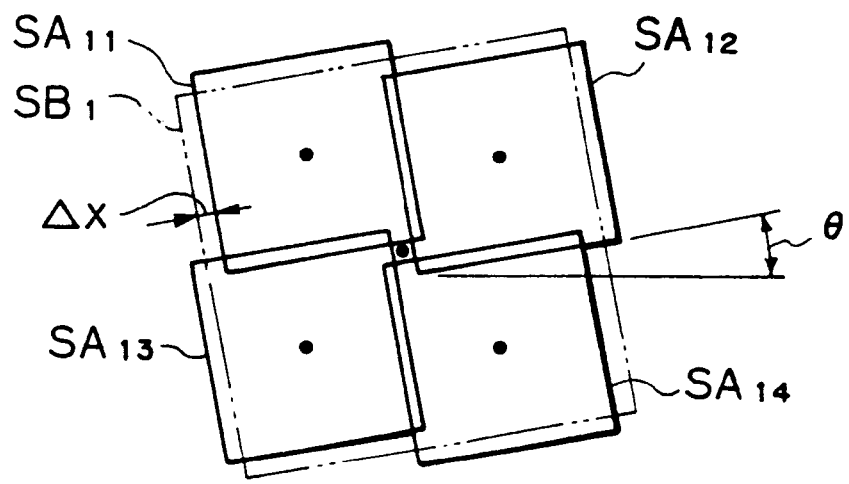
FIG. 36 is a view for explanation of a background art related to the present invention, showing an overlay error due to a shot rotation of the shot array on the preceding layer.
Figure 37A:
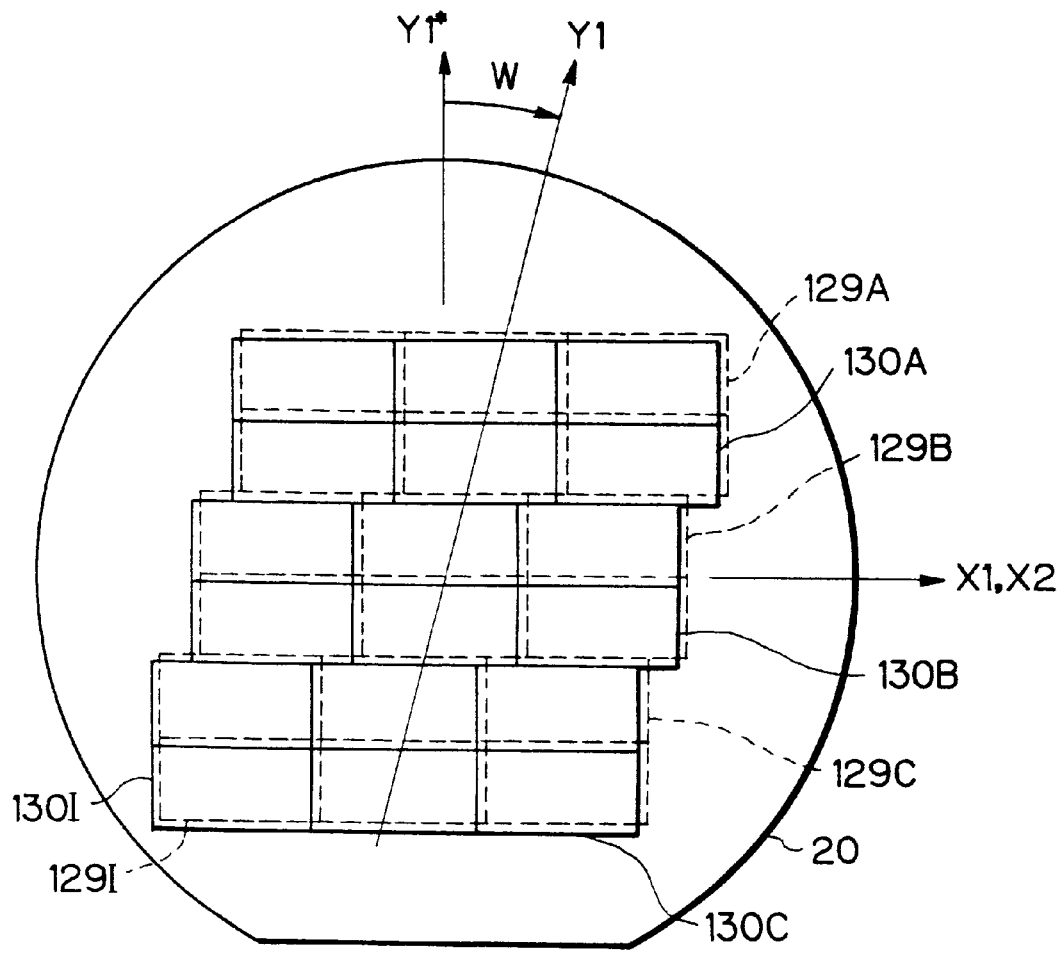
FIGS. 37(a), 37(b) and 37(c) are views for explanation of a background art related to the present invention, showing one example of a mix-and-match exposure process.
Figure 37B:
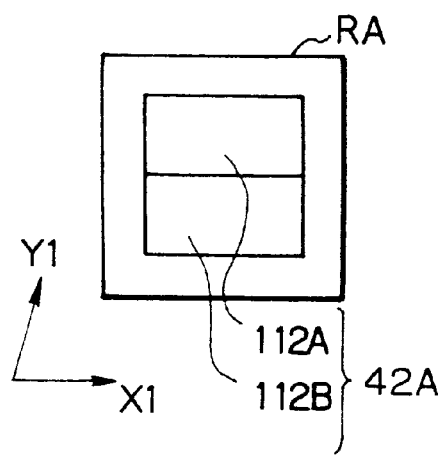
Figure 37C:
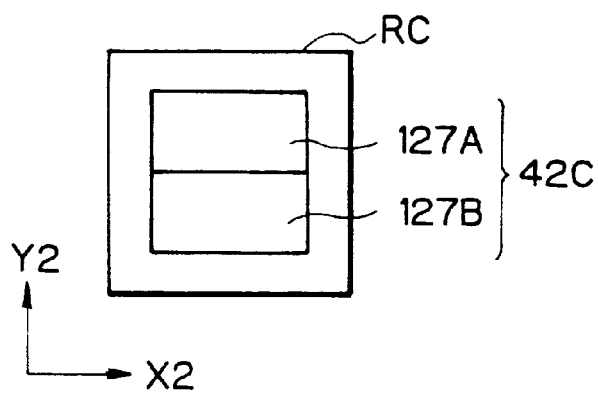
Figure 38A:
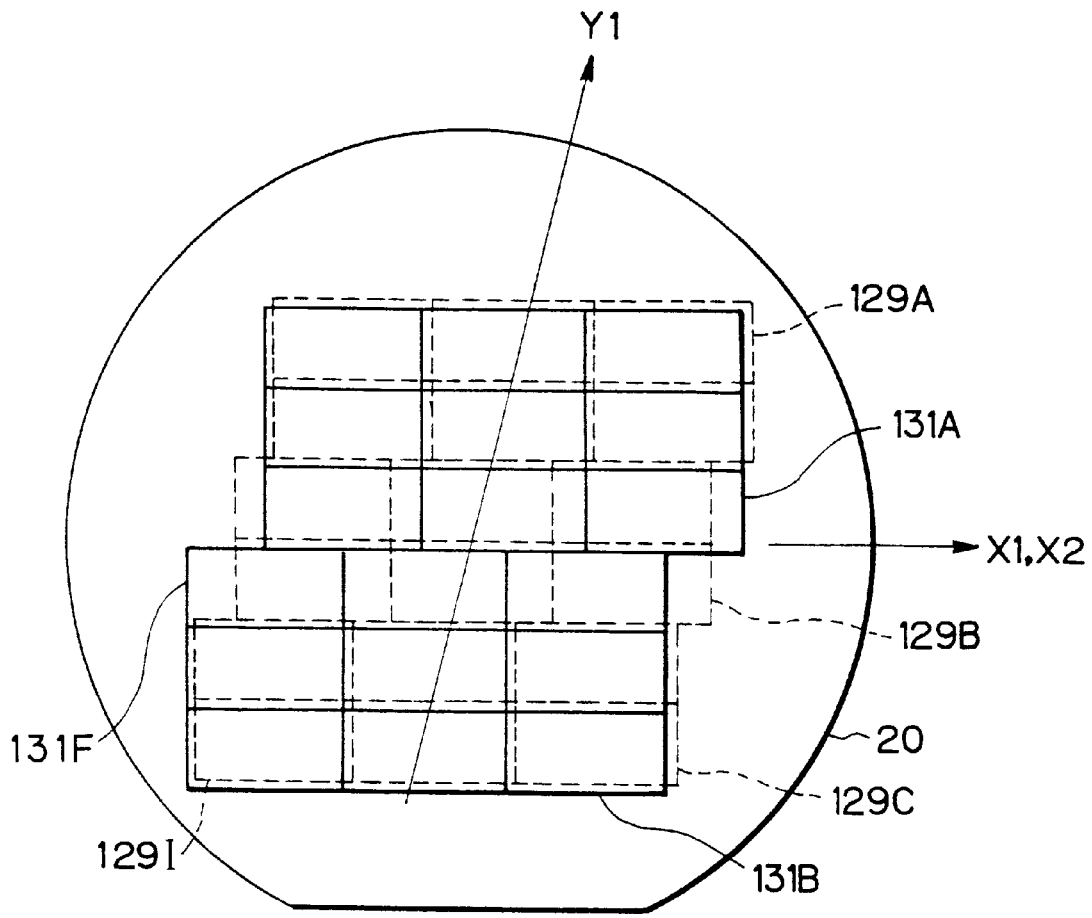
FIGS. 38(a), 38(b) and 38(c) are views for explanation of a background art related to the present invention, showing a case where an overlay error arises in a mix-and-match exposure process.
Figures 38B, 38C:
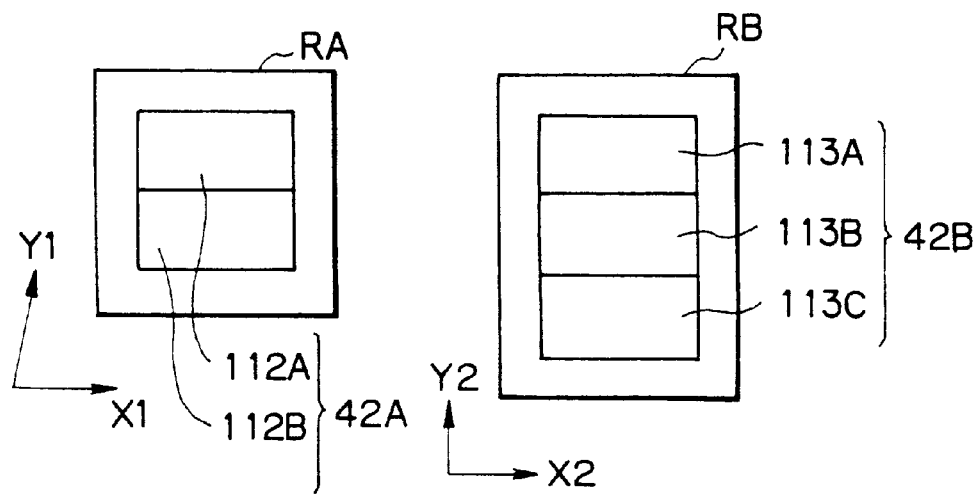
Figure 39B:
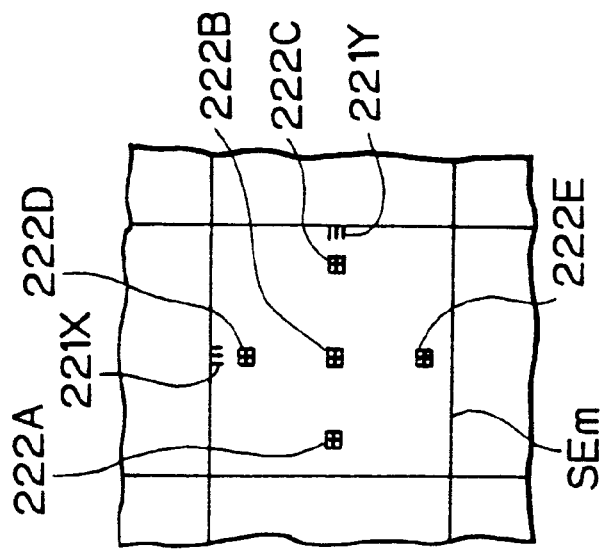
FIG. 39(b) is an enlarged plan view showing an arrangement of vernier marks in a shot area of the critical layer shown in FIG. 39(a).
Figure 39A:
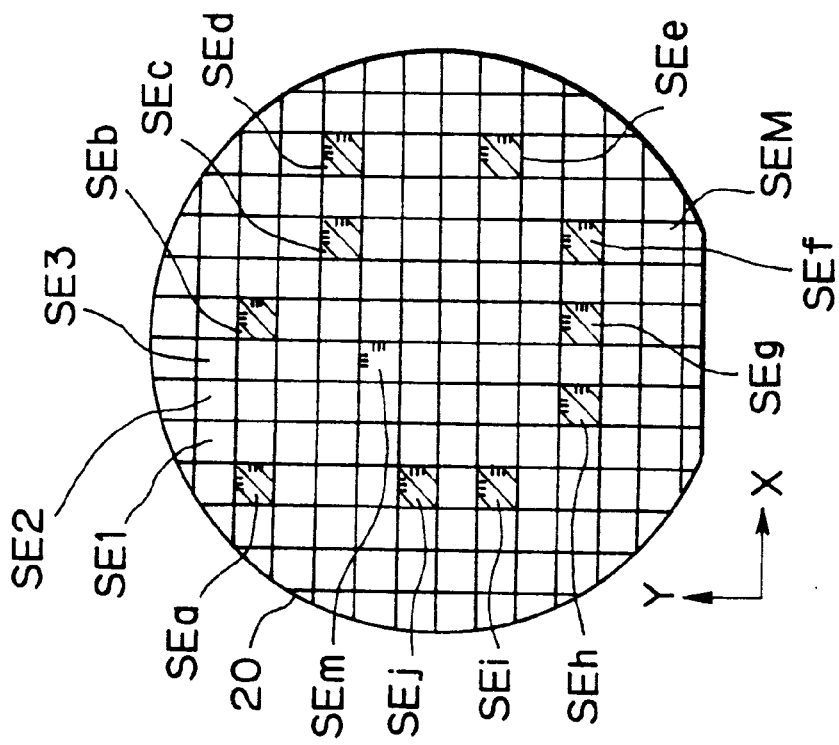
FIG. 39(a) is a plan view of a background art related to the present invention, showing a shot array of a critical layer on a wafer.
Figure 40B:
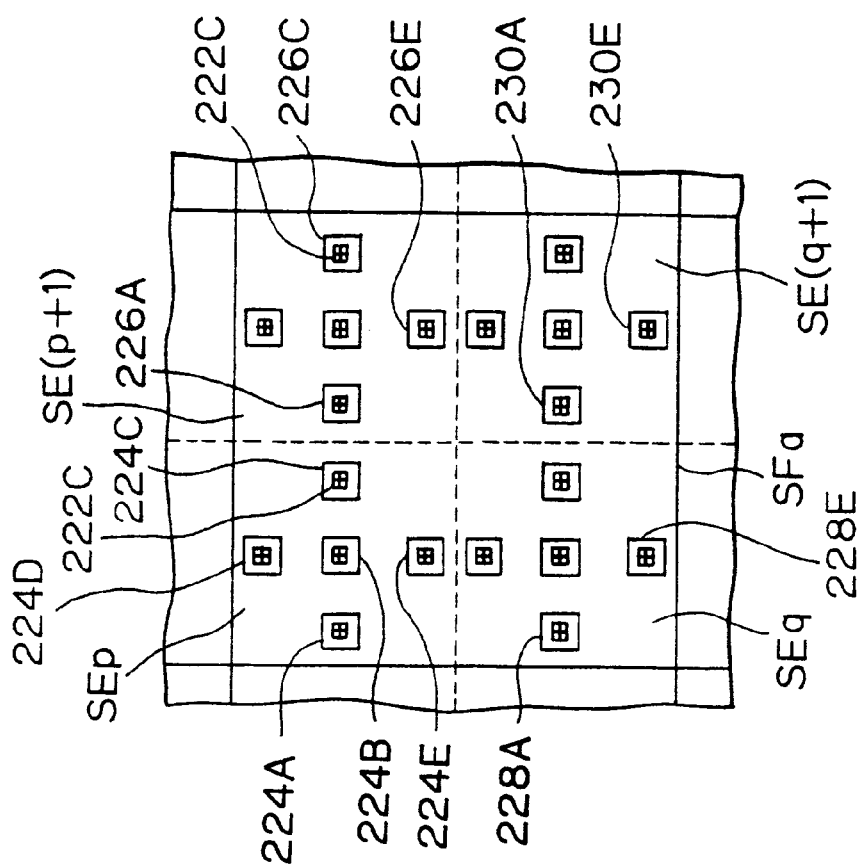
FIG. 40(b) is an enlarged plan view showing an arrangement of vernier marks in a shot area of the middle layer shown in FIG. 40(a).
Figure 40A:
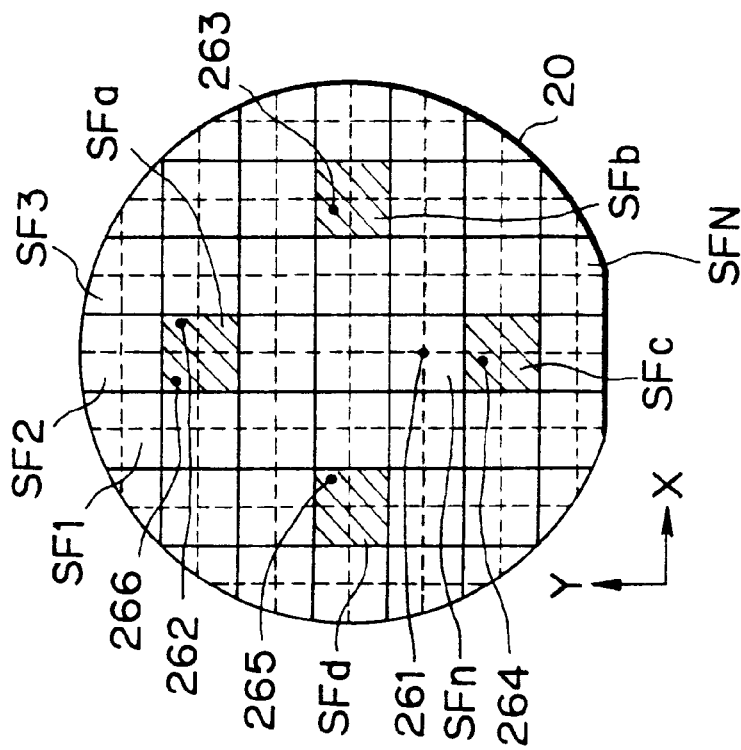
FIG. 40(a) is a plan view of a shot array and measuring point arrangement on a middle layer exposed over the critical layer shown in FIG. 39(a).
Figure 41A:
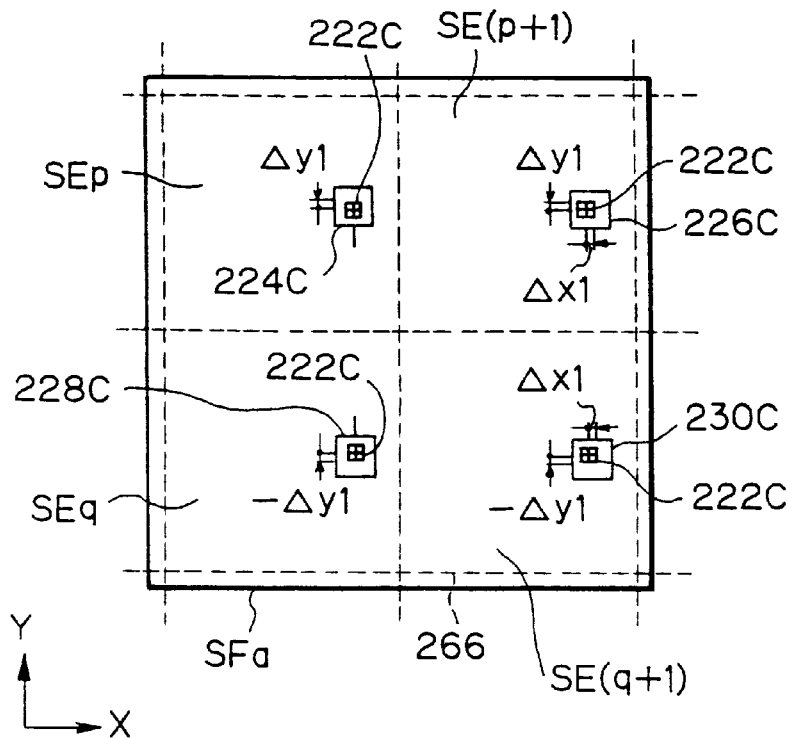
Figure 41B:
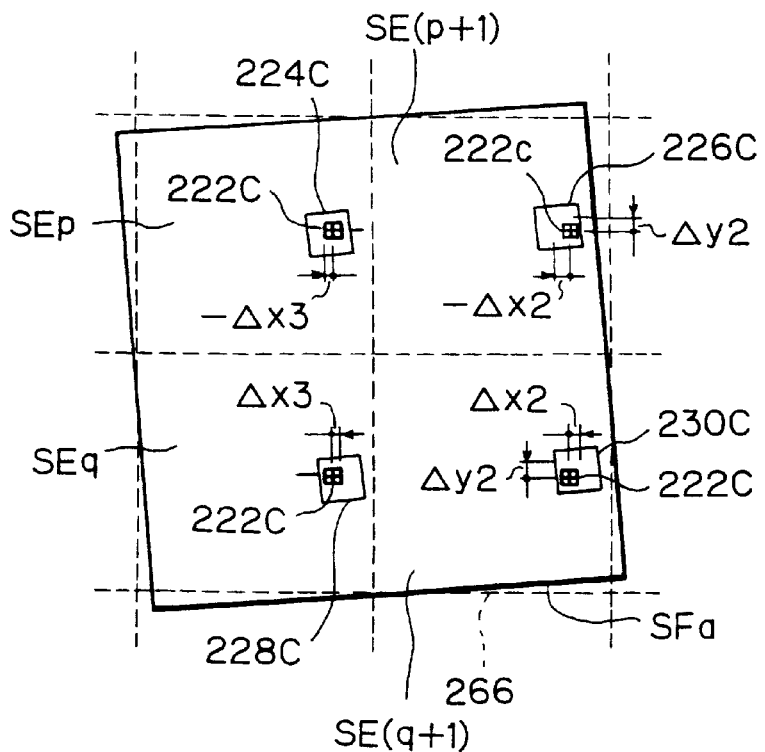

Although in this embodiment the perpendicularity error W of the shot array is assumed to be not zero, it should be noted that an alignment method similar to that in the above-described embodiment is also applicable in a case where the perpendicularity error W is zero as in the related art shown in FIG. 36 and the shot rotation θ of each of the critical layer shot areas $SA_{11}$ to $SA_{14}$, shown in FIG. 3, is not zero. That is, the overlay error can be reduced as a whole by rotating the reticle-side part of the second exposure apparatus 1B, for example, such that each middle layer shot area is rotated through the angle (θ+δ') relative to the corresponding array of four critical layer shot areas, using the angle δ' in the range of 0<δ'<(½)θ. In particular, if the angle δ' is set at (¼)θ, the overlay error is minimized as a whole. The method of detecting the shot rotation θ will be explained in a second example of the first embodiment.

Next, the second example of the first embodiment of the present invention will be described with reference to FIGS. 6(a) to 8(c). In the second example, the stepper type exposure apparatus 1A, shown in FIG. 1, is used as a first exposure apparatus, and a step-and-scan type scanning exposure apparatus with a demagnification ratio of 4:1 is used as a second exposure apparatus. In the first exposure apparatus, an image of two identical circuit patterns (chip patterns) is transferred per shot area; in the second exposure apparatus, an image of three identical circuit patterns is transferred per shot area.

Figure 6A:
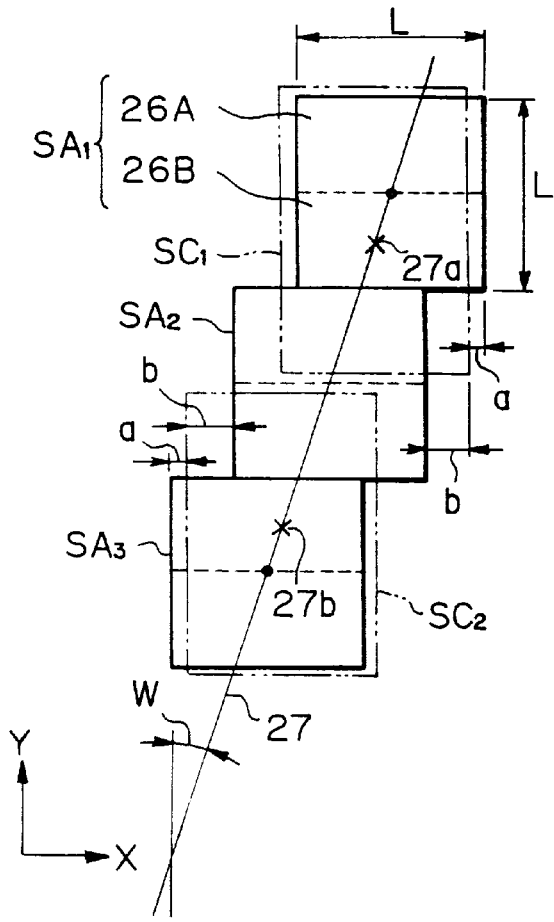
FIG. 6(a) is a plan view of a second example of the first embodiment of the present invention, showing an array of shot areas exposed on a first layer, together with one example of a shot array in a case where shot areas exposed over the first-layer shot areas have a large overlay error.

FIG. 6(a) shows a part of a shot array on a wafer 5 loaded on a wafer stage (not shown) of the scanning type second exposure apparatus in this example. In FIG. 6(a), square shot areas $SA_1$, $SA_2$ and $SA_3$, each side of which has a length L, are sequentially arrayed, lying adjacent to each other in the direction Y. The shot areas $SA_1$, $SA_2$ and $SA_3$ each has two identical circuit patterns 26A and 26B formed side-by-side in the direction Y by the first exposure apparatus, a developer, etc. In FIG. 6(a), X- and Y-axes represent a stage coordinate system of the second exposure apparatus. An imaginary straight line 27 passing through the centers of the shot areas $SA_1$, $SA_2$ and $SA_3$ on the first layer is tilted by an angle W clockwise relative to the Y-axis. The angle W is a perpendicularity error of the shot array.

Figure 6B:
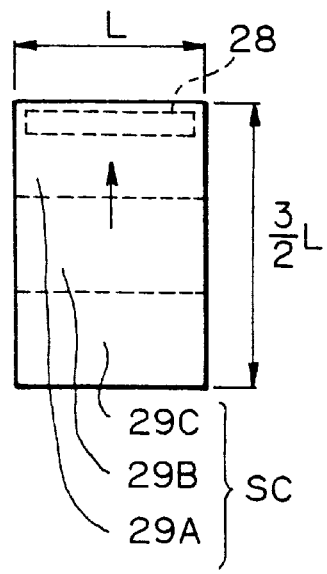
FIG. 6(b) is a plan view showing a shot area exposed by a scanning type second exposure apparatus.

FIG. 6(b) shows a shot area SC which has a width L in the direction X and a width (3/2)L in the direction Y on a wafer which is to be exposed by the second exposure apparatus in this example. In FIG. 6(b), directions +Y and −Y are scanning directions. That is, the shot area SC is scanned in the direction +Y, for example, relative to a slit-shaped illumination field 28, and a reticle placed through a projection optical system is scanned in the direction −Y in synchronism with the scanning of the shot area SC. As a result, three identical circuit pattern images 29A to 29C are formed on the shot area SC, lying side-by-side in the direction Y. In this example, it is assumed that circuit pattern images for two shot areas $SC_1$ and $SC_2$ each having the same size as that of the shot area SC shown in FIG. 6(b) are overlaid on the shot areas $SA_1$, $SA_2$ and $SA_3$ shown in FIG. 6(a) by using the second exposure apparatus.

In this case, it is conceivable to effect alignment such that, as shown by the chain double-dashed lines in FIG. 6(a), reference points 27a and 27b, which are at the centers of two arrays of three circuit patterns arranged in the direction Y, coincide with the centers of second-layer shot areas $SC_1$ and $SC_2$, respectively, on an imaginary straight line 27 passing through the centers of the first-layer shot areas $SA_1$, $SA_2$ and $SA_3$. However, this alignment method causes overlay errors a and b in the direction X between the second-layer shot area $SC_1$ and the first-layer shot areas $SA_1$ and $SA_2$. Similarly, overlay errors b and a in the direction X arise between the second-layer shot area $SC_2$ and the first-layer shot areas $SA_2$ and $SA_3$. The overlay errors a and b are expressed by the following equation (8):

$$a = (\tfrac{1}{4})L \cdot W \quad b = (\tfrac{3}{4})L \cdot W \quad (8)$$

Accordingly, it will be understood that the alignment method shown in FIG. 6(a) causes a large overlay error b to arise particularly in the second shot area $SA_2$. In order to reduce the overlay error, in this example, the center positions of the second-layer shot areas $SC_1$ and $SC_2$ are shifted by a predetermined distance in the direction X from the reference points 27a and 27b, respectively.

Figure 7:
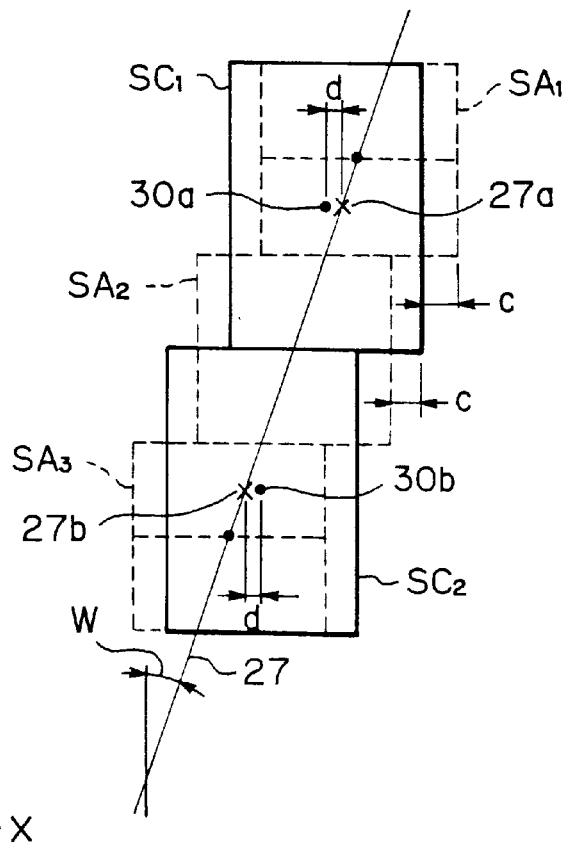
FIG. 7 is a plan view showing an array of shot areas in which the overlay error reduces in the second example of the first embodiment.

FIG. 7 shows the alignment method according to this example. In FIG. 7, the center positions of the second-layer shot areas $SC_1$ and $SC_2$ are shifted by a distance d in the respective directions −X and +X relative to the reference points 27a and 27b on the imaginary straight line 27 passing through the centers of the first-layer shot areas $SA_1$ to $SA_3$. As a result, there is a uniform overlay error c in the direction X between the first-layer shot areas $SA_1$ to $SA_3$ and the second-layer shot areas $SC_1$ and $SC_2$. The distance d and the overlay error c are given by the following equation (9):

$$d = (\tfrac{1}{4})L \cdot W \quad c = (\tfrac{1}{2})L \cdot W \quad (9)$$

As a result, the overlay error c given by Eq. (9) is (½)L·W in contrast to the overlay error b given by Eq. (8). Accordingly, it will be understood that the alignment method according to this example enables the maximum value of the overlay error to reduce to (½)L·W, and thus the overlay error reduces as a whole. It should be noted that during the alignment shown in FIG. 7, the second-layer shot areas $SC_1$ and $SC_2$ may be rotated through a predetermined angle relative to the first-layer shot areas $SA_1$ to $SA_3$ by additionally applying the method according to the first example. By doing so, the overlay error may be further reduced as a whole.

In the second example of the first embodiment, exposure may be carried out by using the first exposure apparatus over shot areas exposed by using the scanning type second exposure apparatus in reverse relation to the above-described exposure operation. One example of such an exposure operation will be explained below with reference to FIGS. 8(a), 8(b) and 8(c).

FIG. 8(a) shows the first-layer shot areas $SC_1$ and $SC_2$ on the wafer which have been formed with circuit patterns by using the scanning second exposure apparatus. In FIG. 8(a), the shot areas $SC_1$ and $SC_2$ each has three identical circuit patterns arranged in the direction Y, and there is a predetermined perpendicularity error in the shot array. Then, a reticle pattern image including two identical circuit pattern images arranged in the direction Y is formed over the shot areas $SC_1$ and $SC_2$ for each of the shot areas $SA_1$, $SA_2$ and $SA_3$ by using the first exposure apparatus. In this case, for the first and third shot areas $SA_1$ and $SA_3$, it is only necessary to align them with the first-layer shot areas $SC_1$ and $SC_2$, respectively, in the direction X. For the second shot area $SA_2$, it is only necessary to align its position in the direction X with an intermediate position between the first-layer shot areas $SC_1$ and $SC_2$. Consequently, the overlay error between the first and second layers is b only at the shot area $SA_2$.

However, in a case where a reticle pattern image is transferred by using the first exposure apparatus, if a part of the pattern image to be transferred can be selectively masked by using a reticle blind (variable field stop), for example, the overlay error can be reduced to approximately zero. In such a case, as shown in FIG. 8(b), when the second shot area $SA_2$ of the second layer is to be exposed, first, the position in the direction X of the shot area $SA_2$ is aligned with the first-layer shot area $SC_1$. Thereafter, exposure is carried out with the lower half of the shot area $SA_2$ masked by controlling the reticle blind. Consequently, exposure is effected only for the upper half of the shot area $SA_2$, which corresponds to the circuit pattern 26A.

Next, the position in the direction X of the shot area $SA_2$ is aligned with the first-layer shot area $SC_2$, and thereafter, exposure is carried out with the upper half of the shot area $SA_2$ masked by controlling the reticle blind. Consequently, exposure is effected only for the lower half of the shot area $SA_2$, which corresponds to the circuit pattern 26B. For the other shot areas $SA_1$ and $SA_3$, exposure similar to that in the case of FIG. 8(a) is carried out. As a result, the overlay error becomes zero at all the shot areas.

Next, a third example of the first embodiment of the present invention will be described with reference to FIGS. 9(a) to 10(c). In this example, the stepper type exposure apparatus 1A, shown in FIG. 1, is used as a first exposure apparatus, and a step-and-scan type scanning exposure apparatus with a demagnification ratio of 4:1 is used as a second exposure apparatus. In this case, shot areas as exposure units which are to be exposed by the first exposure apparatus each contains two identical square circuit patterns, each side of which has a length L. Shot areas as exposure units which are to be exposed by the second exposure apparatus each contains three identical rectangular circuit patterns in which one side has a length L, and the other side has a length 3L/2.

Figure 9B:
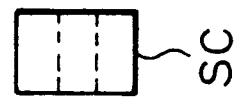
FIG. 9(b) is a plan view showing a shot area exposed by a second exposure apparatus.
Figure 9A:
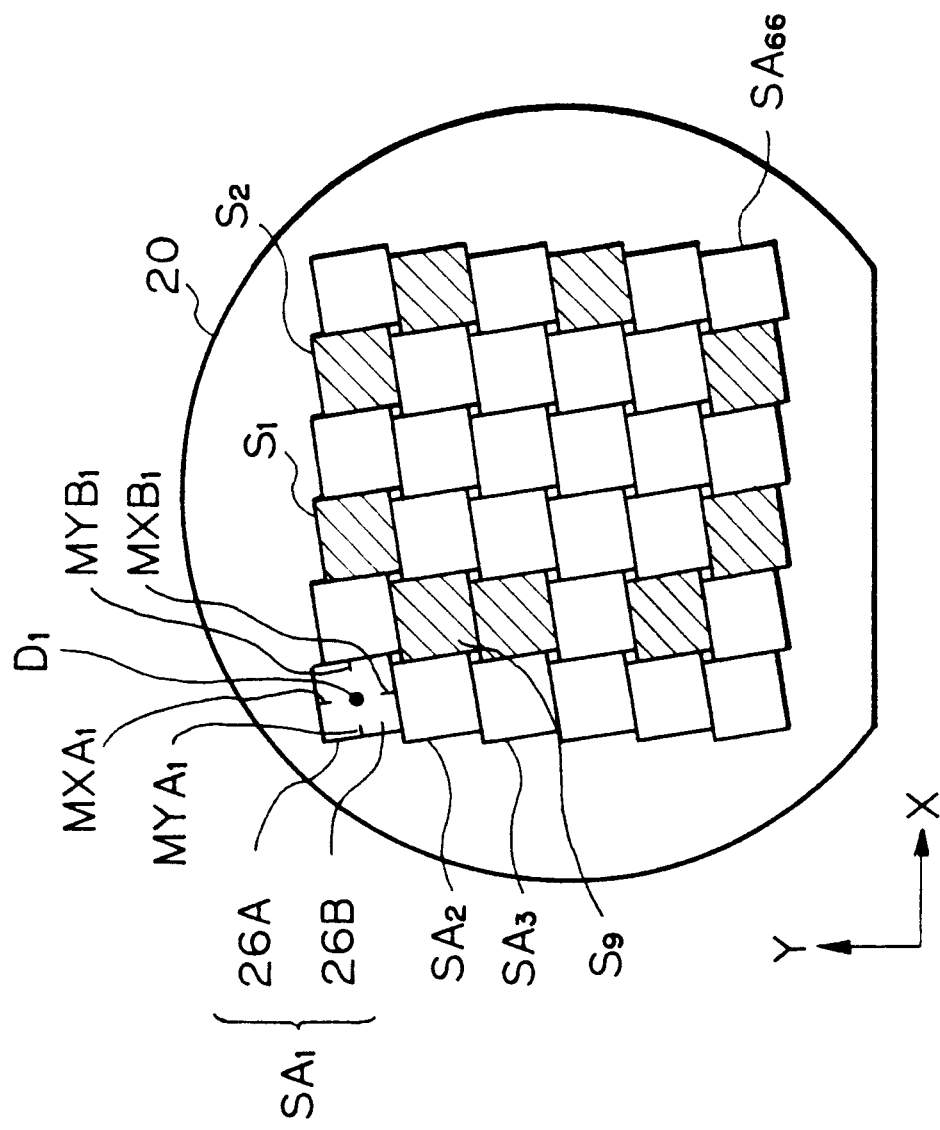
FIG. 9(a) is a plan view of a third example of the first embodiment of the present invention, showing a shot array on a wafer.

FIG. 9(a) shows a shot array on a wafer 20 loaded on a wafer stage (not shown) of the scanning type second exposure apparatus. In FIG. 9(a), square shot areas $SA_1$, $SA_2$, $SA_3$, . . . , $SA_{66}$, each side of which has a length L, are arranged at a predetermined pitch in each of the directions X and Y. The shot areas $SA_1$, $SA_2$, . . . each has two identical circuit patterns 26A and 26B formed to lie side-by-side in a direction substantially parallel to the direction Y by the first exposure apparatus, a developer, etc. In FIG. 9(a), X- and Y-axes represent a stage coordinate system of the second exposure apparatus. Further, the shot areas $SA_1$, $SA_2$, . . . have been each formed with two wafer marks $MYA_i$ and $MYB_i$ for the Y-axis and two wafer marks $MXA_i$ and $MXB_i$ for the X-axis, which are detectable by an LSA type detection method. In FIG. 9(a), only the four wafer marks $MYA_1$, $MYB_1$, $MXA_1$ and $MXB_1$ in the shot area $SA_1$ are shown for the sake of simplicity.

In this example also, alignment is effected by the EGA method in the same way as in the first example. In this example, however, each shot area contains four one-dimensional wafer marks, and therefore, two in-shot transformation parameters can be obtained in addition to the above-described six transformation parameters (i.e. scaling parameters Rx and Ry, shot array rotation Θ, shot array perpendicularity error W, and offsets Ox and Oy). Accordingly, in this example, a shot rotation (chip rotation) θ [rad] and a shot perpendicularity error w [rad] are obtained as in-shot transformation parameters. It should be noted that shot magnifications rx and ry can also be obtained by disposing two other one-dimensional wafer marks in each shot area. However, this example is not particularly related to the determination of shot magnifications rx and ry; therefore, wafer marks for them are not provided in this example. A method in which EGA alignment is effected by using three or more one-dimensional wafer marks or two or more two-dimensional wafer marks, which are disposed in each shot area, as described above, is also known as "in-shot multipoint EGA alignment method".

More specifically, in this example, a predetermined number N (N is an integer of 3 or more) of shot areas are selected from among shot areas $SA_1$ to $SA_{66}$ on a wafer 20 as sample shots $S_1$ to $S_9$ (in this case, N=9), and coordinate values in the stage coordinate system (X,Y) of two pairs of wafer marks attached to each of the sample shots $S_1$ to $S_9$ are measured by using an LSA type alignment system. For example, a mean value of the X coordinates of the two X-axis wafer marks of each sample shot and a mean value of the Y coordinates of the two Y-axis wafer marks of the sample shot are regarded as array coordinates of the center of the sample shot, thereby obtaining parameters (i.e. scaling parameters Rx and Ry, rotation Θ, perpendicularity error W, and offsets Ox and Oy) for transformation from the sample coordinate system (x,y) into the stage coordinate system (X,Y) in the same way as in the first example.

Further, in this example, a shot rotation e, which is a rotation angle δf the x-axis in a shot, is calculated on the basis of a mean value of Y-coordinate differences between the pairs of Y-axis wafer marks of the sample shots, for example, and a rotation angle $θ_y$ of the y-axis in a shot is calculated on the basis of a mean value of X-coordinate differences between the pairs of X-axis wafer marks. The shot rotation θ is subtracted from the rotation angle $θ_y$ of the y-axis to obtain an angle w, which is determined to be a shot perpendicularity error.

It is assumed in this example that, as a result of the alignment, as shown in FIG. 9(a), the shot array rotation Θ, the shot array perpendicularity error W and the shot perpendicularity error w have become capable of being regarded as zero, but the shot rotation θ has become a predetermined value other than zero. On such a shot array, overlay exposure is effected by the scanning second exposure apparatus having a shot area SC, as shown in FIG. 9(b), which has a size (3L/2) that is sufficiently large to contain three circuit patterns in the direction Y as a scanning direction, and which has a width L in the direction X. The method of alignment effected to carry out the overlay exposure will be explained below.

Figures 10A, 10B, 10C:
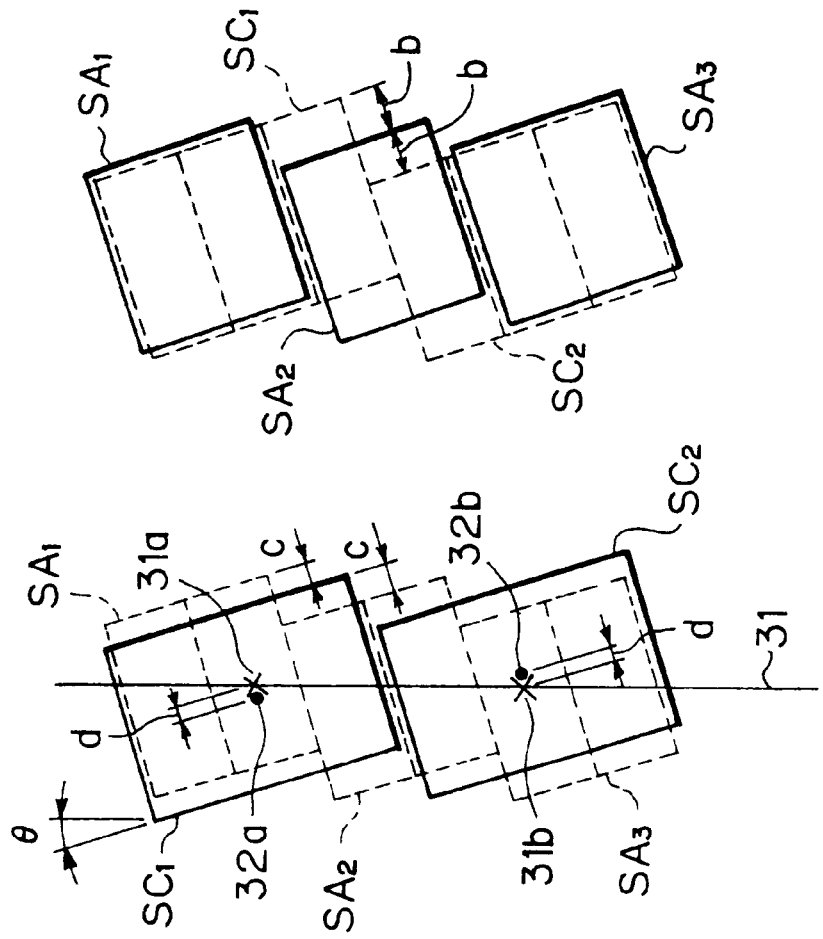
FIG. 10(a) is a plan view showing a part of the shot array shown in FIG. 9(a), together with one example of an array in a case where shot areas exposed over the shot array have a large overlay error.
FIG. 10(b) is a plan view showing an array of shot areas in which the overlay error reduces.
FIG. 10(c) illustrates an alignment method for overlay exposure in which short shot areas are overlaid on an array of long shot areas.

FIG. 10(a) shows a part of the shot array on the wafer 20 shown in FIG. 9(a). In FIG. 10(a), square shot areas $SA_1$, $SA_2$ and $SA_3$, each side of which has a length L, have been rotated counterclockwise through an angle corresponding to the shot rotation θ. It is assumed that circuit pattern images for two shot areas $SC_1$ and $SC_2$, each having the same size as the shot area SC shown in FIG. 9(b), are overlaid on the shot areas $SA_1$ to $SA_3$ by using the second exposure apparatus.

In this case, it is conceivable to effect alignment such that, as shown by the chain double-dashed lines in FIG. 10(a), reference points 31a and 31b, which are at the centers of two arrays of three circuit patterns, coincide with the centers of the second-layer shot areas $SC_1$ and $SC_2$, respectively, on an imaginary straight line 31 passing through the centers of the first-layer shot areas $SA_1$, $SA_2$ and $SA_3$ in parallel to the Y-axis. In this case, if the scanning direction in the second exposure apparatus is restricted to the directions +Y and -Y, it is necessary to rotate the wafer or the reticle clockwise through the angle θ, for example. Further, if the wafer is rotated, it is necessary to correct the array coordinates of each of the first-layer shot areas. In the following description, the scanning direction is assumed to be a direction intersecting the Y-axis at the angle θ.

With this alignment method, however, X-direction overlay errors a and b, which are given by the following equation (10), arise between the second-layer shot area $SC_1$ and the first-layer shot areas $SA_1$ and $SA_2$, respectively, in the same way as in a case where there is a shot array perpendicularity error as shown in FIG. 6(a):

$$a=(¼)L·θ \quad b=(¾)L·θ \qquad (10)$$

Accordingly, it will be understood that the alignment method as shown in FIG. 10(a) causes a large overlay error b to arise particularly at the second shot area $SA_2$. In order to reduce the overlay error, in this example, the center positions of the second-layer shot areas $SC_1$ and $SC_2$ are shifted by a predetermined distance from the reference points 31a and 31b in a direction perpendicular to the scanning direction.

FIG. 10(b) shows an alignment method carried out in this example. In FIG. 10(b), the center positions of the second-layer shot areas $SC_1$ and $SC_2$ have been shifted by -d and +d relative to the reference points 31a and 31b in a direction intersecting the X-axis at the angle θ in the clockwise direction. As a result, there is a uniform overlay error c in the direction X between the first-layer shot areas $SA_1$ to $SA_3$ and the second-layer shot areas $SC_1$ and $SC_2$. The distance d and the overlay error c are given by the following equation (11):

$$d=(¼)L·74 \quad c=(½)L·θ \qquad (11)$$

As a result, the overlay error c given by Eq. (11) is (½)L·θ *in contrast to the overlay error b given by Eq.* (10). Accordingly, it will be understood that the alignment method according to this example enables the maximum value of the overlay error to reduce to (½)L·θ, and thus the overlay error reduces as a whole.

In the third example of the first embodiment, exposure may be carried out by using the first exposure apparatus over shot areas exposed by using the scanning type second exposure apparatus in reverse relation to the above-described exposure operation. One example of such an exposure operation will be explained below with reference to FIG. 10(c).

FIG. 10(c) shows the first-layer shot areas $SC_1$ and $SC_2$ on the wafer which have been formed with circuit patterns by using the scanning second exposure apparatus. In a case where, in FIG. 10(c), a reticle pattern image is to be formed for each of the shot areas $SA_1$, $SA_2$ and $SA_3$ over the shot areas $SC_1$ and $SC_2$ by using the first exposure apparatus, for the first and third shot areas $SA_1$ and $SA_3$, it is only necessary to align them with the first-layer shot areas $SC_1$ and $SC_2$, respectively, in the direction X. For the second shot area $SA_2$, it is only necessary to align its position in a direction perpendicular to the scanning direction with an intermediate position between the first-layer shot areas $SC_1$ and $SC_2$. Consequently, the overlay error between the first and second layers is b only at the shot area $SA_2$.

Further, for the second shot area $SA_2$, exposure may be effected for the upper and lower halves separately in the same way as in the method described with reference to FIGS. 8(b) and 8(c). By doing so, the overlay error can be reduced to zero.

Although in the third example, only the shot rotation θ is corrected, it should be noted that alignment may be effected as follows: A mean value of the shot rotation θ obtained by the in-shot multipoint EGA method and the shot perpendicularity error w, i.e. (θ+w)/2, is regarded as pseudo shot rotation, and alignment is effected on the basis of the pseudo shot rotation.

Further, although in the third example the shot rotation θ is obtained by measuring the positions of three or more wafer marks in each sample shot, the shot rotation θ may be obtained by using numerical values previously obtained by test printing using the first exposure apparatus. In this case, in each sample shot the ordinary EGA type alignment is effected by measuring the positions of a pair of wafer marks as in the conventional practice, and the shot rotation θ alone is obtained by using the input numerical values.

Although in the above-described embodiment two steppers or a combination of a stepper and a step-and-scan type projection exposure apparatus is used, it should be noted that, for example, two step-and-scan type projection exposure apparatuses may be used as two exposure apparatuses having respective exposure fields of different sizes.

The exposure method according to the first embodiment of the present invention provides the following advantages. In a case where exposure is carried out by the mix-and-match method using two exposure apparatuses having respective exposure fields of different sizes, a perpendicularity error in the shot area array on the preceding layer or a mean value of rotation angles of the shot areas is detected, and the shot areas of the subsequent layer are rotated according to the result of the detection. Accordingly, the overlay error between the two layers can be favorably reduced.

Further, in the exposure method according to the first embodiment of the present invention, when exposure is to be carried out by the mix-and-match method using two exposure apparatuses having respective exposure fields of different sizes, a perpendicularity error in the shot area array on the preceding layer or a mean value of rotation angles of the shot areas is detected, and exposure is carried out with the shot areas of the subsequent layer shifted in a direction perpendicular to the scanning direction of the second exposure apparatus according to the result of the detection. Accordingly, the overlay error between the two layers can be favorably reduced.

In this case, if the shot areas of the subsequent layer are rotated in addition to the shifting of the shot areas, the overlay error may be further reduced.

Next, a first example of a second embodiment of the exposure method according to the present invention will be described with reference to FIGS. 11 to 14(c). Two exposure apparatuses used in this example are a one-shot exposure type projection exposure apparatus (stepper) with a demagnification ratio of 5:1 and a step-and-scan type projection exposure apparatus with a demagnification ratio of 4:1. In this example, two chip patterns are formed in each shot area exposed by the former projection exposure apparatus (i.e. a two-chip reticle is used), and three chip patterns are formed in each shot area scan-exposed by the latter projection exposure apparatus (i.e. a three-chip reticle is used). It should be noted that constituent elements in the second embodiment which are similar to those in the first embodiment are denoted by the same reference characters.

Figure 11:
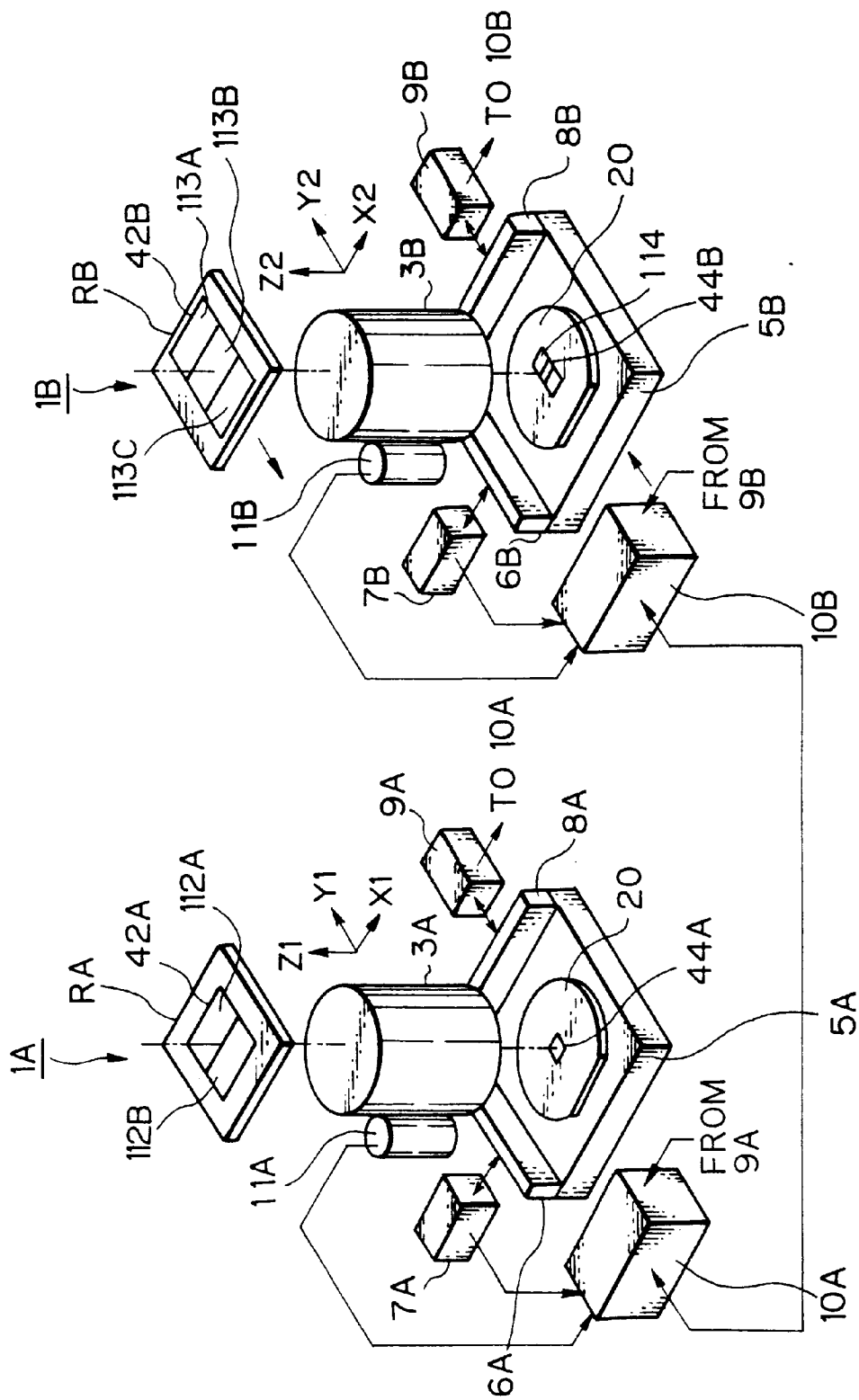
FIG. 11 is a perspective view schematically showing an exposure system used in a first example of a second embodiment of the exposure method according to the present invention.

FIG. 11 shows an exposure system used in this example. In FIG. 11, a stepper 1A, which is a one-shot exposure type projection exposure apparatus, and a step-and-scan type projection exposure apparatus (hereinafter referred to as "scanning exposure apparatus") 1B are installed. In this example, the stepper 1A is a high-resolution exposure apparatus, while the scanning exposure apparatus 1B is a low-resolution exposure apparatus. The stepper 1A is used to carry out exposure for a critical layer, which requires high resolution, on a wafer, and the scanning exposure apparatus 1B is used to carry out exposure for a middle layer, which does not require high resolution, on the wafer. However, the stepper 1A may be a low-resolution exposure apparatus or the scanning exposure apparatus 1B may be a high-resolution exposure apparatus according to the kind of semiconductor device to be produced.

First, in the stepper 1A, a pattern area 42A on a reticle RA is illuminated by exposure light from an illumination optical system (not shown), and an image of a pattern formed in the pattern area 42A is formed on a rectangular exposure field 44A on a wafer 20 as a projected image reduced to ⅕ by a projection optical system 3A. A Z1-axis is taken in a direction parallel to an optical axis of the projection optical system 3A, and two axes of an orthogonal coordinate system set in a plane perpendicular to the Z1-axis are defined as an X1-axis and a Y1-axis, respectively. The pattern area 42A on the reticle RA is divided into partial pattern areas 112A and 112B of the same size in a predetermined direction (in FIG. 11, in the direction Y1). The partial pattern areas 112A and 112B each has original drawing patterns of circuit patterns and alignment marks arranged according to the same layout.

The wafer 20 is held on a wafer stage 5A. The wafer stage 5A comprises a Z-stage for moving the wafer 20 in the direction Z1 to set an exposure surface of the wafer 20, which is to be exposed, at the best focus position, and an XY-stage for positioning the wafer 20 in both the directions of the X1- and Y1-axes. A pair of moving mirrors 6A and 8A which are perpendicular to each other are fixed on the wafer stage 5A. The coordinate in the direction X1 of the wafer stage 5A is measured by a combination of the moving mirror 6A and a laser interferometer 7A which is installed outside the wafer stage 5A. The coordinate in the direction Y1 of the wafer stage 5A is measured by a combination of the moving mirror 8A and a laser interferometer 9A which is installed outside the wafer stage 5A. The coordinates measured by the laser interferometers 7A and 9A are supplied to a controller 10A which controls operations of the whole apparatus. The controller 10A drives the wafer stage 5A to step in both the directions X1 and Y1 through drive units (not shown), thereby positioning the wafer 20. In this case, the stepping drive of the wafer 20 is effected according to an array of shot areas (i.e. unit areas to each of which a pattern image of the pattern area 42A is to be projected by exposure) set on the exposure surface of the wafer 20, that is, a shot map for a critical layer. The shot map is generated by a map generating unit which comprises a computer in the controller 10A. It is assumed that a predetermined perpendicularity error W remains in a coordinate system (i.e. stage coordinate system) (X1,Y1) which defines the travel position of the wafer stage 5A of the stepper 1A in this example.

Further, the stepper 1A in this example is provided with an off-axis imaging type (FIA type) alignment system 11A. The alignment system 11A images an alignment mark (wafer mark) on the wafer 20 and processes an imaging signal thus obtained to detect X1 and Y1 coordinates of the wafer mark. The detected coordinates are supplied to the controller 10A.

It should be noted that, as the alignment system 11A, it is also possible to use a TTR (Through-The-Reticle) type alignment system or a TTL (Through-The-Lens) type alignment system in which the position of a mark is detected through the projection optical system 3A. As a mark detecting method, it is also possible to use a laser step alignment (LSA) method in which a slit-shaped laser beam and a mark are scanned relative to each other, or a so-called two-beam interference method (LIA method) in which two light beams are applied to a diffraction grating-shaped mark, and the position of the mark is detected from a signal obtained from interference between a pair of diffracted light beams generated in parallel from the illuminated mark.

Next, in the scanning exposure apparatus 1B in this example, a part of a pattern area 42B on a reticle RB is illuminated by exposure light from an illumination optical system (not shown), and an image of a part of the reticle pattern is formed in a slit-shaped exposure area 144 on a wafer 20, which is held on a wafer stage 5B, as a projected image reduced to ¼ by a projection optical system 3B. Here, a Z2-axis is taken in a direction parallel to an optical axis of the projection optical system 3B, and two axes of an orthogonal coordinate system set in a plane perpendicular to the Z2-axis are defined as an X2-axis and a Y2-axis, respectively. Under these circumstances, the reticle RB is scanned in the direction −Y2 (or +Y2), and the wafer 20 is scanned in the direction +Y2 (or −Y2) in synchronism with the scanning of the reticle RB, thereby sequentially projecting an image of the pattern formed in the pattern area 42B of the reticle RB onto the exposure field 44B on the wafer 20.

The pattern area 42B of the reticle RB is divided into three partial pattern areas 13A to 13C of the same size in the direction Y2, which is the scanning direction. The size of the exposure field 44B is such that its dimension in the scanning direction is 3/2 times as large as the dimension of the exposure field 44A of the stepper 1A, and the exposure field 44B is equal in size (1:1) to the exposure field 44A in the non-scanning direction. That is, the exposure field 44B is longer than the exposure field 44A in the direction Y2.

The position of a reticle stage (not shown) for scanning the reticle RB of the scanning exposure apparatus 1B is measured by a laser interferometer (not shown). The X2 coordinate of the wafer stage 5B is measured by a combination of a moving mirror 6B and a laser interferometer 7B, and the Y2 coordinate of the wafer stage 5B is measured by a combination of a moving mirror 8B and a laser interferometer 9B. The measured coordinates of the wafer stage 5B are supplied to a controller 10B. In this example, the x2- and Y2-axes are assumed to be perpendicular to each other. The controller 10B controls synchronous drive of the reticle stage (not shown) and the wafer stage 5B. Scanning exposure of the wafer stage 5B is effected according to a shot map for a middle layer set on an exposure surface of the wafer 20, which is to be exposed. The shot map is generated by a map generating unit which comprises a computer in the controller 10B.

In this case, the map generating unit in the controller 10A and the map generating unit in the controller 10B have the function of supplying shot map information prepared thereby to each other. When exposure for a middle layer is to be carried out over a critical layer, for example, shot map information for the critical layer prepared by the map generating unit in the controller 10A of the stepper 1A is transmitted to the other controller 10B. The map generating unit in the controller 10B generates a shot map for the middle layer on the basis of the supplied shot map information. Conversely, when exposure for a critical layer is to be carried out over a middle layer, shot map information for the middle layer prepared in the controller 10B is supplied to the controller 10A.

The scanning exposure apparatus 1B also has an off-axis imaging type (FIA type) alignment system 11B provided at a side surface of the projection optical system 3B. The alignment system 11B detects X2 and Y2 coordinates of a wafer mark on the wafer 20.

Next, one example of an exposure operation which is performed in this example when exposure for a first-layer pattern is first effected by using the stepper 1A and then exposure for a second-layer pattern is effected by using the scanning exposure apparatus 1B will be explained for each of the first and second processing steps.

First, the first step will be explained.

Figure 12A:
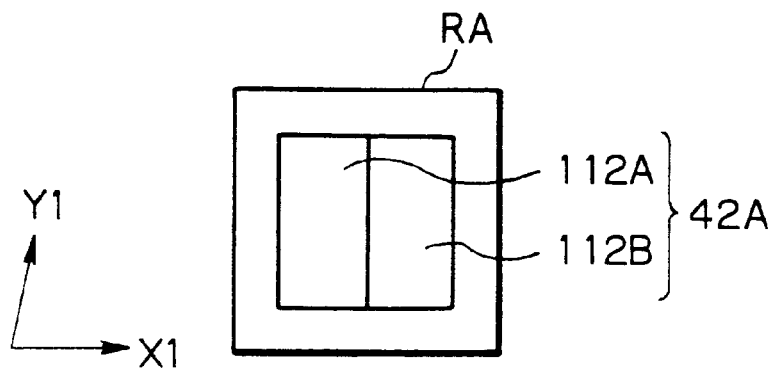
FIG. 12(a) is a plan view showing the orientation of a reticle when exposure is carried out for a first layer on a wafer in the first example of the second embodiment.
Figure 12B:
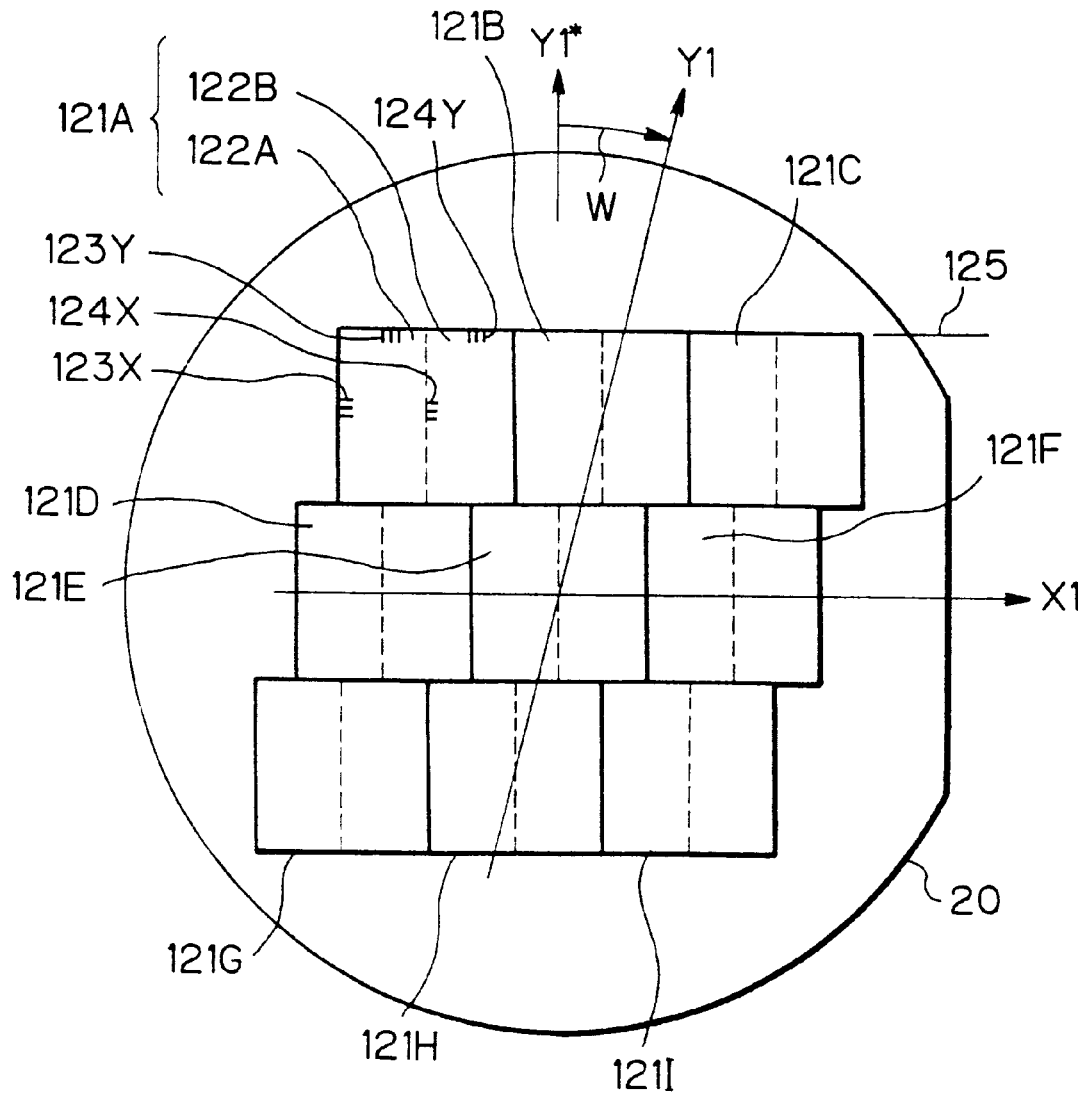
FIG. 12(b) is a plan view showing the orientation of a wafer when exposure is carried out for the first layer on the wafer.

In the first step, as shown in FIG. 12(a), the reticle RA is fixed on the reticle stage (not shown) of the stepper 1A, shown in FIG. 11, such that the reticle RA is rotated through 90° from its ordinary position. As a result, the two partial pattern areas 112A and 112B in he pattern area 42A of the reticle RA lie side-by-side in the direction X1. Next, as shown in FIG. 12(b), the wafer 20 coated with a photoresist is fixed on the wafer stage 5A of the stepper 1A, shown in FIG. 11, such that the wafer 20 is rotated through 90° from its ordinary position. As a result, the wafer 20 is placed such that the cut portion (orientation flat) of the outer periphery of the wafer 20 faces in the direction +X1. Although in FIG. 12(b) the mutual origin of the X1 and Y1-axes is set at the center of the wafer 20, in FIG. 12(a) the origin of the two axes is set outside the reticle RA for the sake of explanation. Further, in FIG. 12(a), the reticle RA is shown in the size of an image thereof as projected on the wafer 20. In this example, as shown in FIG. 12(b), the Y1-axis has rotated through an angle W clockwise relative to an imaginary axis Y1* perpendicularly intersecting the X1-axis; the angle W is a perpendicularity error.

Next, a pattern image of the reticle RA is sequentially projected onto shot areas 121A, 121B, . . . , 121I, which are obtained by dividing a first-layer exposure area on the wafer 20 at a predetermined pitch in each of the directions X1 and Y1, by the step-and-repeat method using the stepper 1A. For example, the first-layer shot areas 121A to 121I are arranged in an array of 3 columns in the direction X1 and 3 rows in the direction Y1. In this case, there is the perpendicularity error W between the X1- and Y1-axes; therefore, the array of shot areas 121A to 121I also has the perpendicularity error W.

However, in this example, exposure has been effected with the reticle RA and the wafer 20 each rotated through 90°. Therefore, in FIG. 12(b), the first shot area 121A on the wafer 20 has two partial shot areas 122A and 122B divided in the direction X1. The partial shot areas 122A and 122B have been exposed to pattern images which are identical with each other. The same is the case with the other shot areas 121B to 121I. When edges of the shot areas 121A to 121C in the first row which are parallel to the array direction of the partial shot areas 122A and 122B are connected together, a straight line 125, which has no irregularity, is obtained.

Thereafter, the wafer 20 is subjected to development, thereby allowing the circuit pattern images and alignment mark images in each shot area to appear as circuit patterns and wafer marks, which comprise recess-and-projection patterns. In this example, the first partial shot area 122A in the first shot area 121A is formed with an X-axis wafer mark 123X and a Y-axis wafer mark 123Y, which comprise line-and-space patterns, respectively. The second partial shot area 122B is also formed with an X-axis wafer mark 124X and a Y-axis wafer mark 124Y. The wafer marks 123X, 123Y, 124X and 124Y are marks which are detectable with an imaging type alignment sensor. It should be noted that the arrangement of wafer marks is not necessarily limited to the example shown in FIG. 12(b). For example, the arrangement of wafer marks may be such that a pair of wafer marks are disposed in each of the shot areas 121A to 121I. It is also possible to dispose more than one pair of wafer marks in each of the shot areas 121A to 121I. Further, two-dimensional marks may be used as wafer marks.

Next, the second step will be explained.

Figure 13:
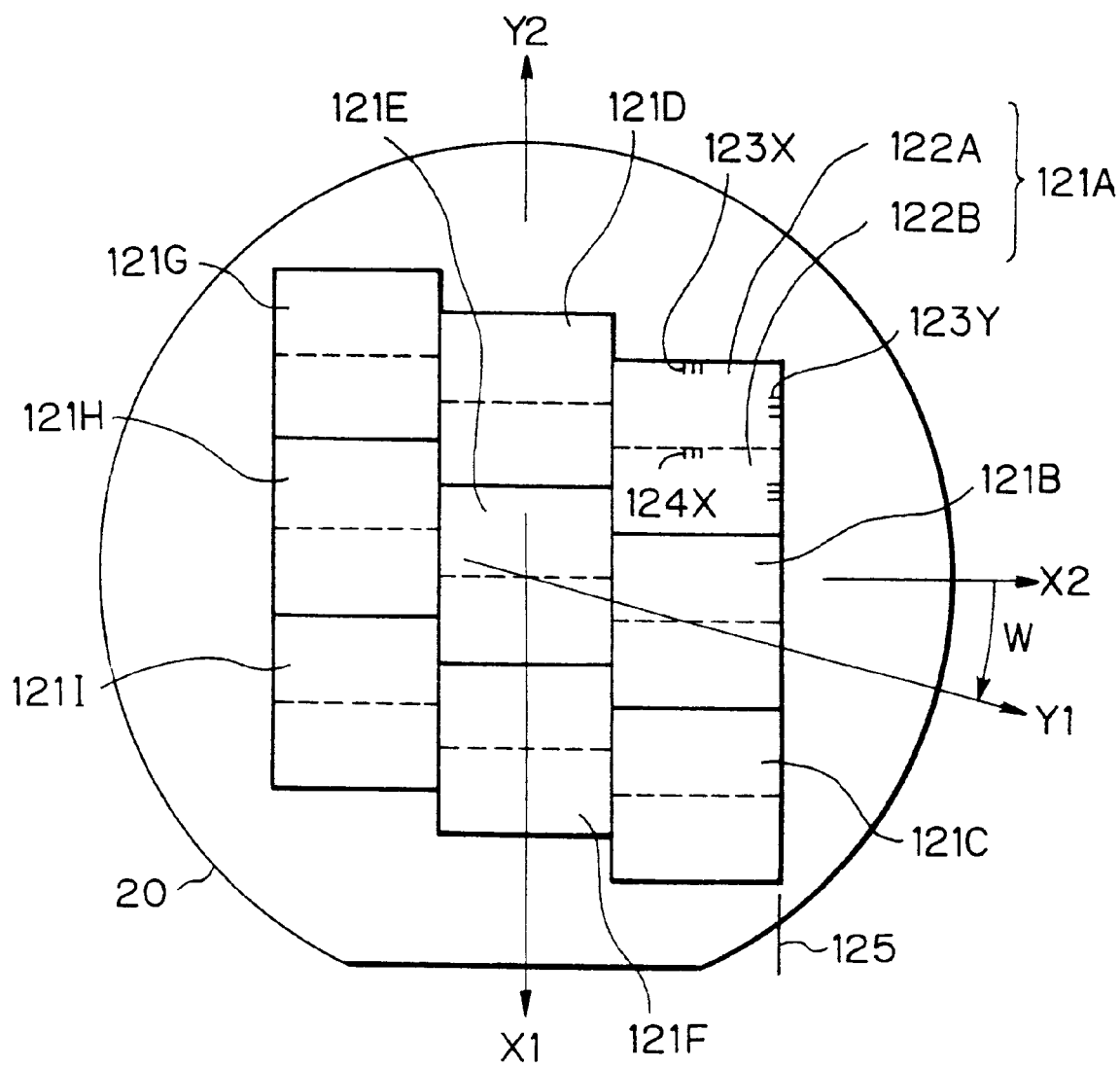
FIG. 13 is a plan view for explaining an alignment method executed before exposure is carried out for the second layer on the wafer in the first example of the second embodiment.

A photoresist is coated over the wafer 20 having the circuit patterns and wafer marks formed thereon in the first step. The photoresist-coated wafer 20 is fixed at the ordinary rotation angle on the wafer stage 5B of the scanning exposure apparatus 1B, shown in FIG. 11. Thus, as shown in FIG. 13, the wafer 20 is disposed such that its cut portion faces in the direction −Y2. As shown in FIG. 11, the reticle RB for the second layer is also set at the ordinary rotation angle, that is, at an angle at which the partial pattern areas 113A to 113C are arranged in the direction Y2.

At this time, the first-layer shot array data is supplied from the controller 10A of the stepper 1A to the controller 10B of the scanning exposure apparatus 1B. The controller 10B determines a second-layer shot array on the basis of the supplied shot array data, together with alignment data (described later).

Thereafter, the wafer 20, which is an object to be exposed, is subjected to alignment by the EGA method in the scanning exposure apparatus 1B.

FIG. 13 shows the wafer 20 as an object to be exposed. In FIG. 13, the origin of the stage coordinate system (X2,Y2) of the scanning exposure apparatus 1B is set at the center of the wafer 20 for the sake of convenience. The origin of the stage coordinate system (X1,Y1) of the stepper 1A used to expose the first layer is also shown to be coincident with the center of the wafer 20. In this case, because the wafer 20 is set at the ordinary rotation angle, the two partial shot areas 122A and 122B in the shot area 121A, for example, are arranged in the direction Y2, and in each of the other shot areas 121B to 121I, the two partial shot areas are also arranged in the direction Y2. To effect EGA type alignment, three or more shot areas are selected as sample shots from among the nine shot areas 121A to 121I on the wafer 20, and the coordinates in the stage coordinate system (X2,Y2) of the wafer marks in the sample shots are measured by using the alignment system 11B, shown in FIG. 11. When the shot area 121A, for example, is selected as a sample shot, the coordinates of a pair of wafer marks 123X and 123Y in the first partial shot area 122A of the shot area 121A are measured, and for each of the other sample shots also, the coordinates of a pair of wafer marks are measured.

Next, the measured values of the coordinates of the wafer marks in the sample shots and the design array coordinates of these wafer marks are statistically processed to determine values of EGA parameters including a rotation (wafer rotation) $\Theta_1$ of the first-layer shot array, a perpendicularity error $W_1$ of the first-layer shot array, an offset $Ox_1$ in the direction X2, and an offset $Oy_1$ in the direction Y2. In this example, the wafer 20 was rotated through 90° at the time of exposure for the first layer, and the X2- and Y2-axes of the second layer are assumed to be perpendicular to each other. Therefore, the rotation $\Theta_1$ is an angle between the Y1-axis of the first-layer shot array and the x2-axis of the second-layer stage coordinate system, and the perpendicularity error $W_1$ is equal to an angle obtained by subtracting π/2 (90°(from the angle between the Y1-axis and the axis (−X1-axis) which is in inverse relation to the X1-axis, that is, the perpendicularity error W in FIG. 12(b).

After the EGA parameters have been obtained as described above, the scanning exposure apparatus 1B, shown in FIG. 11, sets the rotation angle of the wafer 20 such that the Y1-axis of the first-layer shot array is rotated clockwise relative to the X2-axis through the same angle as the perpendicularity error $W_1$ (i.e. W). This means that an offset of the same angle as the perpendicularity error $W_1$ is added to the desired value of the shot array rotation (wafer rotation). As a result, a straight line 125 which connects together the right-hand edges of the shot areas 121A to 121C in the first column, which is parallel to the array direction of the partial shot areas 122A and 122B of the shot area 121A, for example, becomes parallel to the direction Y2, which is the scanning direction of the scanning exposure apparatus 1B. In this state, a shot array of the second layer is determined by taking into consideration the offsets $Ox_1$ and $Oy_1$ in the EGA parameters.

Figure 14A:
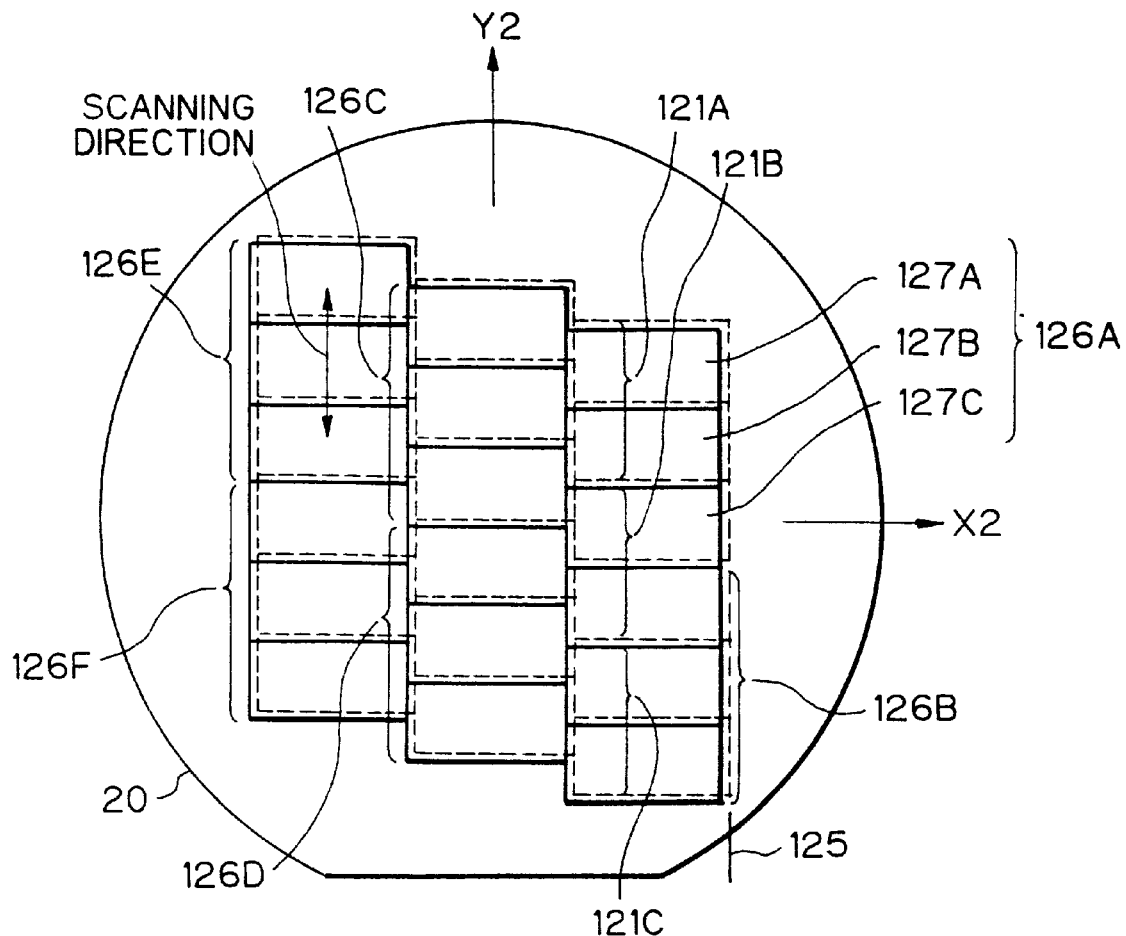
FIG. 14(a) is a plan view showing a shot array when exposure is carried out for a second layer on a wafer in the first example of the second embodiment.
Figure 14B:
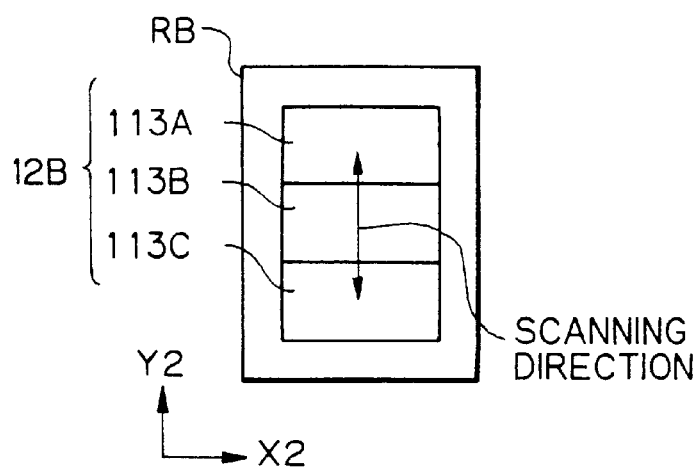
FIG. 14(b) is a plan view showing the orientation of a reticle when exposure is carried out for the second layer.
Figure 14C:
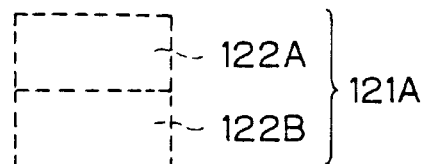
FIG. 14(c) is a plan view showing first-layer shot areas on the wafer.

FIG. 14(a) shows a second-layer shot array set over the first layer as described above. In FIG. 14(a), for example, second-layer shot areas 126A and 126B are set over the first-layer shot areas 121A to 121C; similarly, other second-layer shot areas 126C to 126F are set. In this case, the shot area 126A, for example, is divided into three partial shot areas 127A to 127C in the direction Y2. The partial shot areas 127A to 127C are respectively exposed to images of patterns in partial pattern areas 113C to 113A of the reticle RB, shown in FIG. 14(b). The partial shot areas 127A to 127C in the second-layer shot area 126A each has the same size as the size of each of the partial shot areas 122A and 122B in the first-layer shot area 121A, shown in FIG. 14(c). The other second-layer shot areas 126B to 126F also each has the same configuration as that of the second-layer shot area 126A. The shot areas 126A to 126F determined in this way are each exposed to a pattern image of the reticle RB by the scanning exposure method. Thereafter, development and other processing are carried out, thereby allowing patterns to appear in the second-layer shot areas.

In this example, as shown in FIG. 14(a), the straight line 125 connecting the right-hand edges of the first-layer shot areas 121A to 121C is parallel to the direction Y2, which is the scanning direction for the second layer; therefore, the second-layer shot areas 126A and 126B are overlaid on the first-layer shot areas 121A to 121C substantially perfectly in both the directions X2 and Y2. Thus, the effect of the perpendicularity error in the first-layer shot array is eliminated.

Although in the above-described example the X2- and Y2-axes of the stage coordinate system in the scanning exposure apparatus 1B are assumed to be perpendicular to each other as shown in FIG. 13, it should be noted that the X2- and Y2-axes do not necessarily need to be perpendicular to each other. In a case where the X2- and Y2-axes are not perpendicular to each other, the wafer 20 should be rotated such that the X1-axis of the first-layer shot array is parallel to the direction Y2, which is the scanning direction.

Next, a second example of the second embodiment of the present invention will be described with reference to FIGS. 15 and 16.

In this example also, the two projection exposure apparatuses (i.e. stepper 1A and scanning exposure apparatus 1B) shown in FIG. 11 are used. First, exposure is carried out with respect to the wafer 20 in the stepper 1A in a state where the reticle RA and the wafer 20 have been each rotated through 90° relative to their ordinary positions, as shown in FIGS. 12(a) and 12(b). Next, the wafer 20 is restored to the ordinary rotation angle in the scanning exposure apparatus 1B, as shown in FIG. 13, and then, measurement for alignment is carried out. Up to this point, the second example is approximately the same as the first example. In this example, however, the rotation angle of each sample shot is also measured during the measurement of coordinates of the wafer marks in the sample shots. When the shot area 121A, for example, is a sample shot, the rotation angle thereof is measured as follows: For example; the coordinates of a pair of wafer marks 123X and 123Y are measured, and at the same time, the X2 coordinate of another X-axis wafer mark 124X is measured. A difference between the X2 coordinates of the wafer marks 123X and 124X is divided by an approximate value of the distance in the direction Y2 between the two wafer marks 123X and 124X to obtain a rotation angle of the shot area 121A. Similarly, rotation angles of the other sample shots are obtained, and a mean value of the obtained rotation angles is defined as a shot rotation $\theta_S$. An alignment method in which the coordinates of the number of wafer marks which exceeds two (one in the case of two-dimensional wafer marks) are measured in each sample shot is called "in-shot multipoint EGA alignment method".

Next, the rotation angle of the wafer 20 is set without adding an offset to the desired value of the shot array rotation (wafer rotation) in this example.

Figure 15:
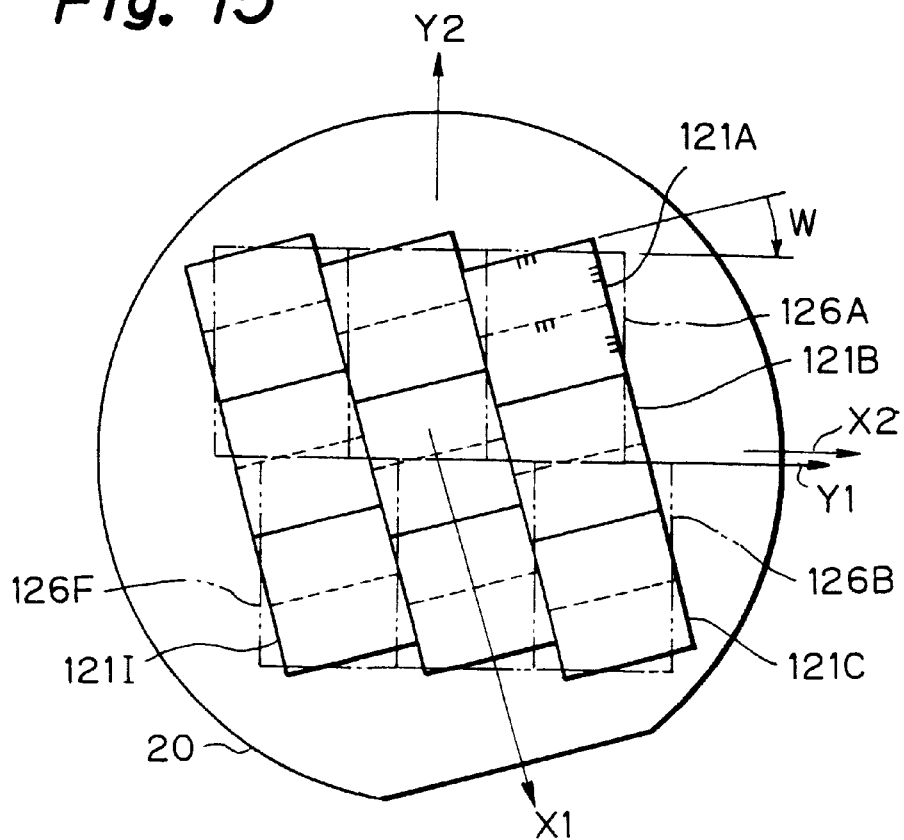
FIG. 15 is a plan view illustrating a second example of the second embodiment, showing a wafer which is placed on a wafer stage of a scanning type exposure apparatus after it has been subjected to exposure for a first layer.

FIG. 15 shows the wafer 20 having a rotation angle set as described above on the wafer stage 5B in the scanning exposure apparatus 1B, shown in FIG. 11. In FIG. 15, a Y1-axis which indicates one array direction of the first-layer shot array is set parallel to the X2-axis of -the stage coordinate system in the scanning exposure apparatus 1B. As a result, the right-hand edges of the shot areas 121A, 121B and 121C, which are parallel to the array direction of the two partial shot areas in the first-layer shot area 121A, for example, are slanted at the same angle as the perpendicularity error W with respect to the direction Y2, which is the scanning direction. The perpendicularity error W is a value obtained by subtracting the shot rotation $\theta_S$, obtained by the in-shot multipoint EGA method, from the shot array rotation $\Theta_1$ obtained in the state shown in FIG. 13. If exposure is simply carried out by the scanning exposure method with respect to the wafer 20 which is in the state shown in FIG. 15, second-layer shot areas would become shot areas 126A to 126F having edges parallel to the directions X2 and Y2, as shown by the chain double-dashed lines, resulting in an overlay error between the first- and second-layer shot areas.

In order to avoid the above problem, in this example, exposure is carried out with each of the second-layer shot areas 126A to 126F rotated counterclockwise through an angle equal to the perpendicularity error W relative to the wafer 20. More specifically, in a case where the scanning direction can be finely adjusted during the scanning exposure in the scanning exposure apparatus 1B, the reticle RB is rotated counterclockwise through an angle equal to the perpendicularity error W in FIG. 11, and thereafter, the reticle RB is scanned in a direction rotated from the direction Y2 by the perpendicularity error W, and the wafer 20, shown in FIG. 15, is scanned in a direction parallel to the scanning direction of the reticle RB in synchronism with the scanning of the reticle RB. To finely adjust the scanning direction of the reticle RB in this way, the reticle RB should be gradually shifted in the direction X2 according to the scanning position by using, for example, a mechanism for finely adjusting the position of the reticle RB. As a result, the second-layer shot areas 126A to 126F are each rotated counterclockwise by the perpendicularity error W, as shown by the continuous lines in FIG. 16, and thus the overlay error between the first- and second-layer shot areas is minimized.

Figure 16:
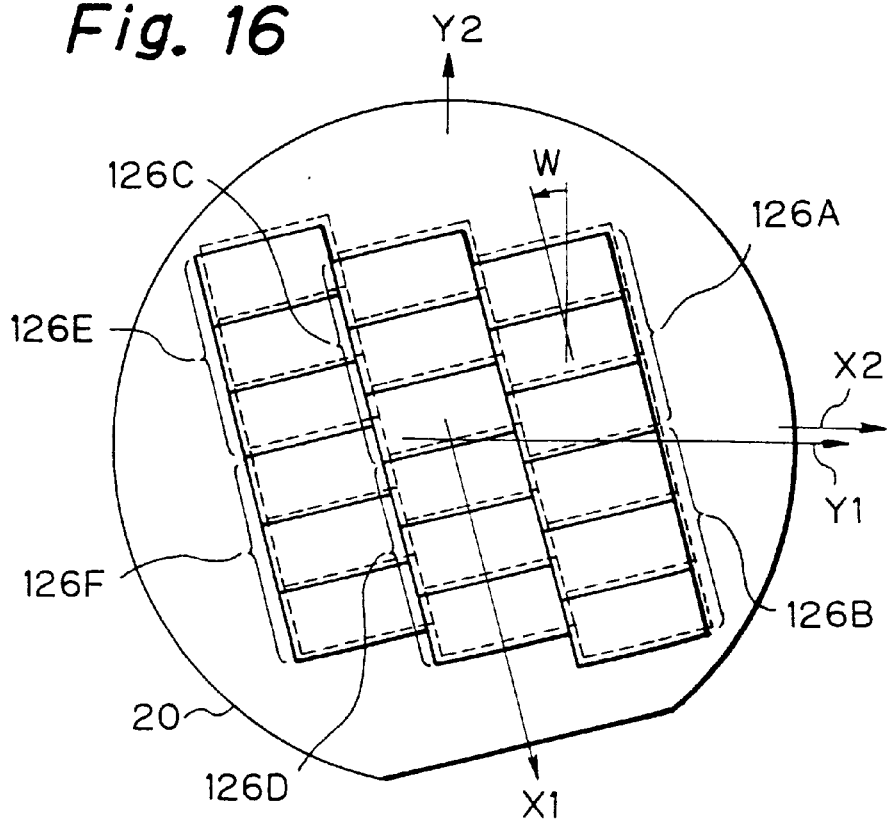
FIG. 16 is a plan view showing a shot array of a second layer on the wafer in the second example of the second embodiment.

It should be noted that, when the exposure apparatus that effects exposure for the second layer is a one-shot exposure type projection exposure apparatus (e.g. stepper), the rotation angle (shot rotation) of each of the shot areas 126A to 126F can be corrected, as shown in FIG. 16, simply by rotating the reticle RB.

Next, a third example of the second embodiment of the present invention will be described with reference to FIGS. 17(a), 17(b) and 17(c).

In this example also, the two projection exposure apparatuses (i.e. stepper 1A and scanning exposure apparatus 1B) shown in FIG. 11 are used. First, as shown in FIGS. 12(a) and 12(b), exposure is carried out with respect to the wafer W in the stepper 1A in a state where the reticle RA and the wafer 20 have been each rotated through 90° relative to their ordinary positions. Up to this point, the third example is the same as the first example. In this example, however, the subsequent exposure for the second layer is carried out by the scanning exposure apparatus 1B, shown in FIG. 11, with the reticle RB and the wafer 20 left rotated through 90° from their ordinary positions. The scanning exposure apparatus 1B in this example effects scanning exposure in a direction parallel to the direction X2. For this purpose, an exposure apparatus in which the scanning direction is the direction X2 should be used as the scanning exposure apparatus 1B. Alternatively, an exposure apparatus in which the scanning direction can be switched to either of the directions X2 and Y2 should be used as the scanning exposure apparatus 1B. The following is a description of the exposure method for the second layer in this example.

Figure 17A:
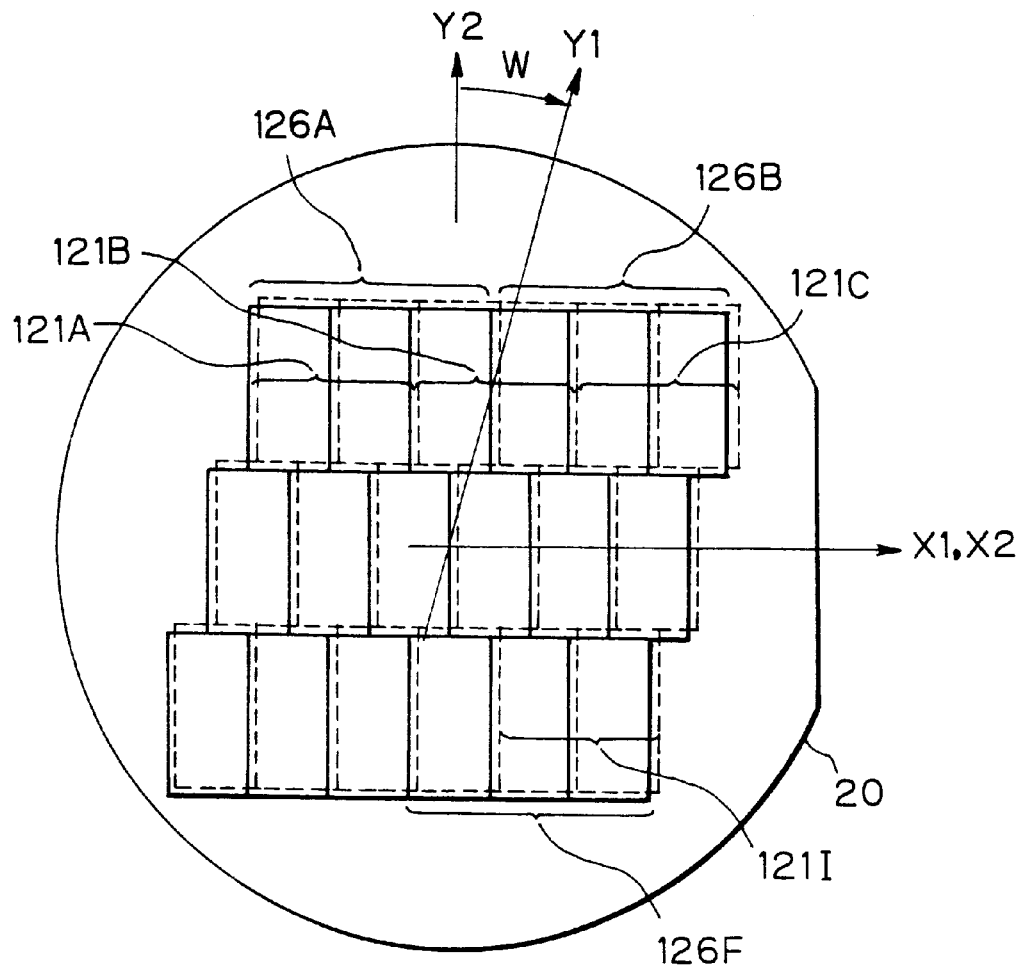
FIG. 17(a) is a plan view of a third example of the second embodiment, showing shot arrays of first and second layers on a wafer.
Figure 17B:
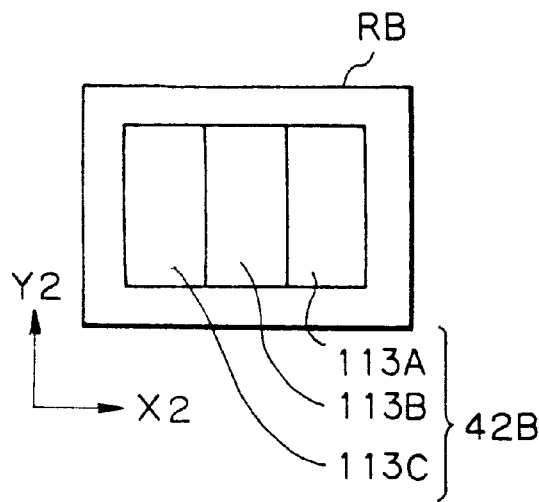
FIG. 17(b) is a plan view showing the orientation of a reticle when exposure is carried out for the second layer on the wafer.
Figure 17C:
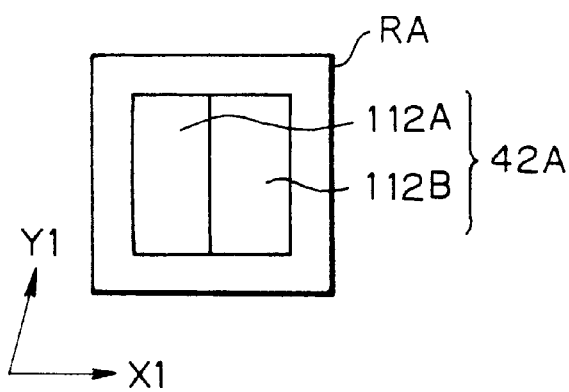
FIG. 17(c) is a plan view showing the orientation of a reticle when exposure is carried out for the first layer on the wafer.

FIG. 17(a) shows the wafer 20 placed on the wafer stage 5B in the scanning exposure apparatus 1B, shown in FIG. 11, after the completion of exposure and development for the first layer. In FIG. 17(a), the X1-axis which indicates one array direction of first-layer shot areas 121A, 121B, . . . , 121I is set approximately parallel to the x2-axis of the stage coordinate system in the scanning exposure apparatus 1B. In this case, at the time of exposure for the first layer, as shown in FIG. 17(c), the reticle RA is set such that the two partial pattern areas 112A and 112B lie side-by-side in the direction X1. The first-layer shot array has a perpendicularity error W.

In this example also, the wafer 20 shown in FIG. 17(a) is subjected to EGA alignment, thereby obtaining values of EGA parameters including a shot array rotation (wafer rotation) $\Theta_2$, a shot array perpendicularity error $W_2$, an offset $Ox_2$ in the direction X2, and an offset $Oy_2$ in the direction Y2. Thereafter, the rotation anile of the wafer 20 is set such that the X1-axis is accurately parallel to the X2-axis on the basis of the rotation $\Theta_2$. Then, as shown in FIG. 17(b), the rotation angle of the reticle RB is set such that the array direction of the partial pattern areas 113A to 113C is parallel to the direction X2. Then, the reticle RB is scanned in the direction +X2 (or −X2) by the scanning exposure apparatus 1B, and the wafer 20 is scanned in the direction −X2 (or +X2) by the scanning exposure apparatus 1B in synchronism with the scanning of the reticle RB, thereby sequentially transferring a pattern image of the reticle RB onto the second-layer shot areas 126A, 126B, . . . , 126F, shown in FIG. 17(a), by the scanning exposure method. As a result, the second-layer shot areas 126A and 126B are substantially perfectly overlaid on the first-layer shot areas 121A, 121B and 121C, and thus the effect of the perpendicularity error W of the first layer is eliminated.

Although in the above-described second embodiment exposure is first carried out by the stepper 1A having a small exposure field, and thereafter, exposure is carried out by the scanning exposure apparatus 1B having a large exposure field, it should be noted that the present invention is also applicable to an exposure process in which exposure is carried out by the stepper 1A having a small exposure field after exposure has been carried out by the scanning exposure apparatus 1B having a large exposure field in reverse relation to the above. In the latter case also, the effect of the perpendicularity error of the first layer can be reduced. Further, although in the above-described second embodiment the stepper 1A and the scanning exposure apparatus 1B are used as a combination of two exposure apparatuses, it should be noted that both the two exposure apparatuses may be steppers. Alternatively, both the two exposure apparatuses may be scanning exposure apparatuses.

According to the second embodiment, when a first mask pattern is to be transferred onto a photosensitive substrate by using the first exposure apparatus, the array of a plurality of shot areas on the photosensitive substrate to each of which the first mask pattern is to be transferred by exposure is set in a direction corresponding to a direction in which the exposure field of the first exposure apparatus is different in length from the exposure field of the second exposure apparatus (i.e. the second exposure field). Therefore, a plurality of shot areas of a first layer can be arranged in the form of a straight line in the direction in which the exposure fields of the first and second exposure apparatuses differ in length from each other. Accordingly, even if the first-layer shot array has a perpendicularity error, an overlay error between the first and second layers can be reduced by overlaying the second-layer shot areas on the first-layer shot areas along the direction in which the two exposure fields are different in length from each other. Thus, it is possible to reduce an overlay error between different layers in a case where exposure is carried out by the mix-and-match method using a plurality of exposure apparatuses having respective exposure fields (shot areas) of different sizes because they are different from each other in the length in a predetermined direction on a photosensitive substrate.

In a case where the first mask pattern is transferred onto the photosensitive substrate by using the first exposure apparatus in a state where the photosensitive substrate and the first mask pattern have previously been rotated through 90° from their ordinary positions, the effect of a perpendicularity error of the first-layer shot array can be readily eliminated without providing a special mechanism on the two exposure apparatuses, particularly when the first exposure apparatus is a one-shot exposure type exposure apparatus (e.g. stepper).

In a case where the second exposure apparatus is a scanning exposure type exposure apparatus, and the above-described predetermined direction (i.e. direction in which the two exposure fields differ in length from each other) is the scanning direction, the exposure field (i.e. second exposure field) of the second exposure apparatus is likely to lengthen in the predetermined direction in particular. Accordingly, the present invention is particularly useful in such a case.

Although in the second embodiment the one-shot exposure type exposure apparatus is used first and then the scanning exposure type exposure apparatus is used, these two exposure apparatuses may be used in the reverse order. That is, the scanning exposure type exposure apparatus may be used first.

Next, a third embodiment of the exposure method according to the present invention will be described with reference to FIGS. 18 to 23(b). In this embodiment, a projection exposure apparatus (stepper) in which a reduced image of a pattern formed on a reticle is projected onto each shot area on a wafer by the step-and-repeat method is used as each of two exposure apparatuses. It should be noted that constituent elements in this embodiment which are similar to those in the first and second embodiments are denoted by the same reference characters, and that arrangements similar to those in the first and second embodiments will be briefly explained in the following description.

Figure 18:
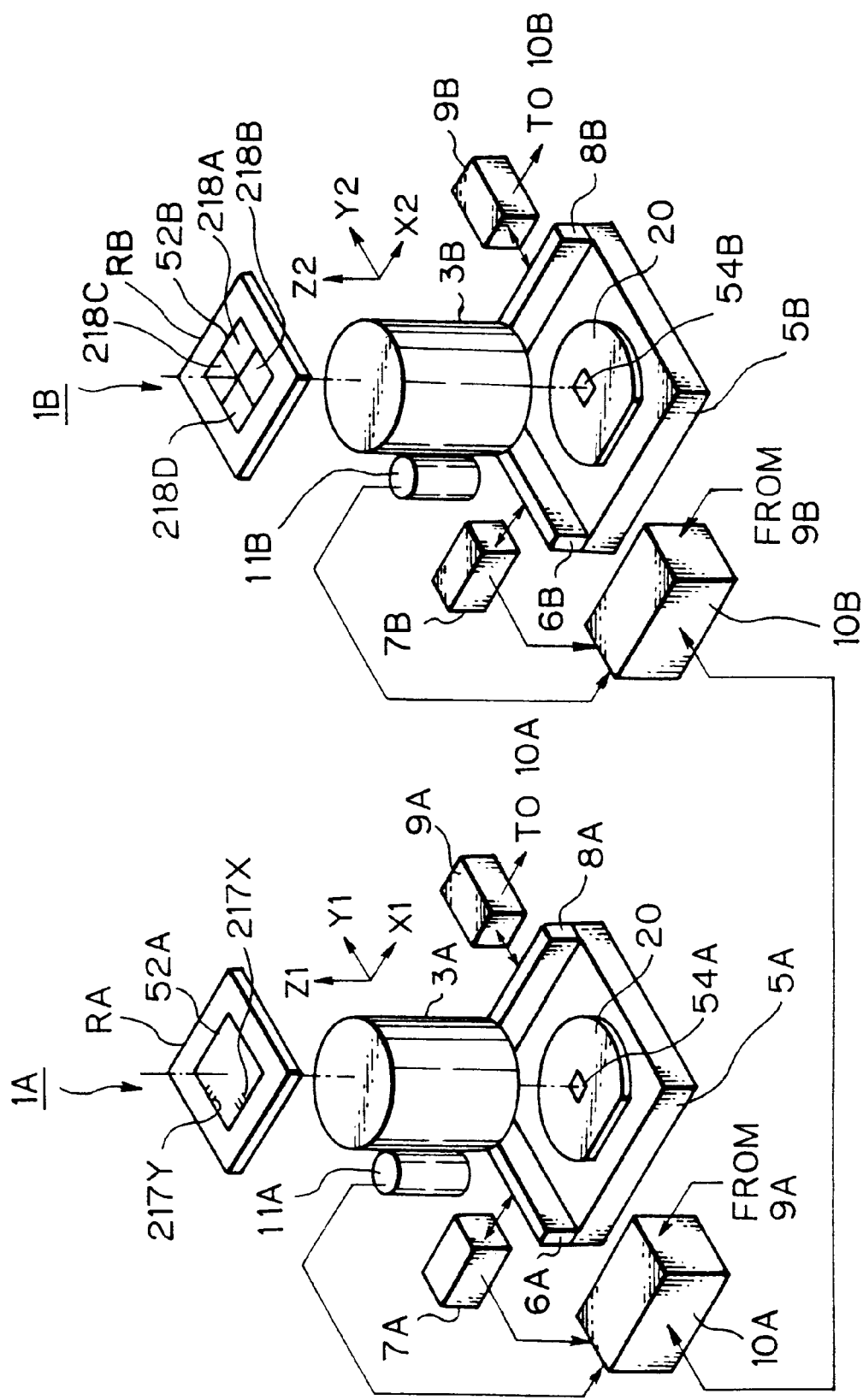
FIG. 18 is a perspective view schematically showing an exposure system used in a third embodiment of the exposure method according to the present invention.

FIG. 18 shows an exposure system used in this embodiment. In the illustrated exposure system are installed a stepper 1A having a small exposure field (hereinafter referred to as "fine stepper") and a stepper 1B having a large exposure field (hereinafter referred to as "middle stepper"). In this embodiment, the fine stepper 1A is a high-resolution exposure apparatus, and the middle stepper 1B is a low-resolution exposure apparatus. The fine stepper 1A is used to carry out exposure for a critical layer on a wafer, and the middle stepper 1B is used to carry out exposure for a middle layer on the wafer. However, the fine stepper 1A may be a low-resolution exposure apparatus or the middle stepper 1B may be a high-resolution exposure apparatus according to the kind of semiconductor device to be produced.

First, in the stepper 1A, a pattern area 52A on a reticle RA is illuminated by exposure light from an illumination optical system (not shown), and an image of the original drawing patterns of overlay accuracy measuring marks (vernier marks), which have been written in the pattern area 52A according to a predetermined layout, is projected onto a rectangular exposure field 54A on a wafer 20 as an image reduced to ⅕ by a projection optical system 3A. A Z1-axis is taken in a direction parallel to an optical axis of the projection optical system 3A, and two axes of an orthogonal coordinate system set in a plane perpendicular to the Z1-axis are defined as an X1-axis and a Y1-axis, respectively. The reticle RA has an alignment mark 217X for the X1-axis formed at an end of the pattern area 52A in the direction Y1 (e.g. within a masking frame) and also has an alignment mark 217Y for the Y1-axis formed at an end of the pattern area 52A in the direction X1.

A wafer stage 5A comprises a Z-stage, an XY-stage, etc. The coordinate in the direction X1 of the wafer stage 5A is measured by a combination of a moving mirror 6A and a laser interferometer 7A. The coordinate in the direction Y1 of the wafer stage 5A is measured by a combination of a moving mirror 8A and a laser interferometer 9A. The coordinates measured by the laser interferometers 7A and 9A are supplied to a controller 10A which controls operations of the whole apparatus. The controller 10A drives the wafer stage 5A to step, thereby positioning the wafer 20. In this case, the stepping drive of the wafer 20 is effected according to a shot map for a critical layer. The shot map is generated by a map generating unit which comprises a computer in the controller 10A.

An off-axis imaging type (FIA type) alignment system 11A images an alignment mark (wafer mark) or overlay accuracy measuring vernier mark on the wafer 20 and processes an imaging signal thus obtained to detect X1 and Y1 coordinates of the mark. The detected coordinates are supplied to the controller 10A.

The middle stepper 1B in this embodiment has substantially the same arrangement as that of the fine stepper 1A. In the middle stepper 1B, however, an image of a pattern formed in a pattern area 52B of a reticle RB is projected onto a rectangular exposure field 54B on a wafer 20 held on a wafer stage 5B as an image reduced to 1/2.5 through a projection optical system 3B. Accordingly, the size of the exposure field 54B is double that of the exposure field 54A of the fine stepper 1A in both lengthwise and breadthwise directions. A Z2-axis is taken in a direction parallel to an optical axis of the projection optical system 3B, and two axes of an orthogonal coordinate system set in a plane perpendicular to the Z2-axis are defined as an X2-axis and a Y2-axis, respectively. The pattern area 52B of the reticle RB is divided into two columns in the direction X2 and two rows in the direction Y2 to form partial pattern areas 218A to 218D. The partial pattern areas 218A to 218D each has vernier mark original drawing patterns formed according to the same layout.

The X2 coordinate of the wafer stage 5B in the middle stepper 1B is measured by a combination of a moving mirror 6B and a laser interferometer 7B. The Y2 coordinate of the wafer stage 5B is measured by a combination of a moving mirror 8B and a laser interferometer 9B. The measured coordinates of the wafer stage 5B are supplied to a controller 10B. The controller 10B controls stepping of the wafer stage 5B. Stepping drive of the wafer stage 5B is effected according to an array of shot areas (to each of which the pattern image of the pattern area 52B is to be projected by exposure) set on an exposure surface of the wafer 20, which is to be exposed, that is, a shot map for a middle layer. The shot map is generated by a map generating unit which comprises a computer in the controller 10B.

In this case, the map generating unit in the controller 10A and the map generating unit in the controller 10B have the function of supplying shot map information prepared thereby to each other. When exposure for a middle layer is to be carried out over a critical layer, for example, shot map information for the critical layer prepared by the map generating unit in the controller 10A of the stepper 1A is transmitted from a communication unit in the controller 10A to a communication unit in the controller 10B. The map generating unit in the controller 10B generates a shot map for the middle layer on the basis of the supplied shot map information. Conversely, when exposure for a critical layer is to be carried out over a middle layer, shot map information for the middle layer prepared by the map generating unit in the controller 10B is supplied to the map generating unit in the controller 10A.

The middle stepper 1B also has an off-axis imaging type (FIA type) alignment system 11B provided at a side surface of the projection optical system 3B. The alignment system 11B detects X2 and Y2 coordinates of a wafer mark or vernier mark on the wafer 20.

Next, one example of an operation of correcting coordinate transformation parameters for alignment when exposure of the pattern for the middle layer is to be effected by the middle stepper 1B after exposure of the pattern for the critical layer has been carried out by the fine stepper 1A in this embodiment will be explained for each of the first to third processing steps. In this embodiment also, the EGA (Enhanced Global Alignment) method is used in which values of the six coordinate transformation parameters (scaling parameters Rx and Ry, rotation $\Theta$, perpendicularity W, and offsets Ox and Oy) in Eq. (1) are determined, and array coordinates of each shot area are calculated from the coordinate transformation parameters and design array coordinates.

First, the first step will be explained.

In the first step, an unexposed wafer 20 coated with a photoresist is placed on the wafer stage 5A of the fine stepper 1A, shown in FIG. 18, and a reduced image of the pattern on the reticle RA is sequentially transferred by the step-and-repeat method onto a multiplicity of shot areas arrayed on the wafer 20 in units of the exposure field 54A. The reticle RA has the original drawing patterns of a plurality of vernier marks formed according to a predetermined layout in addition to a pair of alignment marks. Thereafter, the wafer 20 is subjected to development, thereby allowing the pair of alignment marks to appear as wafer marks comprising recess-and-projection patterns, and also allowing the vernier mark original drawing patterns to appear as vernier marks comprising recess-and-projection patterns. The patterns obtained after the development can be regarded as critical layer patterns on the wafer 20. However, it is also possible to carry out the following alignment and measurement of an amount of positional displacement between two corresponding vernier marks with these marks left in the form of latent images without effecting development.

Next, the second step will be explained.

A photoresist is coated over the wafer 20 having the wafer and vernier marks formed in the first step, and the photoresist-coated wafer 20 is placed on the wafer stage 5B of the middle stepper 1B, shown in FIG. 18. At this time, information concerning the critical layer shot map used in the first step has been supplied from the controller 10A of the fine stepper 1A to the controller 10B of the middle stepper 1B. Thus, the controller 10B can obtain design array coordinates of the critical layer wafer marks on the wafer 20.

Figure 19A:
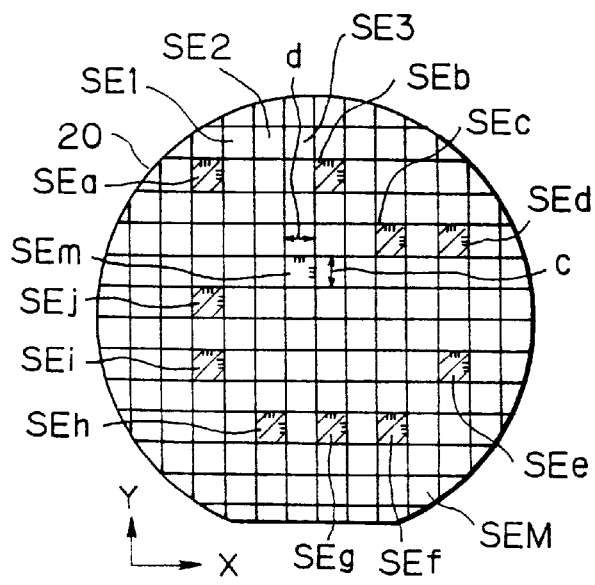
FIG. 19(a) is a plan view showing a shot array of a critical layer on a wafer in the third embodiment.

FIG. 19(a) shows the wafer 20 placed on the wafer stage 5B. In FIG. 19(a), the X2- and Y2-axes of the middle stepper 1B are shown as being X- and Y-axes, respectively. In this case, the wafer 20 has been roughly aligned by a pre-alignment mechanism (not shown), and the surface of the wafer 20 has been divided into M (M is an integer of 12 or more) critical layer shot areas SE1, SE2, . . . , SEM in two directions which are approximately parallel to the directions X and Y, respectively. In actual practice, a scribe line area of a predetermined width lies between shot areas SEm (m=1 to M); however, illustration of the scribe line area is omitted in FIG. 19(a). The width (pitch) in the direction X of each shot area SEm, including the scribe line area, is d, and the width (pitch) in the direction Y is c. In this embodiment, each shot area SEm is approximately square (d≈c).

Figure 19B:
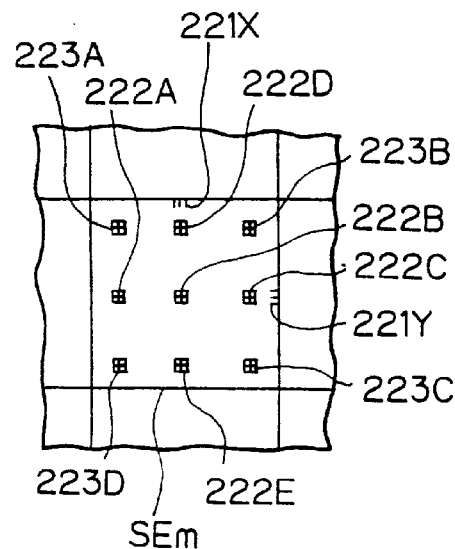
FIG. 19(b) is an enlarged plan view showing an arrangement of vernier marks in a shot area of the critical layer.

FIG. 19(b) shows a shot area SEm as a typical example of the critical layer shot areas. In FIG. 19(b), the shot area SEm has a wafer mark 221X for the X-axis formed at one end thereof, and also has a wafer mark 221Y for the Y-axis formed at another end thereof. Further, the shot area SEm has five vernier marks 222A to 222E which are distributed in a cross shape, and also has four vernier marks 223A to 223D which are formed at respective positions near the four corners of the shot area SEm. The original drawing patterns of marks distributed as shown in FIG. 19(b) have been formed in the pattern area 52A of the reticle RA of the fine stepper 1A, shown in FIG. 18.

It should be noted that the vernier marks 222A to 222E and 223A to 223D used in this embodiment are two-dimensional box-in-box marks, which are detected by an imaging detection method with the alignment system 11B, shown in FIG. 18. However, it is possible to use other kinds of mark as vernier marks, for example, marks each formed by a combination of two one-dimensional line-and-space patterns which are crossed at right angles. It is also possible to use the wafer marks 221X and 221Y as vernier marks. Further, marks which are detected, for example, by the laser step alignment (LSA) method may also be used as vernier marks. The distribution of vernier marks is not necessarily limited to that shown in FIG. 19(b). That is, vernier marks used in this embodiment may be distributed as desired.

Next, the controller 10B of the middle stepper 1B, shown in FIG. 18, effects alignment by the EGA method. Accordingly, the controller 10 drives the wafer stage 5B to move the field of view of the alignment system 11B sequentially according to the critical layer shot map, thereby measuring array coordinates (Mxn,Myn) in a stage coordinate system (i.e. a coordinate system determined by values measured with the laser interferometers 7B and 9B of the middle stepper 1B) of each of the wafer marks 221X and 221Y attached to 10 (for example) shot areas (sample shots) SEa, SEb, SEc, . . . , SEj selected from among the shot areas on the wafer 20, as shown in FIG. 19(a). Then, values of the six EGA parameters (scaling parameters Rx and Ry, rotation θ, perpendicularity W, and offsets Ox and Oy) in Eq. (1) are determined so as to minimize the residual error component (expressed by Eq. (2)) of the alignment error, that is, the deviation of the measured values (Mxn,Myn) of the wafer marks 221X and 221Y of each sample shot from the array coordinate values, which are calculated from the design array coordinates (Dxn,Dyn) of the wafer marks 221X and 221Y.

Next, the controller 10B sequentially substitutes the six EGA parameters and the design array coordinate values (Dxm,Dym) of the shot areas SEm (m=1 to M) into the right-hand side of Eq. (1), thereby obtaining array coordinate values in the stage coordinate system of each shot area SEm of the critical layer on the wafer 20. At this time, because the exposure field 54B of the middle stepper 1B is twice as large as the exposure field 54A of the fine stepper 1A in both the directions X and Y, the controller 10B divides the shot areas SEm (m=1 to M), shown in FIG. 19(a), into a plurality of blocks each comprising an array of two shot areas in the direction X and two shot areas in the direction Y, and obtains array coordinates in the stage coordinate system of the center of each block from the computational array coordinates of the four shot areas in the block. Thereafter, the controller 10B sequentially aligns the array coordinates of the center of each block on the wafer 20 with the center of the exposure field 54B, and transfers an image of the vernier mark original drawing patterns formed on the reticle RB onto each block. Thereafter, development is carried out, thereby allowing middle layer vernier marks to appear over the critical layer vernier marks on the wafer 20. It should be noted that the following measurement may be effected with the transferred marks left in the form of latent images, as has already been described above.

Next, a third step will be explained.

In the third step, an amount of positional displacement between the critical and middle layer vernier marks is measured. For this purpose, the wafer 20 having been subjected to development in the second step is placed, for example, on the wafer stage 5B of the middle stepper 1B, shown in FIG. 18, and an amount of positional displacement between the critical and middle layer vernier marks is measured by the alignment system 11B. However, the measurement of a positional displacement between the critical and middle layer vernier marks may be carried out by using another measuring device of high accuracy.

Figure 20A:
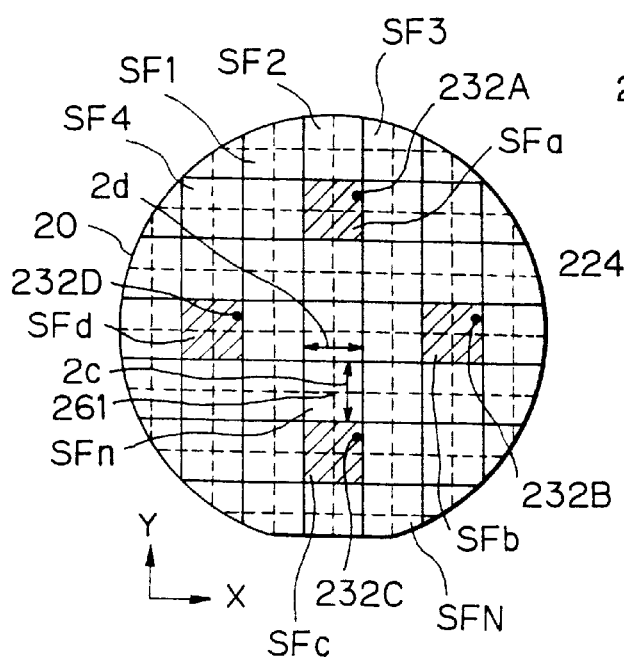
FIG. 20(a) is a plan view showing a shot array and measuring point arrangement on a middle layer exposed over the critical layer shown in FIG. 19(a).

FIG. 20(a) shows the wafer 20 having overlaid vernier marks formed by the exposure process in the second step. In FIG. 20(a), the wafer 20 has middle layer shot areas SF1, SF2, . . . , SFN (N is an integer of 4 or more) arranged at a pitch $2d$ along the X-axis and at a pitch $2c$ along the Y-axis. Each shot area SFn (n=1 to N) contains four critical layer shot areas SEm. It should be noted that, if there is a magnification error in each shot area SFn of the middle layer, the widths of each shot area SFn in the directions X and Y are slightly deviated from $2d$ and $2c$, respectively. Further, the center 261 of each shot area SFn is substantially coincident with the center of the associated four critical layer shot areas. Each shot area SFn has a total of 36 (=4×9) vernier marks corresponding to the nine vernier marks 222A to 222E and 223A to 223D (see FIG. 19(*b*)) in each critical layer shot area SEm.

Assuming that each middle layer shot area SFn is $M_1/N_1$ times and $M_2/N_2$ times as large as the critical layer shot area SEm in the directions X and Y, respectively, in this embodiment $M_1/N_1=2/1$ and $M_2/N_2=2/1$. Accordingly, a reference measurement area in this embodiment is an area determined by multiplying the middle layer shot area SFn by one in each of the directions X and Y, that is, the shot area SFn itself. Therefore, four shot areas (reference measurement areas) SFa to SFd which are substantially uniformly distributed over the wafer 20, as shown by the hatching in the figure, are defined as objects to be measured.

Figure 20B:
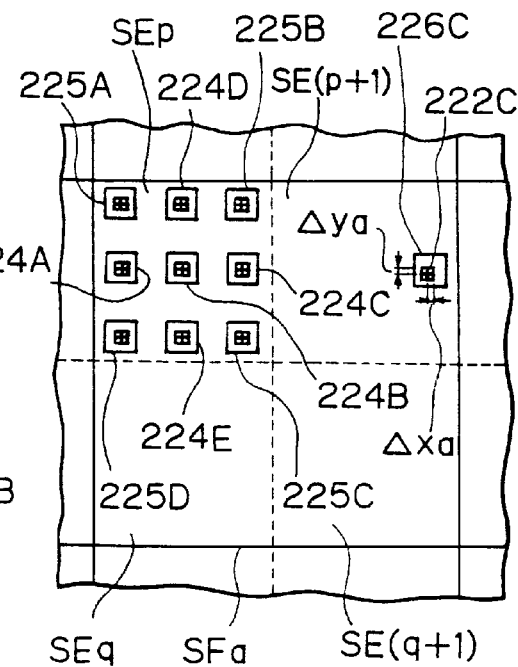
FIG. 20(b) is an enlarged plan view showing a part of the vernier mark arrangement in a shot area of the middle layer.

FIG. 20(*b*) shows the shot area SFa among the four reference measurement areas. In FIG. 20(*b*), the shot area SFa has nine middle layer vernier marks 224A to 224E and 225A to 225D formed to surround the respective vernier marks which belong to the second-quadrant shot area SEp of the four critical layer shot areas underlying the middle layer shot area SFa. The shot area SFa further has nine vernier marks (not shown) similarly formed to surround the respective vernier marks which belong to each of the other shot areas SE(p+1), SEq and SE(q+1) underlying the shot area SFa. However, FIG. 20(*b*) shows the middle layer vernier mark 226C corresponding to the vernier mark 222C formed in the intermediate portion at the right end of the first-quadrant shot area SE(p+1) among those middle layer vernier marks.

Next, in this embodiment, an amount of positional displacement between the critical layer vernier mark 222C and the middle layer vernier mark 226C is measured at each of measuring points 232A to 232D lying at the mutually identical positions in the shot areas (reference measurement areas) SFa to SFd, which are objects to be measured, on the wafer 20. For example, the measuring points 232A to 232D each lies in the intermediate portion at the right end of the first quadrant [i.e. an area corresponding to the shot area SE(p+1) in FIG. 20(*b*)] in the shot areas SFa to SFd. Accordingly, at the measuring point 232A, positional displacements ($\Delta xa, \Delta ya$) in the directions X and Y of the vernier mark 226C relative to the vernier mark 222C is measured. At the other measuring points 232B to 232D, positional displacements ($\Delta xb, \Delta yb$) to ($\Delta xd, \Delta yd$) are similarly measured.

Thereafter, if there is a difference ($\Delta xb-\Delta xd$) between the positional displacements in the direction X measured at the two measuring points 232D and 232B in FIG. 20(*a*), for example, the difference ($\Delta xb-\Delta xd$) is divided by the distance in the direction X between the two measuring points 232D and 232B, thereby obtaining a correction value (error) $\Delta Rx$ for the scaling parameter Rx in the direction X among the EGA parameters. If there is a difference ($\Delta yb-\Delta yd$) between the positional displacements in the direction Y measured at the measuring points 232D and 232B, the difference ($\Delta yb-\Delta yd$) is divided by the distance in the direction X between the two measuring points, thereby obtaining a correction value $\Delta\Theta$ for the rotation $\Theta$ among the EGA parameters. Further, mean values of the positional displacements in the directions X and Y measured at the four measuring points are defined as correction values $\Delta Ox$ and $\Delta Oy$ for the offsets Ox and Oy among the EGA parameters. Similarly, correction values $\Delta Ry$ and $\Delta W$ for the other EGA parameters, that is, the scaling parameter Ry and the perpendicularity W, are also obtained. These correction values are stored in a storage unit in the controller 10B of the middle stepper 1B. It should be noted that, if positional displacements between the corresponding vernier marks are measured with another measuring device, and correction values are obtained by using another computer or the like, the operator inputs the correction values to the controller 10B through an input device. Thus, the third step is terminated.

Thereafter, in a case where exposure is carried out by the mix-and-match method using the fine stepper 1A and the middle stepper 1B, shown in FIG. 18, a critical layer pattern is formed on the wafer 20 by using the fine stepper 1A, and before a middle layer pattern is formed by using the middle stepper 1B, coordinate values of predetermined sample shots in the stage coordinate system are measured, and values of the six EGA parameters in Eq. (1) are determined on the basis of the measured coordinate values. Thereafter, the controller 10B adds the EGA parameter correction values ($\Delta Rx$, $\Delta Ry$, $\Delta\Theta$, $\Delta W$, $\Delta Ox$, and $\Delta Oy$), stored in the above-described third step, to the determined EGA parameters (Rx, Ry, $\Theta$, W, Ox, and Oy) to obtain corrected EGA parameters. Then, the controller 10B calculates coordinate positions of the shot areas of the critical layer by using the corrected EGA parameters, calculates exposure positions of the shot areas of the middle layer on the basis of the coordinate positions of the critical layer shot areas, and sequentially transfers the reticle pattern for the middle layer onto the middle layer shot areas on the basis of the exposure positions.

In this embodiment, the measuring points used in the above-described third step are at the mutually identical positions in the shot areas (reference measurement areas) SFa to SFd, as shown in FIG. 20(*a*). Accordingly, even when the middle layer shot areas SFn have a magnification error or a rotation error, the same offset value is superimposed at each measuring point, and the magnification or rotation error affects only the offsets Ox and Oy among the EGA parameters. Thus, the overlay accuracy between the critical and middle layers improves because the values of other influential linear parameters (Rx, Ry, $\Theta$, and W) are accurate.

In the above-described embodiment, a magnification error or rotation error in the middle layer shot areas affects the offsets Ox and Oy among the EGA parameters. Therefore, the effect of the magnification or rotation error is eliminated by averaging process. The method of eliminating the magnification or rotation error will be explained below with reference to FIGS. 21(*a*) to 23(*b*), in which portions corresponding to those in FIGS. 20(*a*) and 20(*b*) are denoted by the same reference characters.

Figure 21A:
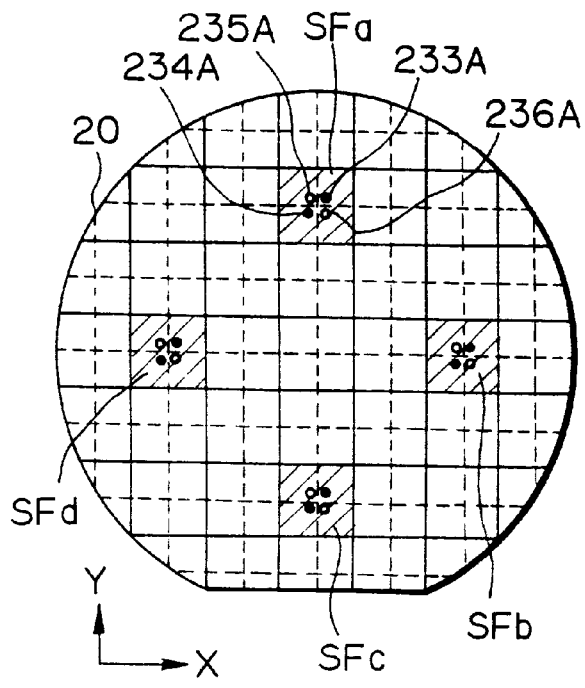
FIGS. 21(a) and 21(b) show another example of the arrangement of measuring points on the wafer.
Figure 21B:
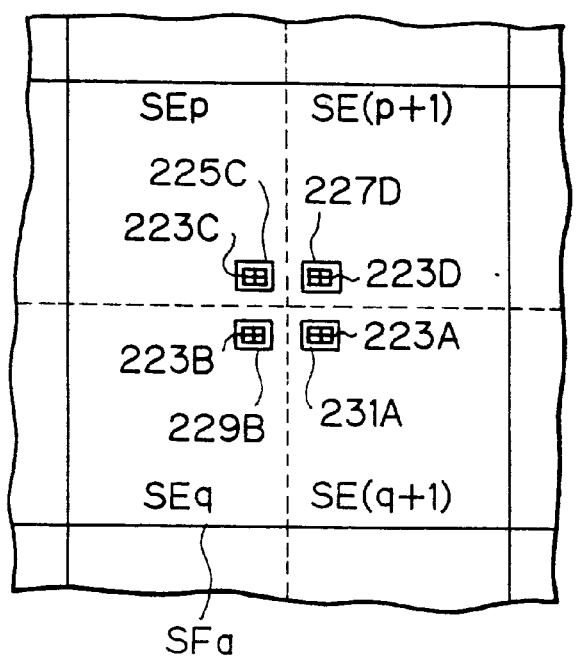

FIG. 21(*a*) shows a first method of arranging measuring points for eliminating an offset error. In FIG. 21(*a*), four middle layer shot areas SFa to SFd are selected as reference measurement areas on the wafer 20 in the same way as in FIG. 20(*a*). Then, an amount of positional displacement between two corresponding vernier marks is measured at each of four measuring points in the shot area SFa, that is, a measuring point 233A at the bottom left in the first quadrant, a measuring point 235A at the bottom right in the second quadrant, a measuring point 234A at the top right in the third quadrant, and a measuring point 236A at the top left in the fourth quadrant. Mean values of the positional displacements in the directions X and Y measured at the four measuring points are assumed to be (Δxa',Δya').

More specifically, FIG. 21(*b*) is an enlarged view of the shot area SFa. As shown in FIG. 21(*b*), an amount of positional displacement between the vernier mark 223D in the shot area SE(p+1) and the middle layer vernier mark 227D is measured at the measuring point 233A, and an amount of positional displacement between the vernier mark 223C in the shot area SEp and the middle layer vernier mark 225C is measured at the measuring point 235A. Similarly, an amount of positional displacement between the vernier mark 223B (or 223A) and the vernier mark 229B (or 231A) is measured at the measuring point 234A (or 236A).

Referring to FIG. 21(*a*), positional displacement is similarly measured in each of the other shot areas SFb to SFd. That is, in each shot area, an amount of positional displacement between the two corresponding vernier marks is similarly measured at each of the four measuring points lying at respective positions mutually identical with the measuring points 233A to 236A in the shot area SFa, and mean values of the measured amounts of positional displacement are determined to be (Δxb',Δyb') to (Δxd',Δyd'). Thereafter, EGA parameter correction values are obtained from the amounts of positional displacement measured in the four shot areas SFa to SFd. In this case, even if the shot area SFa, for example, has a magnification error or rotation error (shot rotation error), the effect of such an error appears symmetrically at the four measuring points 233A to 236A; therefore, the effect of the magnification or rotation error can be eliminated by averaging the amounts of positional displacement at the four measuring points. Accordingly, even if there is a magnification or rotation error, no error will be introduced into the offsets Ox and Oy in the EGA parameters.

Further, the exposure method according to this embodiment provides the following advantageous effects: Since the measuring points 233A to 236A lie in the center of the shot area SFa, the distortion introduced by the projection optical system 3B of the middle stepper 1B is small at the measuring points 233A to 236A, and thus the distortion of the middle layer shot areas produces a minimal effect on the measurement result. Further, in the shot area SFa, for example, measurement is carried out in each of four different corners of the four critical layer shot areas. Therefore, the effects of the magnification or rotation errors in the critical layer shot areas are canceled by the averaging process. Similarly, the effect of the distortion of the critical layer shot areas is reduced by the averaging process.

In this embodiment, it is only necessary to enable measuring points to be symmetrically disposed in each middle layer shot area used as a reference measurement area. Therefore, in FIG. 21(*a*), only two measuring points shown by the black circles may be selected from each of the shot areas SFa to SFd, for example, (i.e. the measuring points 233A and 234A in the shot area SFa). Alternatively, only two measuring points shown by the white circles may be selected from each of the shot areas SFa to SFd (i.e. the measuring points 235A and 236A in the shot area SFa).

Figure 22A:
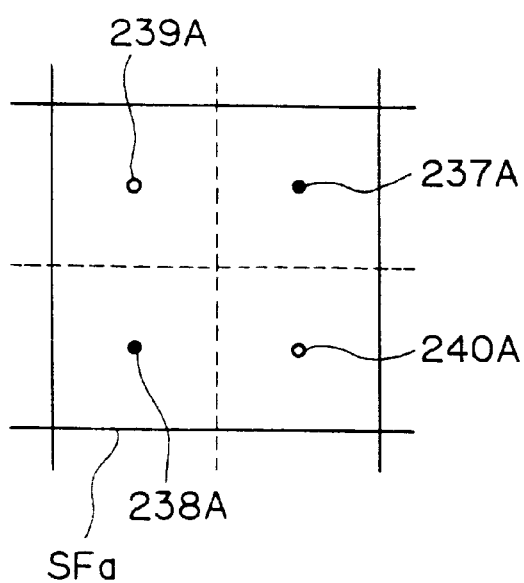
FIG. 22(a) is an enlarged view showing another example of the arrangement of measuring points in a shot area of the middle layer.
Figure 22B:
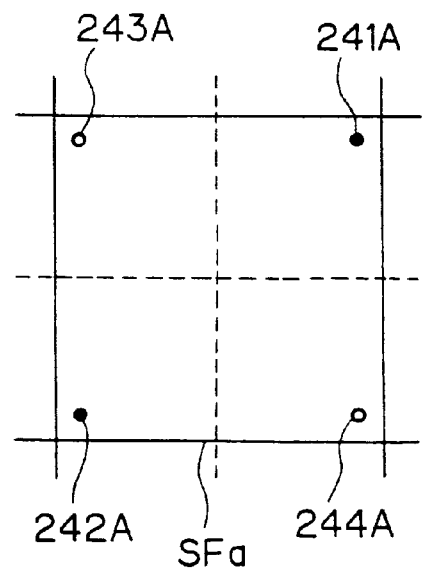
FIG. 22(b) is an enlarged view showing still another example of the arrangement of measuring points in a shot area of the middle layer.

Although in the above-described embodiment the measuring points are concentrated on the center of each of the middle layer shot areas used as reference measurement areas, the arrangement of measuring points is not necessarily limited to it. As shown in FIG. 22(*a*), measuring points 237A to 240A may be set in the respective centers of the four critical layer shot areas in the shot area SFa, for example. It is also possible to select two measuring points 237A and 238A, shown by the black circles, or two measuring points 239A and 240A, shown by the white circles, from among the four measuring points. In this case, the distortion of the critical layer shot areas is minimized, and the effect of the distortion of the middle layer shot areas is reduced by the averaging process.

However, in a case where the distortion of the critical and middle layer shot areas has previously been known to be small, as shown for example in FIG. 22(*b*), four measuring points 241A to 244A in the four corners of the shot area SFa may be selected. Alternatively, only two measuring points 241A and 242A, shown by the black circles, or only two measuring points 243A and 244A, shown by the white circles, may be selected.

Figure 23A:
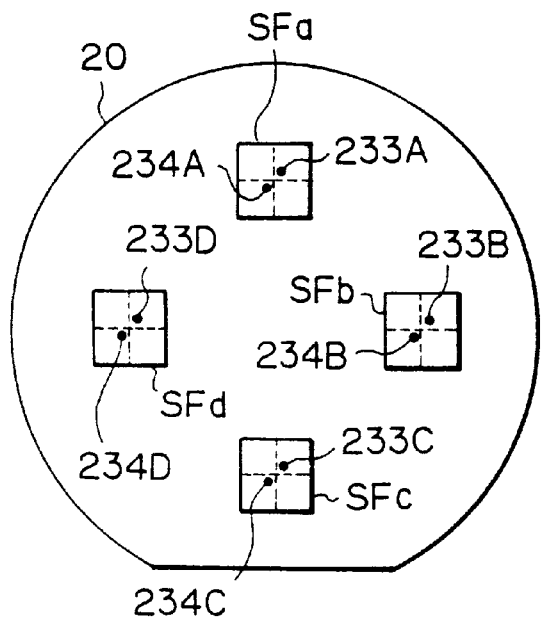
FIGS. 23(a) and 23(b) are plan views each showing one example of a desirable arrangement of measuring points on a wafer.
Figure 23B:
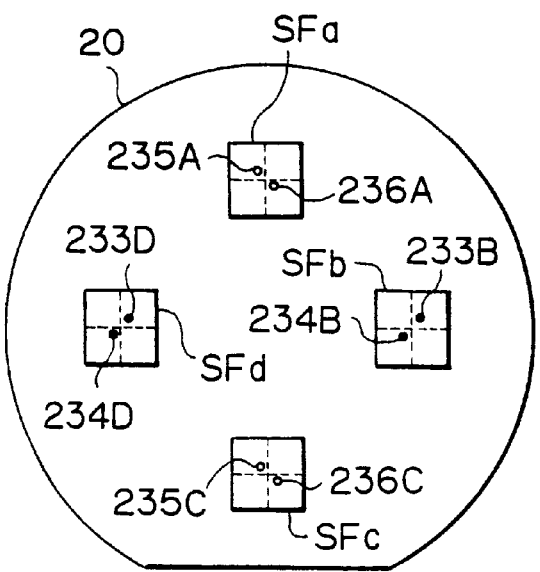

To sum up, an efficient measuring point layout which enables the averaging effect to be obtained and which makes it possible to minimize the number of measuring points and to shorten the time required for measurement is such as that shown, for example, in FIG. 23(*a*) or 23(*b*). In the layout shown in FIG. 23(*a*), measuring points 233A to 233D and 234A to 234D are selected in four shot areas (reference measurement areas) SFa to SFd on the wafer 20. More specifically, the measuring points 233A to 233D are each on the right side of the center of the associated shot area, toward the top as viewed in the figure, and the measuring points 234A to 234D are each on the left side of the center of the associated shot area, toward the bottom as viewed in the figure. In the layout shown in FIG. 23(*b*), measuring points are selected as follows: In a pair of mutually opposing shot areas SFa and SFc among the four shot areas, measuring points 235A and 235C are selected which are each on the left side of the center of the associated shot area, toward the top, and measuring points 236A and 236C are selected which are each on the right side of the center of the associated shot area, toward the bottom; in the other pair of mutually opposing shot areas SFb and SFd, measuring points 233B and 233D are selected which are each on the right side of the center of the associated shot area, toward the top, and measuring points 234B and 234D are selected which are each on the left side of the center of the associated shot area, toward the bottom.

Figure 24A:
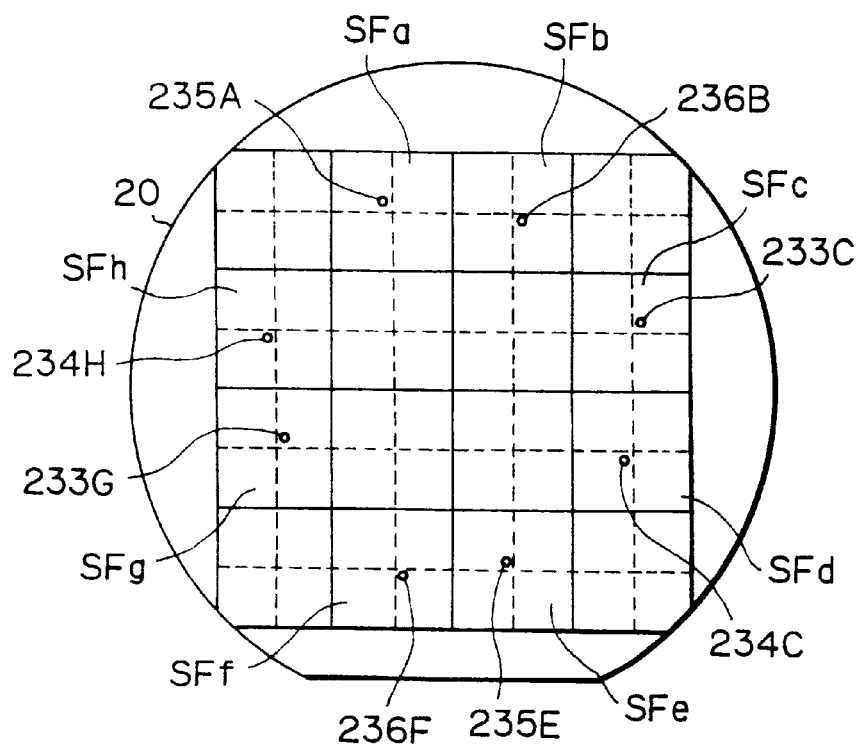
FIGS. 24(a) and 24(b) show one example of an arrangement of measuring points in a case where measuring points are selected from those which are at different positions in a plurality of reference measurement areas on a wafer.
Figure 24B:
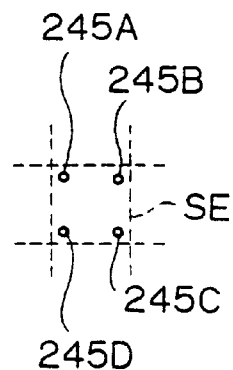

It is also possible to select from each reference measurement area one measuring point which is at a symmetric position with respect to the center of the area, as shown in FIGS. 24(*a*) and 24(*b*). That is, FIG. 24(*a*) shows middle layer shot areas transferred over a critical layer on the wafer 20. From among the shot areas, eight shot areas SFa to SFh, which are substantially uniformly distributed, are selected as reference measurement areas. The shot areas SFa to SFh each contains four critical layer shot areas.

Then, from the two shot areas SFc and SFg, measuring points 233C and 233G are respectively selected which are each on the right side of the center of associated shot area, toward the top, and from the two shot areas SFa and SFe, measuring points 235A and 235E are respectively selected which are each on the left side of the center of the associated shot area, toward the top. From the two shot areas SFd and SFh, measuring points 234C and 234H are respectively selected which are each on the left side of the center of the associated shot area, toward the bottom, and from the other two shot areas SFb and SFf, measuring points 236B and 236F are respectively selected which are each on the right side of the center of the associated shot area, toward the bottom. Then, an amount of positional displacement between the critical and middle layer vernier marks is measured at each of the selected measuring points. In this example, thereafter, the amounts of positional displacement measured at two measuring points which are at symmetric positions in a pair of middle layer shot areas (e.g. the measuring points 235A and 236B) are averaged, thereby reducing the effect of the magnification or rotation error of the middle layer. The effects of the middle layer distortion, the reticle writing error, etc. are also reduced by the averaging process.

Let us consider the measuring method in this example in terms of one critical layer shot area SE, as shown in FIG. 24(*b*). In this example, measurement is carried out twice at each of measuring points 245A to 245D in the four corners of the shot area SE. Therefore, assuming that the magnification or rotation error of the critical layer shot areas is substantially uniform over the wafer, it is possible to reduce the effects of magnification error, rotation error, and distortion of the critical layer shot areas, reticle writing error, etc. by averaging the amounts of positional displacement measured, for example, at a pair of mutually opposing measuring points (e.g. the measuring points 245A and 245C) among the measuring points 245A to 245D in the four corners of the shot area SE.

As has been described above, the third embodiment shows a measuring point layout which is applicable in a case where the size of each middle layer shot area is twice as large as each critical layer shot area in each of the directions X and Y, and where one chip pattern, for example, is formed in each critical layer shot area. In actuality, however, two or more chip patterns may be contained in each critical layer shot area; there are various size ratios of the middle layer shot areas to the critical layer shot areas. Further, projection exposure apparatuses usable in the third embodiment are not necessarily limited to one-shot exposure type projection exposure apparatuses such as steppers; it is also possible to use scanning exposure type projection exposure apparatuses, e.g. step-and-scan type projection exposure apparatuses in which a pattern on a reticle is sequentially transferred onto each shot area on a wafer by synchronously scanning the reticle and the wafer with respect to a projection optical system. Various other modifications of the third embodiment will be explained below with reference to FIGS. 25(*a*) to 27(*b*).

In the modification shown in FIGS. 25(*a*) to 25(*c*), each critical layer shot area SE has, as shown in FIG. 25(*a*), two identical chip patterns 246A and 246B arranged in the direction Y. As shown in FIG. 25(*b*), each middle layer shot area SF has identical chip patterns arranged in two columns in the direction X and four rows in the direction Y. In this case, assuming that each chip pattern is a rectangular pattern having a width b in the direction X and a width a in the direction Y, the width in the direction X of the critical layer shot area SE is b, and the width in the direction Y of the shot area SE is 2*a*. The width in the direction X of the middle layer shot area SF is 2*b*, and the width in the direction Y of the shot area SF is 4*a*. Accordingly, the shot area SF is 2/1 times as large as the shot area SE in each of the directions X and Y. Therefore, as shown in FIG. 25(*c*), a reference measurement area SG, which has a size regarded as being the least common multiple of the sizes of the shot areas SE and SF, has a width 2*b* in the direction X and a width 4*a* in the direction Y. That is, the reference measurement area SG has the same size as that of the middle layer shot area SF. Accordingly, when a measuring point 247, for example, is selected in a certain reference measurement area SG, in the other reference measurement areas also measuring points which are at the identical positions with the measuring point 247 are selected. By doing so, EGA parameter correction values can be accurately obtained.

However, in order to reduce the effect of the magnification error, rotation error, etc. of the middle layer shot areas, it is desirable to select, for example, measuring points which are in symmetric relation to the measuring point 247 with respect to the center position in the reference measurement areas in the same way as in the above-described third embodiment. The same is true of the following modifications.

In the modification shown in FIGS. 26(*a*) to 26(*c*), a critical layer shot area SE has, as shown in FIG. 26(*a*), two identical chip patterns arranged in the direction Y. As shown in FIG. 26(*b*), a middle layer shot area SH has three identical chip patterns arranged in the direction Y. Further, the middle layer projection exposure apparatus is of the scanning exposure type. Thus, the shot area SH is exposed by scanning the wafer with respect to a slit-shaped exposure area 248.

At this time, assuming that the critical layer shot area SE has a width b in the direction X and a width 2*a* in the direction Y, the width in the direction X of the middle layer shot area SH is b, and the width in the direction Y of the shot area SH is 3*a*. Accordingly, the shot area SH is ½ time as large as the shot area SE in the direction X, and the former is 3/2 times as large as the latter in the direction Y. Therefore, as shown in FIG. 26(*c*), a reference measurement area SI, which has a size regarded as being the least common multiple of the sizes of the shot areas SE and SH, has a width b in the direction X and a width 6*a* in the direction Y. In this modification also, when a measuring point 249, for example, is selected in a certain reference measurement area SI, in the other reference measurement areas also measuring points which are at the identical positions with the measuring point 249 are selected. By doing so, EGA parameter correction values can be accurately obtained.

In this regard, FIG. 27(*a*) shows an enlarged view of one example of the reference measurement area SI, shown in FIG. 26(*c*). In FIG. 27(*a*), a pair of adjacent shot areas SH1 and SH2 exposed by the scanning exposure method contain three critical layer shot areas SE1, SE2 and SE3. FIG. 27(*b*) shows an expansion and contraction quantity $\Delta Y$ in the longitudinal direction (direction Y) in the shot areas SH1 and SH2, shown in FIG. 27(*a*), due to a magnification error. The expansion and contraction quantity $\Delta Y$ in the direction Y changes at a period which is equal to the length of each of the shot areas SH1 and SH2. Accordingly, if the centers of the critical layer shot areas SE1 to SE3 are defined as measuring points 250A to 250C, for example, the expansion and contraction quantities of the middle layer shot areas measured at the measuring points 250A to 250C show different values as shown by the positions 251A to 251C in FIG. 27(*b*). Accordingly, if a given measuring point 249 is selected in a certain reference measurement area SI in FIG. 26(*c*), the measurement result is affected by the magnification error of the middle layer shot areas unless measuring points are selected at the identical positions with the measuring point 249 in the other reference measurement areas.

In the modification shown in FIGS. 28(*a*) to 28(*c*), a critical layer shot area SF has, as shown in FIG. 28(*a*), identical chip patterns arranged in three rows in the direction Y and two columns in the direction X. As shown in FIG. 28(*b*), a middle layer shot area SH exposed by the scanning exposure method has three identical chip patterns arranged in the direction Y. In this case, assuming that the width in the direction X of the critical layer shot area SF is 2*b*, and the width in the direction Y of the shot area SF is 3*a*, the width in the direction X of the middle layer shot area SH is b, and the width in the direction Y of the shot area SH is 3*a*. Accordingly, as shown in FIG. 28(*c*), a reference measurement area SJ, which has a size regarded as being the least common multiple of the sizes of the shot areas SF and SH, has a width $2b$ in the direction X and a width $3a$ in the direction Y. That is, the reference measurement area SJ has the same size as that of the critical layer shot area SF. In this modification also, when a measuring point 252, for example, is selected in a certain reference measurement area SJ, in the other reference measurement areas also measuring points which are at the identical positions with the measuring point 252 are selected. By doing so, EGA parameter correction values can be accurately obtained.

Although in the above-described third embodiment and modifications thereof a combination of two steppers or a combination of a stepper and a step-and-scan type projection exposure apparatus is used, it should be noted that a combination of usable projection exposure apparatuses is not necessarily limited to the above. For example, it is also possible to use two different step-and-scan type projection exposure apparatuses as an exposure apparatus having a small exposure field and an exposure apparatus having a large exposure field.

According to the exposure method in the third embodiment, an area which is so large as to contain an integer number of first and second exposure fields in each of two directions (i.e. an area having a size regarded as being the least common multiple of the sizes of the first and second exposure fields) is defined as a reference measurement area, and an amount-of positional displacement between two corresponding overlay accuracy measuring marks (i.e. vernier marks) is measured at each of measuring points lying at the mutually identical positions in a predetermined number of reference measurement areas. Therefore, there is no possibility that the effect of a magnification or rotation error, for example, of the second mask pattern will appear as a linear expansion and contraction error or rotation error in alignment errors which may arise during the exposure of the second mask pattern. Accordingly, it is possible to increase the overlay accuracy between a critical layer pattern and a middle layer pattern in a case where exposure is carried out by the mix-and-match method with respect to a substrate where a critical layer and a middle layer are mixedly present.

In a case where the second exposure apparatus calculates an exposure position by using coordinate transformation parameters and obtains correction values for the parameters from results of measurement carried out for each reference measurement area, the overlay accuracy can be increased because a magnification or rotation error of the second mask pattern has no effect on parameters indicating linear expansion and contraction, rotation and perpendicularity among the coordinate transformation parameters.

Regarding offset parameters, the effect of a magnification or rotation error of the second mask pattern can be reduced, for example, by using mean values of results of measurement carried out at measuring points disposed symmetrically with respect to the center point in the reference measurement areas.

Next, one example of a fourth embodiment of the exposure method according to the present invention will be described with reference to FIGS. 29 to 32. Two exposure apparatuses used in this example are a one-shot exposure type projection exposure apparatus (stepper) with a demagnification ratio of 5:1 and a step-and-scan type projection exposure apparatus with a demagnification ratio of 4:1. In this example, two chip patterns are formed in each shot area exposed by the former projection exposure apparatus (i.e. a two-chip reticle is used), and three chip patterns are formed in each shot area scan-exposed by the latter projection exposure apparatus (i.e. a three-chip reticle is used). It should be noted that constituent elements in this example which are similar to those in the first to third embodiments are denoted by the same reference characters and will be briefly explained below.

Figure 29:
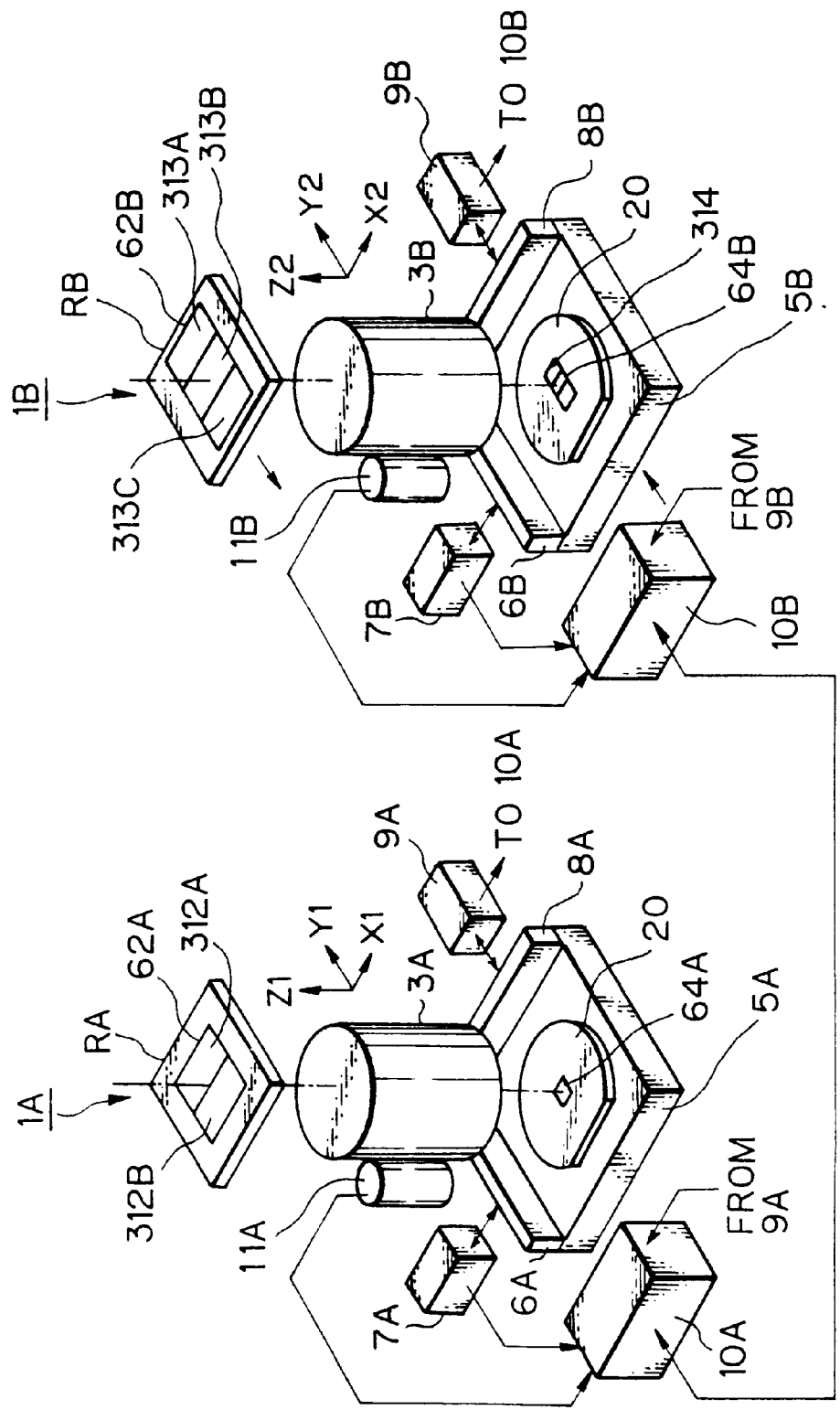
FIG. 29 is a perspective view schematically showing an exposure system used in a fourth embodiment of the exposure method according to the present invention.

FIG. 29 shows an exposure system used in this embodiment. In FIG. 29, a one-shot exposure type projection exposure apparatus (hereinafter referred to as "fine stepper") 1A, and a step-and-scan type projection exposure apparatus (hereinafter referred to as "scanning exposure apparatus") 1B are installed. In this embodiment, the fine stepper 1A is a high-resolution exposure apparatus, while the scanning exposure apparatus 1B is a low-resolution exposure apparatus. The fine stepper 1A is used to carry out exposure for a critical layer on a wafer, and the scanning exposure apparatus 1B is used to carry out exposure for a middle layer on the wafer.

First, in the fine stepper 1A, a pattern area 62A on a reticle RA is illuminated by exposure light from an illumination optical system (not shown), and an image of a pattern formed in the pattern area 62A is formed on a rectangular exposure field 64A on a wafer 20 as a projected image reduced to ⅕ by a projection optical system 3A. A Z1-axis is taken in a direction parallel to an optical axis of the projection optical system 3A, and two axes of an orthogonal coordinate system set in a plane perpendicular to the Z1-axis are defined as an X1-axis and a Y1-axis, respectively. The pattern area 62A on the reticle RA is divided into partial pattern areas 312A and 312B of the same size in the direction Y1. The partial pattern areas 312A and 312B each has original drawing patterns of alignment marks and overlay accuracy measuring marks (vernier marks) written according to the same layout.

A wafer stage 5A comprises a Z-stage, an XY-stage, etc. The coordinate in the direction X1 of the wafer stage 5A is measured by a combination of a moving mirror 6A and a laser interferometer 7A. The coordinate in the direction Y1 of the wafer stage 5A is measured by a combination of a moving mirror 8A and a laser interferometer 9A. The coordinates measured by the laser interferometers 7A and 9A are supplied to a controller 10A which controls operations of the whole apparatus. The controller 10A drives the wafer stage 5A to step, thereby positioning the wafer 20. The stepping drive of the wafer 20 is effected according to a shot map for a critical layer. The shot map is generated by a map generating unit which comprises a computer in the controller 10A.

An off-axis imaging type (FIA type) alignment system 11A images an alignment mark (wafer mark) on the wafer 20 to detect X1 and Y1 coordinates of the mark. The detected coordinates are supplied to the controller 10A.

Next, in the scanning exposure apparatus 1B in this example, a part of a pattern area 62B on a reticle RB is illuminated by exposure light from an illumination optical system (not shown), and an image of a part of the reticle pattern is formed in a slit-shaped exposure area 314 on a wafer 20, which is held on a wafer stage 5B, as a projected image reduced to ¼ by a projection optical system 3B. The reticle RB is scanned in the direction −Y2 (or +Y2), and the wafer 20 is scanned in the direction +Y2 (or −Y2) in synchronism with the scanning of the reticle RB, thereby sequentially projecting an image of the pattern formed in the pattern area 62B of the reticle RB onto the exposure field 64B on the wafer 20.

The pattern area 62B of the reticle RB is divided into three partial pattern areas 313A to 313C of the same size in the direction Y2, which is the scanning direction. The size of the exposure field 64B is such that its dimension in the scanning direction is 3/2 times the dimension of the exposure field 64A of the fine stepper 1A, and the exposure field 64B is equal in size (1:1) to the exposure field 64A in the non-scanning direction. The partial pattern areas 313A to 313C also each has original drawing patterns of vernier marks formed according to the same layout.

The position of a reticle stage (not shown) for scanning the reticle RB of the scanning exposure apparatus 1B and the X2 and Y2 coordinates of the wafer stage 5B are supplied to a controller 10B. The controller 10B controls synchronous drive of the reticle stage (not shown) and the wafer stage 5B. The scanning exposure operation of the wafer stage 5B is effected according to a shot map for a middle layer set on an exposure surface of the wafer 20, which is to be exposed. The shot map is generated by a map generating unit which comprises a computer in the controller 10B.

In this case, the map generating unit in the controller 10A and the map generating unit in the controller 10B have the function of supplying shot map information prepared thereby to each other.

The scanning exposure apparatus 1B also has an off-axis imaging type (FIA type) alignment system 11B provided at a side surface of the projection optical system 3B. The alignment system 11B detects X2 and Y2 coordinates of a wafer mark or vernier mark on the wafer 20.

Next, one example of an operation of correcting in-shot parameters (i.e. shot magnifications rx and ry, shot rotation θ, and shot perpendicularity w) when exposure of the pattern for the middle layer is to be effected by the scanning exposure apparatus 1B after exposure of the pattern for the critical layer has been carried out by the fine stepper 1A in this example will be explained for each of the first to third processing steps.

First, the first step will be explained.

In the first step, an unexposed wafer 20 coated with a photoresist is placed on the wafer stage 5A of the fine stepper 1A, shown in FIG. 29, and a reduced image of the pattern on the reticle RA is sequentially transferred by the step-and-repeat method onto a multiplicity of shot areas arrayed on the wafer 20 in units of the exposure field 64A. The reticle RA has original drawing patterns of two sets of vernier marks formed according to a predetermined layout in addition to two pairs of alignment marks. Thereafter, the wafer 20 is subjected to development, thereby allowing the two pairs of alignment marks to appear as wafer marks comprising recess-and-projection patterns, and also allowing the two sets of vernier mark original drawing patterns to appear as vernier marks comprising recess-and-projection patterns. The patterns obtained after the development can be regarded as critical layer patterns on the wafer 20. However, it is also possible to carry out the following alignment and measurement of an amount of positional displacement between two corresponding vernier marks with these marks left in the form of latent images without effecting development.

Next, the second step will be explained.

A photoresist is coated over the wafer 20 having the wafer and vernier marks formed in the first step, and the photoresist-coated wafer 20 is placed on the wafer stage 5B of the scanning exposure apparatus 1B, shown in FIG. 29. At this time, information concerning the critical layer shot map used in the first step has been supplied from the controller 10A of the fine stepper 1A to the controller 10B of the scanning exposure apparatus 1B. Thus, the controller 10B can obtain design array coordinates of the critical layer wafer and vernier marks on the wafer 20.

Figure 30A:
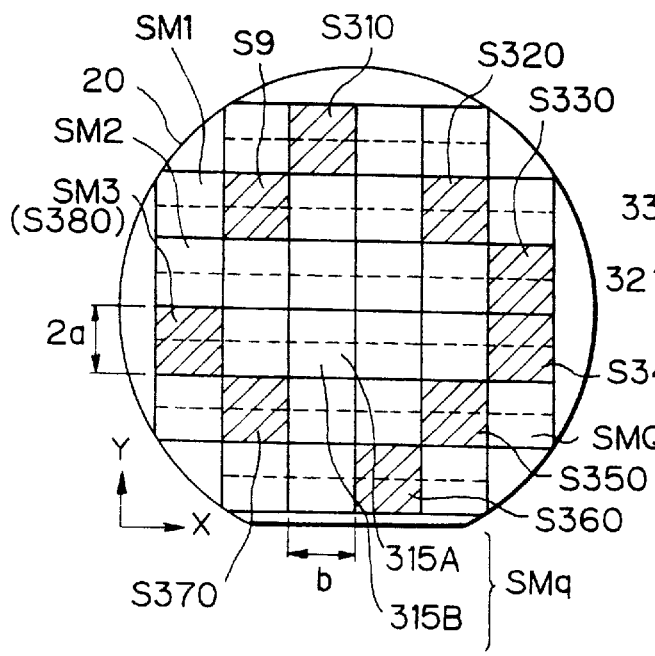
FIG. 30(a) is a plan view showing a shot array of a critical layer on a wafer in the fourth embodiment of the present invention.

FIG. 30(a) shows the wafer 20 placed on the wafer stage 5B. In FIG. 30(a), the X2- and Y2-axes of the scanning exposure apparatus 1B are shown as being X- and Y-axes, respectively. In this case, the wafer 20 has been roughly aligned by a pre-alignment mechanism (not shown), and the surface of the wafer 20 has been divided into Q (Q=32 in FIG. 30(a)) critical layer shot areas SM1, SM2, . . . , SMQ in two directions which are approximately parallel to the directions X and Y, respectively. In actual practice, a scribe line area of a predetermined width lies between shot areas SMq (q=1 to 0); however, illustration of the scribe line area is omitted in FIG. 30(a). The width (pitch) in the direction X of each shot area SMq, including the scribe line area, is b, and the width (pitch) in the direction Y is 2a. In this embodiment, each shot area SMq is approximately square ($2a \approx b$). Further, each shot area SMq is divided into two partial shot areas of the same shape in the direction Y, that is, first and second partial areas 315A and 315B, in which circuit patterns identical with each other are to be formed.

Figure 30B:
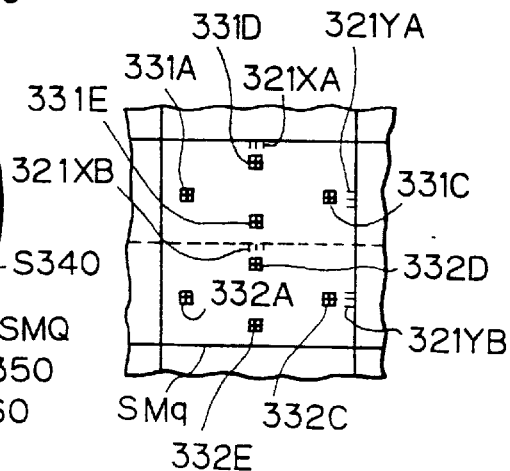
FIG. 30(b) is an enlarged plan view showing an arrangement of vernier marks in a shot area of the critical layer shown in FIG. 30(a).

FIG. 30(b) shows a shot area SMq as a typical example of the critical layer shot areas. In FIG. 30(b), the first partial shot area in the shot area SMq is provided with a pair of wafer marks 321XA and 321YA for the X- and Y-axes, and also one set of four vernier marks 331A, 331C, 331D and 331E which are distributed in a cross shape. Similarly, the second partial shot area in the shot area SMq is provided with a pair of wafer marks 321XB and 321YB and four vernier marks 332A, 332C, 332D and 332E in symmetric relation to the marks in the first partial shot area. In this case, the original drawing patterns of marks distributed as shown in FIG. 30(b) have been formed in the pattern area 62A of the reticle RA in the fine stepper 1A, shown in FIG. 29.

It should be noted that the wafer marks 321XA to 321YA, etc. used in this example are one-dimensional line-and-space patterns which are detected by an imaging detection method with the alignment system 11B, shown in FIG. 29. The vernier marks 331A to 331E, etc. are two-dimensional box-in-box marks which are detected by an imaging detection method with the alignment system 11B. However, it is possible to use other kinds of mark as vernier marks, for example, marks each formed by a combination of two one-dimensional line-and-space patterns which are crossed at right angles. It is also possible to use the wafer marks 321XA, 321YA, etc. themselves as vernier marks. Conversely, vernier marks may be used as wafer marks. In this embodiment, a part of the vernier marks 331A to 331E and 332A to 332E are used as multipoint wafer marks (alignment marks) in the shot area SMq as one example. Further, marks which are detected by the laser step alignment (LSA) method, for example, may also be used as vernier marks. The distribution of wafer and vernier marks is not necessarily limited to that shown in FIG. 30(b).

Next, the controller 10B of the scanning exposure apparatus 1B, shown in FIG. 29, effects alignment by the EGA method. Accordingly, the controller 10B drives the wafer stage 5B to move the field of view of the alignment system 11B sequentially according to the critical layer shot map, thereby measuring array coordinates in a stage coordinate system (i.e. a coordinate system determined by values measured with the laser interferometers 7B and 9B of the scanning exposure apparatus 1B) of each of the wafer marks 321XA and 321YA attached to nine (for example) shot areas (sample shots) S310, S320, . . . , S390 selected from among the shot areas on the wafer 20, as shown in FIG. 30(a). Then, values of six EGA parameters (scaling parameters Rx and Ry, wafer rotation Θ, shot perpendicularity W, and offsets Ox and Oy) on the wafer 20 are determined so as to minimize the residual error component, which is the sum of the squares of deviations of the measured values of the wafer marks 321XA and 321YA of each sample shot from array coordinate values calculated from the design array coordinates of the wafer marks 321XA and 321YA.

Next, the controller 10B determines array coordinate values of each shot area SMq (q=1 to Q) in the stage coordinate system from the six EGA parameters and the design array coordinate values of the critical layer shot area SMq. In this case, the exposure field 64B of the scanning exposure apparatus 1B is equal in size (1:1) to the exposure field 64A of the fine stepper 1A in the direction X but 3/2times as large as the exposure field 64A in the direction Y. Therefore, the controller 10B divides perfect partial shot areas (with no missing part) in the shot areas SMq (q=1 to Q), shown in FIG. 30($a$), into a plurality of blocks each comprising one partial shot area in the direction X and three partial shot areas in the direction Y, each block containing at least one shot area SMq. Then, the controller 10B obtains array coordinates of the center of each block in the stage coordinate system from the computational array coordinates of the shot area SMq contained in the block. Thus, an array (shot map) of middle layer shot areas is determined.

Figure 31A:
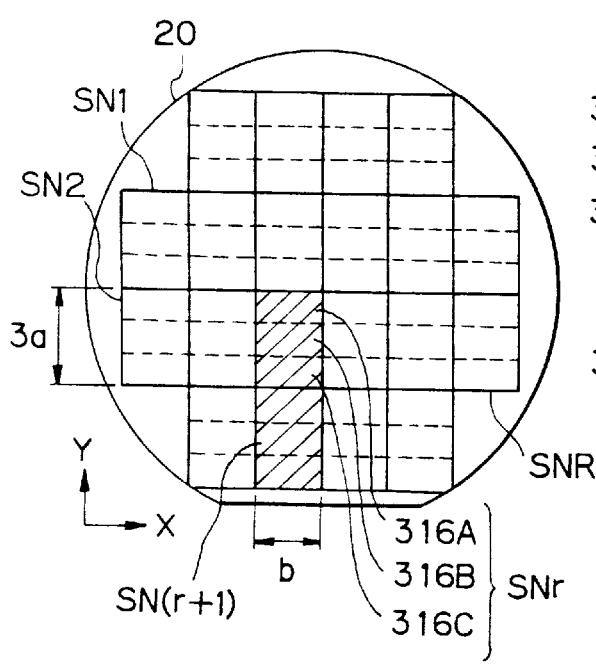
FIG. 31(a) is a plan view showing a shot array of a middle layer exposed over the critical layer shown in FIG. 30(a).
Figure 31B:
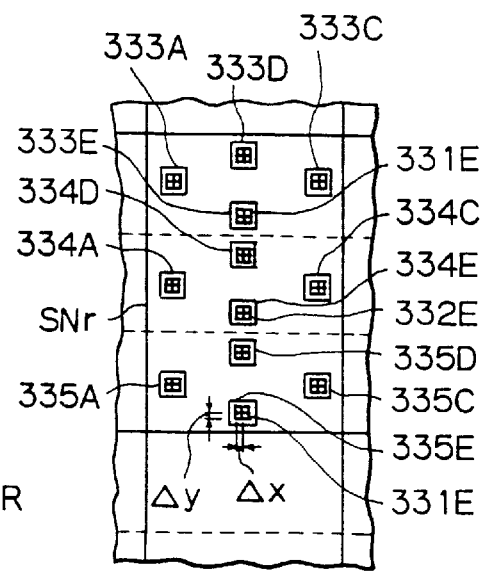
FIG. 31(b) is an enlarged plan view showing vernier mark arrangements on two layers in a shot area of the middle layer shown in FIG. 31(a).

For example, in the shot map for the middle layer to be exposed by the scanning exposure apparatus 1B, as shown in FIG. 31($a$), R (R=20 in FIG. 31($a$)) shot areas SN1, SN2, . . . , SNR are arranged in the directions X and Y over the critical layer on the wafer 20. The width (pitch) in the direction X of each shot area SNr (r=1 to R), including the scribe line area, is b, and the width (pitch) in the direction Y is 3a. Accordingly, assuming that the size of the middle layer shot area SNr in the direction X is $M_1/N_1$ times as large as that of the critical layer shot area SMq, and the size of the shot area SNr in the direction Y is $M_2/N_2$ times as large as that of the shot area SMq, the size ratios in this embodiment are $M_1/N_1=1/1$ and $M_2/N_2=3/2$. Further, each shot area SNr is divided into three partial shot areas 316A to 316C of the same size in the direction Y (i.e. the scanning direction). The three partial shot areas 316A to 316C are to be formed with identical patterns.

In this embodiment, it is assumed that six EGA parameters (Rx, Ry, Θ, W, Ox, and Oy) have no error, but four in-shot parameters (shot magnifications rx and ry, shot rotation θ, and shot perpendicularity w) have errors. Therefore, overlay exposure is carried out in order to obtain errors (correction values) of these in-shot parameters.

That is, the scanning exposure apparatus 1B sequentially transfers an image of the vernier mark original drawing patterns formed on the reticle RB onto each of the middle layer shot areas SNr, shown in FIG. 31($a$), by the scanning exposure method. Prior to the exposure process, the projection magnification and scanning speed of the projection optical system 3B have been adjusted according to the calculated shot magnifications rx and ry, and the reticle RB has been rotated according to the shot rotation θ. Further, the scanning direction has been adjusted according to the shot perpendicularity w. Thus, the middle layer chip pattern has previously been aligned with respect to the critical layer chip pattern. After the exposure process, development is carried out, thereby allowing middle layer vernier marks to appear over the critical layer vernier marks on the wafer 20. It should be noted that the following measurement may be carried out with the transferred marks left in the form of latent images, as has already been described above.

Next, the third step will be explained.

In the third step, measurement is carried out to determine amounts of positional displacement between the corresponding vernier marks in the critical layer shot areas SMq, shown in FIG. 30($a$), and the middle layer shot areas SNr, shown in FIG. 31($a$). For this purpose, the wafer 20, shown in FIG. 31($a$), which has been subjected to the development in the second step, is placed, for example, on the wafer stage 5B of the scanning exposure apparatus 1B, shown in FIG. 29, and amounts of positional displacement between the corresponding vernier marks on the two layers are measured by the alignment system 11B. However, the measurement of positional displacement between the corresponding vernier marks may be carried out by using another measuring device of high accuracy.

In this case, it is assumed that, as shown in FIGS. 30($a$) and 31($a$), the +Y direction end of the array of the critical layer shot areas SMq is coincident with the +Y direction end of the array of the middle layer shot areas SNr. The shot areas SN1 to SNR of the middle layer M are each provided with 12 (=4×3) vernier marks respectively corresponding to the vernier marks in the critical layer shot areas SMq (each having 8 vernier marks).

FIG. 31($b$) shows a middle layer shot area SNr. In FIG. 31($b$), the first partial shot area in the shot area SNr has four vernier marks 333A to 333E formed so as to surround the critical layer vernier marks 331A to 331E (see FIG. 30($b$)), respectively. Similarly, the second and third partial shot areas in the shot area SNr have four vernier marks 334A to 334E and four vernier marks 335A to 335E, respectively, formed so as to surround the corresponding critical layer vernier marks. In this example, it is assumed, for example, that the middle layer vernier mark 335E is displaced by Δx and Δy in the directions X and Y relative to the vernier mark 331E in a predetermined critical layer shot area due to errors of the four in-shot parameters (rx, ry, θ, and w). Accordingly, errors (correction values) of the in-shot parameters are obtained by detecting amounts of positional displacement between the corresponding vernier marks on the two layers at predetermined measuring points.

A method of setting measuring points in two shot areas SNr and SN(r+1) which are contiguous with each other in the direction Y, as shown for example by the hatching in FIG. 31($a$), will be explained below with reference to FIG. 32.

Figure 32:
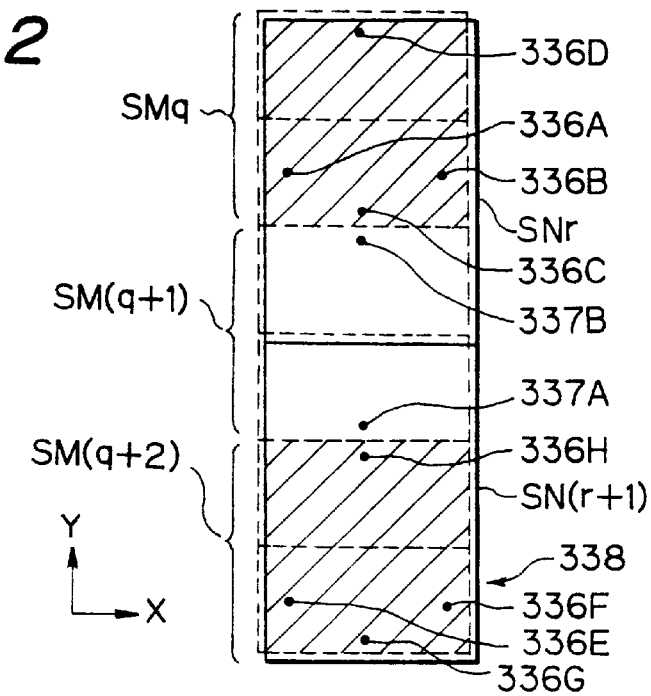
FIG. 32 is an enlarged plan view showing one example of reference measurement areas and measuring points set on the wafer shown in FIG. 31(a).

Referring to FIG. 32, areas in each of which one of the middle layer shot areas SNr and SN(r+1) and one of the critical layer shot areas SMq, SM(q+1) and SM(q+2) are perfectly overlaid on one another such that neither of the overlaid shot areas extends over a plurality of middle or critical layer shot areas, that is, two hatched shot areas SMq and SM(q+2), are defined as reference measurement areas, and four measuring points 336A to 336D are set in the first reference measurement area SMq. Similarly, four measuring points 336E to 336H are set in the second reference measurement area SM(q+2) at respective positions corresponding to the measuring points 336A to 336D.

At the measuring point 336A, amounts of positional displacement in the directions X and Y between the critical layer vernier mark 332A and the middle layer vernier mark 334A are measured. Similarly, amounts of positional displacement between the corresponding vernier marks of the two layers at each of the other measuring points 336B to 336D and 336E to 336H. It should be noted that other areas in FIG. 31($a$) where any one of the critical layer shot areas and any one of the middle layer shot areas are perfectly overlaid on one another such that neither of the overlaid shot areas extends over a plurality of middle or critical layer shot areas may be used as reference measurement areas in addition to the above.

Next, one example of a method obtaining errors of the four in-shot parameters from the results of the measurement of amounts of positional displacement between two corresponding vernier marks at each of the measuring points will be explained. Here, amounts of positional displacement between the two corresponding vernier marks measured at two measuring points 336A and 336B, which are apart from each other in the direction X in the first reference measurement area SMq, are denoted by (Δxa,Δya) and (Δxb,Δyb), and amounts of positional displacement between the two corresponding vernier marks measured at two measuring points 336C and 336D, which are apart from each other in the direction Y, are denoted by (Δxc,Δyc) and (Δxd,Δyd). In this case, an error Δrx of the X direction shot magnification rx is obtained from the difference between the amounts of positional displacement Δxa and Δxb, and an error Δry of the Y direction shot magnification ry is obtained from the difference between the amounts of positional displacement Δyc and Δyd. An error Δθ of the shot rotation θ is obtained from the difference between the amounts of positional displacement Δya and Δyb. Further, an error Δw of the shot perpendicularity w is obtained from the difference between the amounts of positional displacement Δxc and Δxd and the shot rotation error Δθ.

Further, mean values of in-shot parameter errors Δrx, Δry, Δθ and Δw, obtained in the other reference measurement areas, are determined, and these mean values are stored in the storage unit in the controller 10B of the scanning exposure apparatus 1B as correction values Δrx', Δry', Δθ' and Δw' for the in-shot parameters. In this embodiment, none of the reference measurement areas extend over two shot areas on either of the critical and middle layers. Therefore, the in-shot parameter correction values obtained as described above are accurate values which have got rid of the effects of the stepping errors at the critical and middle layers.

In this regard, let us consider a case where, in FIG. 32, the central shot area SM(q+1), which extends over the two shot areas SNr and SN(r+1), is used as a reference measurement area, and measuring points 337B and 337A are set in the two shot areas SNr and SN(r+1) within the reference measurement area. In this case, amounts of positional displacement between the two corresponding vernier marks measured at the two measuring points 337B and 337A contain the middle layer stepping error independently of each other. Therefore, even when an error of the shot magnification ry in the direction Y, for example, is calculated from the sum of the amounts of positional displacement measured at the two points 337B and 337A, the calculated error contains the stepping error. In other words, even if a reference measurement area extends over a plurality of shot areas of either layer, if a plurality of measuring points in the reference measurement area are set so that the distribution of the measuring points does not extend over a plurality of shot areas, the mixing of the stepping error can be prevented. In a case where amounts of positional displacement between the corresponding vernier marks are measured by another measuring device, and correction values for the in-shot parameters are determined by another computer, for example, the operator inputs the correction values to the controller 10B through an input unit or by on-line communication from that computer. Thus, the third step is terminated.

In a case where exposure is carried out by the mix-and-match method using the fine stepper 1A and the scanning exposure apparatus 1B, shown in FIG. 29, after the above-described third step, first, a critical layer pattern is formed on the wafer 20 by using the fine stepper 1A. Thereafter, before exposure for a middle layer pattern is carried out by using the scanning exposure apparatus 1B, coordinate positions of a multiplicity of wafer marks in predetermined sample shots are measured, and values of six wafer EGA parameters and four in-shot parameters are determined from the result of the measurement. Thereafter, the controller 10B adds the correction values (Δrx', Δry', Δθ', and Δw'), stored in the above-described third step, to the determined in-shot parameters (rx, ry, θ, and w), thereby obtaining corrected in-shot parameters. Then, the controller 10B calculates the coordinate position of each shot area of the critical layer by using the six wafer EGA parameters, calculates the exposure position for each shot area of the middle layer on the basis of the calculated coordinate positions, and sequentially effects positioning (e.g. setting of the scanning start position) of the middle layer shot areas on the basis of the calculated exposure positions. Then, the scanning exposure apparatus 1B transfers an image of the reticle pattern onto each shot area by the scanning exposure method while correcting the image-formation characteristics according to the corrected in-shot parameter values. In this embodiment, the corrected in-shot parameter values are accurate; therefore, the overlay accuracy between the critical and middle layers is higher than in the conventional exposure process.

Figures 33A, 33B, 33C:
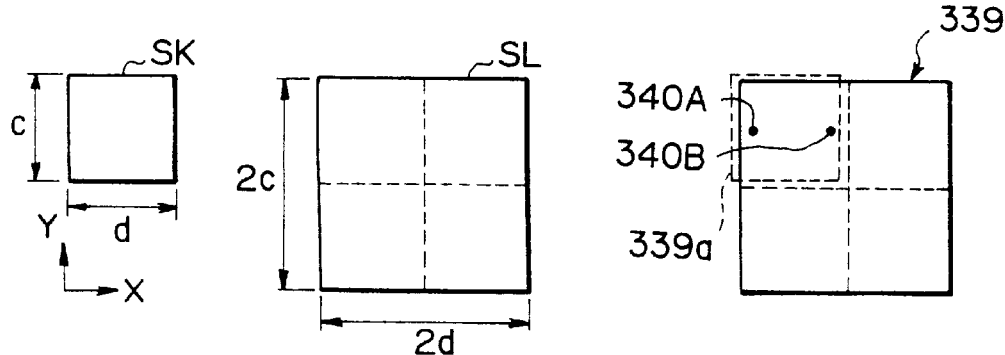
FIGS. 33(a), 33(b) and 33(c) show the way in which reference measurement areas are determined in a case where a middle layer shot area is twice as large as a critical layer shot area in each of directions X and Y.

Next, other examples of the fourth embodiment of the present invention will be explained with reference to FIGS. 33(a) to 34(c). In the example shown in FIGS. 33(a) to 33(c), a critical layer shot area SK shown in FIG. 33(a) is allotted one chip pattern, and a middle layer shot area SL shown in FIG. 33(b) is allotted a total of four identical chip patterns arranged in an array of two columns in the direction X and two rows in the direction Y. The exposure apparatus for the critical layer is a one-shot exposure type projection exposure apparatus (stepper) having a demagnification ratio of 5:1, and the exposure apparatus for the middle layer is a stepper having a demagnification ratio of 2.5:1.

Assuming that the width in the direction X of the critical layer shot area SK is d, and the width in the direction Y of the shot area SK is c, the width in the direction X of the middle layer shot area SL is 2d, and the width in the direction Y of the shot area SL is 2c. Therefore, the shot area SL is twice as large as the shot area SK in each of the directions X and Y. Accordingly, as shown in FIG. 33(c), in an area 339 where an array of four critical layer shot areas and one middle layer shot area are overlaid on one another, an area where a shot area SK and a shot area SL are overlaid on one another without extending over a plurality of critical or middle layer shot areas, that is, each critical layer shot area SK itself, is used as a reference measurement area. Therefore, two measuring points 340A and 340B are set in one reference measurement area 339a, for example, and an amount of positional displacement between the corresponding vernier marks of the two layers is measured at each of the measuring points 340A and 340B. By doing so, correction values for in-shot parameters, e.g. the shot magnification rx and the shot rotation θ, can be accurately obtained.

Figures 34A, 34B, 34C:
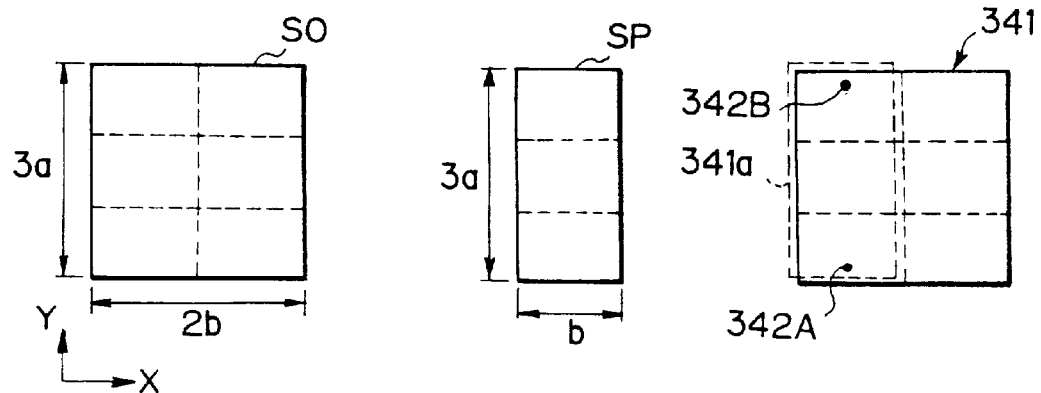
FIGS. 34(a), 34(b) and 34(c) show the way in which reference measurement areas are determined in a case where first-layer shot areas are exposed by a one-shot exposure method, while second-layer shot areas are exposed by a scanning exposure method, and the first-layer shot areas are wider than the second-layer shot areas.

In the example shown in FIGS. 34(a) to 34(c), a first-layer shot area SO shown in FIG. 34(a) is allotted a total of six identical chip patterns arranged in an array of two columns in the direction X and three rows in the direction Y, and a second-layer shot area SP shown in FIG. 34(b) is allotted three identical chip patterns arranged in the direction Y. The exposure apparatus for the first layer comprising the shot areas SO is a stepper, and the exposure apparatus for the second layer comprising the shot areas SP is a step-and-scan type projection exposure apparatus.

Assuming that the width in the direction X of the shot area SO is 2b, and the width in the direction Y of the shot area SO is 3a, the width in the direction X of the shot area SP is b, and the width in the direction Y of the shot area SP is 3a. That is, the shot area SP is ½ times as large as the shot area SO in the direction X, and the former is equal in size (1:1) to the latter in the direction Y. According, as shown in FIG. 34(c), in an area 341 where one first-layer shot area and two second-layer shot areas are overlaid on one another, an area where a shot area SO and a shot area SP are overlaid on one another without extending over a plurality of first- or second-layer shot areas, that is, each second-layer shot area SP itself, is used as a reference measurement area. Therefore, two measuring points 342A and 342B are set in one reference measurement area 341a, for example, and an amount of positional displacement between the corresponding vernier marks of the two layers at each of the measuring points 342A and 342B. By doing so, a correction value for an in-shot parameter, e.g. the shot magnification ry, can be accurately obtained.

Although in the above-described embodiment a combination of two steppers or a combination of a stepper and a step-and-scan type projection exposure apparatus is used, it should be noted that the combination of exposure apparatuses is not necessarily limited to those described above. For example, step-and-scan type projection exposure apparatuses which are different from each other may be used as two exposure apparatuses having respective exposure fields of different sizes.

According to the exposure method of the fourth embodiment, none of the set reference measurement areas extend over a plurality of shot areas on either of two layers (e.g. critical and middle layers). Therefore, no stepping error is contained in an amount of positional displacement between two corresponding overlay accuracy measuring marks measured at any of the measuring points in the reference measurement areas. Accordingly, the overlay accuracy between the two layers can be improved by correcting the coordinates during alignment or the image-formation characteristics on the basis of the measured amounts of positional displacement between the corresponding overlay accuracy measuring marks.

Further, according to the fourth embodiment, an area where any one of a plurality of first shot areas and any one of a plurality of second shot areas are overlaid on one another such that neither of the overlaid shot areas extends over beyond a part of that area (or neither of them extends over a plurality of first or second shot areas) is used as a reference measurement area, and an amount of positional displacement between the corresponding overlay accuracy measuring marks (vernier marks) of the two layers is measured at each of measuring points set in predetermined reference measurement areas. Accordingly, correction values used in detection of the image positions of alignment marks (wafer marks) can be accurately obtained without being affected by stepping errors in the first and second shot areas. As a result, it is possible to increase the overlay accuracy between a critical layer pattern and a middle layer pattern in a case where exposure is carried out by the mix-and-match method with respect to a substrate where a critical layer and a middle layer are mixedly present. It is also possible to eliminate the effects of so-called seam errors between the first-layer shot areas and between the second-layer shot areas in addition to the stepping error.

Further, it is possible to obtain a correction value for an in-shot parameter with high accuracy in a case where a correction value obtained in the third step is a correction value for a parameter indicating a predetermined image-formation characteristic, which is calculated on the basis of the positions of alignment mark images, and the parameter indicating the predetermined image-formation characteristic is at least one parameter selected from the parameter group consisting of shot magnification, shot rotation, and shot perpendicularity. Accordingly, the image-formation characteristics can be corrected with high accuracy by using the corrected in-shot parameter.

In a case where the first exposure apparatus is a one-shot exposure type projection exposure apparatus, and the second exposure apparatus is a scanning exposure type projection exposure apparatus, the exposure method according to the present invention is particularly effective because in such a case the exposure fields of the two exposure apparatuses are likely to differ in size from each other. In the case of a scanning exposure type projection exposure apparatus, the shot magnification, shot rotation and shot perpendicularity can be readily corrected at the time of exposure; therefore the overlay accuracy between the two layers can be further increased by using parameters corrected by the method according to the present invention.

It should be noted that the present invention is not necessarily limited to the above-described first to fourth embodiments, but may adopt various arrangements without departing from the gist of the present invention.

What is claimed is:

1. An exposure method in which mask patterns are overlaid on one another on a substrate, which is an object to be exposed, by using a first and second exposure apparatus having respective exposure fields of different sizes, said exposure method comprising the steps of:

sequentially transferring a first mask pattern onto a plurality of first shot areas on said substrate by using said first exposure apparatus, said plurality of first shot areas being arranged into parallel rows;

detecting at least one of a perpendicularity error of said first shot areas from a design value and a mean value of rotation angles of the first shot areas when a second mask pattern is to be sequentially transferred onto a plurality of second shot areas on said substrate, the second shot areas being different in size from said first shot areas, by using said second exposure apparatus, said perpendicularity error representing a positional shift between said parallel rows of said first shot areas in a direction of said parallel rows, said mean value of rotation angles representing a rotational shift of each of said first shot areas;

rotating said second mask pattern and said substrate relative to each other based on a result of said detection to compensate for the at least one of the detected perpendicularity error and the detected mean value of rotation angles; and sequentially transferring said second mask pattern onto said substrate by using said second exposure apparatus.

2. An exposure method in which mask patterns are overlaid on one another on a substrate, which is an object to be exposed, by using a first exposure apparatus having a first exposure field of a predetermined size, and a second exposure apparatus which moves a mask and said substrate synchronously in a scanning direction to transfer a pattern formed on said mask onto said substrate, said second exposure apparatus having a second exposure field different in size from said first exposure field, said exposure method comprising:

sequentially transferring a first mask pattern onto a plurality of first shot areas on said substrate by using said first exposure apparatus, said plurality of first shot areas being arranged into parallel rows;

detecting at least one of a perpendicularity error of said first shot areas from a design value, and a mean value of rotation angles of the first shot area when a second mask pattern is to be sequentially transferred onto a plurality of second shot areas on said substrate, the second shot areas being different in size from said first shot areas, by using said second exposure apparatus, said perpendicularity error representing a positional shift between said parallel rows of said first shot areas in a direction of said parallel rows, said mean value of rotation angles representing a rotational shift of each of said first shot areas;

displacing said second mask pattern and said substrate relative to each other in a direction perpendicular to the scanning direction of said second exposure apparatus by a distance corresponding to a result of said detection to compensate for the at least one of the detected perpendicularity error and the detected mean value of rotation angles; and sequentially transferring said second mask pattern onto said substrate by using said second exposure apparatus; and rotating said second mask pattern and said substrate relative to each other based on a result of detection of the at least one of the perpendicularity error and the mean value of rotation angles.

3. An exposure method comprising:

transferring a first mask pattern onto a plurality of shot areas on a photosensitive substrate by using a first exposure apparatus having a first exposure field; and transferring a second mask pattern, after transferring said first mask pattern onto said photosensitive substrate, by using a second exposure apparatus which moves said second mask pattern and the substrate synchronously in a scanning direction to transfer said second mask pattern onto the substrate, said second exposure apparatus having a second exposure field which is different from said first exposure field in length in said scanning direction, wherein a relationship between a shot array of said plurality of shot areas formed on said substrate by said first exposure apparatus and said scanning direction of said second exposure apparatus being adjusted to transfer said second mask pattern onto said substrate accurately by said second exposure apparatus.

4. An exposure method according to claim 3, wherein an effect of a perpendicularity error is eliminated by adjusting the scanning direction of said second exposure apparatus.

5. An exposure method comprising:

transferring a first mask pattern, having an even number of partial pattern areas, onto a substrate by using a first exposure apparatus having a first exposure field, a plurality of first shot areas being arranged on said substrate and said even number of partial pattern areas being formed on each of said first shot areas; and transferring a second mask pattern on said substrate by using a second exposure apparatus in which said second mask pattern and the substrate are moved synchronously in respective scanning directions to transfer said second mask pattern onto the substrate, said second exposure apparatus having a second exposure field which is different from said first exposure field, said second mask pattern having an odd number of partial pattern areas arranged in said scanning direction, a plurality of second shot areas being arranged on said substrate, said odd number of partial pattern areas being formed on each of said second shot areas.

6. An exposure method according to claim 5, wherein said even number of partial pattern areas include two partial pattern areas.

7. An exposure method according to claim 5, wherein said odd number of partial pattern areas include three partial pattern areas.

8. An exposure method according to claim 5, wherein after one of said first mask pattern and said second mask pattern has been transferred on the substrate, the other mask pattern is transferred on the substrate, based on information relating to an array of shot areas which have been formed on the substrate by transferring said one mask pattern.

9. An exposure method according to claim 8, wherein said information includes information relating to a perpendicularity error.

10. An exposure method according to claim 8, wherein said information includes information relating to a rotation error.

11. An exposure method according to claim 8, wherein the other mask pattern and the substrate are rotated relative to each other, based on said information.

12. An exposure method according to claim 8, wherein the shot areas formed on the substrate by transferring the other mask pattern are arranged such that the shot areas which are adjacent to each other in a direction of an array of said partial pattern areas are displaced from each other in a direction perpendicular to said direction of the array of the partial pattern areas.

13. An exposure method according to claim 8, wherein in said second exposure apparatus, said scanning direction is adjusted, based on information relating an array of said first shot areas.

14. An exposure method according to claim 3, wherein said first exposure apparatus includes a one-shot exposure type exposure apparatus.

15. An exposure method in which mask patterns are overlaid on one another on a photosensitive substrate, which is an object to be exposed, by using a first exposure apparatus having a first exposure field of a predetermined size on said photosensitive substrate, and a second exposure apparatus having a second exposure field which is $M_1/N_1$ times ($M_1$ and $N_1$ are integers; $M_1 > N_1$) as large as said first exposure field in a first direction and which is $M_2/N_2$ times ($M_2$ and $N_2$ are integers; $M_2 \geq N_2$) as large as said first exposure field in a second direction which is perpendicular to said first direction, said exposure method comprising:

the first step of sequentially transferring an image of a first mask pattern, which has an alignment mark and a first overlay accuracy measuring mark, onto said photosensitive substrate in the form of a two-dimensional array extending in said first and second directions in units of said first exposure field by using said first exposure apparatus;

the second step of transferring an image of a second mask pattern, which has a second overlay accuracy measuring mark, over a plurality of images of said first mask pattern, which have been transferred onto said photosensitive substrate in said first step, in a two-dimensional array extending in said first and second directions on said photosensitive substrate in units of said second exposure field with reference to a position of an image of said alignment mark by using said second exposure apparatus; and the third step of dividing an exposure area on said photosensitive substrate into a plurality of reference measurement areas in units of an area which is $N_1$ times as large as a width of said second exposure field in said first direction on said photosensitive substrate and which is $N_2$ times as large as a width of said second exposure field in said second direction on said photosensitive substrate, and measuring an amount of positional displacement between images of said first and second overlay accuracy measuring marks lying at mutually identical positions in a predetermined number of reference measurement areas selected from among said plurality of reference measurement areas, thereby obtaining a correction value which is used when the position of the image of said alignment mark transferred by said first exposure apparatus is detected by said second exposure apparatus on the basis of said measured amount of positional displacement;

wherein an exposure position is corrected by using said correction value obtained in said third step when overlay exposure is to be carried out thereafter by using said second exposure apparatus with respect to a surface of said photosensitive substrate exposed by said first exposure apparatus.

16. An exposure method according to claim 15, wherein, in said second step, said second exposure apparatus calculates an exposure position on the basis of the image of said alignment mark and by use of a predetermined coordinate transformation parameter, and in said third step, said second exposure apparatus obtains a correction value for said coordinate transformation parameter.

17. An exposure method in which mask patterns are overlaid on one another on a photosensitive substrate by using a first and second exposure apparatuses having respective exposure fields of different sizes, said exposure method comprising the steps of:

sequentially transferring images of a first and second mask patterns containing overlay accuracy measuring marks onto a photosensitive substrate for evaluation such that the images of said first and second mask patterns are overlaid on one another by using said first and second exposure apparatuses;

measuring an amount of positional displacement between the overlaid images of said overlay accuracy measuring marks at a predetermined measuring point in a reference measurement area on said evaluation photosensitive substrate in which a shot area formed in units of the exposure field of said first exposure apparatus and a shot area formed in units of the exposure field of said second exposure apparatus are overlaid on one another such that neither of said overlaid shot areas extends over beyond a part of said reference measurement area; and effecting alignment or correction of image-formation characteristics on the basis of a result of said measurement when exposure is to be carried out by said second exposure apparatus with respect to a surface of said photosensitive substrate exposed by said first exposure apparatus.

18. An exposure method in which mask patterns are overlaid on one another on a photosensitive substrate, which is an object to be exposed, by using a first exposure apparatus having a first exposure field of a predetermined size on said photosensitive substrate, and a second exposure apparatus having a second exposure field which is $M_1/N_1$ times ($M_1$ and $N_1$ are integers; $M_1 \neq N_1$) as large as said first exposure field in a first direction and which is $M_2/N_2$ times ($M_2$ and $N_2$ are integers) as large as said first exposure field in a second direction which is perpendicular to said first direction, said exposure method comprising:

the first step of sequentially transferring an image of a first mask pattern, which has an alignment mark and a first overlay accuracy measuring mark, onto a plurality of first shot areas arrayed on said photosensitive substrate in units of said first exposure field by using said first exposure apparatus;

the second step of sequentially transferring an image of a second mask pattern, which has a second overlay accuracy measuring mark, onto a plurality of second shot areas arrayed on said photosensitive substrate, exposed in said first step, in units of said second exposure field with reference to a position of an image of said alignment mark by using said second exposure apparatus; and the third step of defining a plurality of reference measurement areas on said photosensitive substrate in each of which any one of said first shot areas and any one of said second shot areas are overlaid on one another such that neither of said overlaid shot areas extends over beyond a part of said reference measurement area, and measuring an amount of positional displacement between images of said first and second overlay accuracy measuring marks lying at mutually identical positions in a predetermined number of reference measurement areas selected from among said plurality of reference measurement areas, thereby obtaining a correction value which is used when the position of the image of said alignment mark transferred by said first exposure apparatus is detected by said second exposure apparatus on the basis of said measured amount of positional displacement.

19. An exposure method according to claim 18, wherein the correction value obtained in said third step is a correction value for a parameter indicating a predetermined image-formation characteristic calculated on the basis of the position of the image of said alignment mark, said parameter being at least one parameter selected from a parameter group consisting of shot magnification, shot rotation, and shot perpendicularity, and wherein said image-formation characteristic is corrected by using the correction value obtained in said third step when overlay exposure is to be carried out thereafter by using said second exposure apparatus with respect to a surface of said photosensitive substrate exposed by said first exposure apparatus.

20. An exposure method according to claim 18, wherein said first exposure apparatus is a one-shot exposure type projection exposure apparatus, and said second exposure apparatus is a scanning exposure type projection exposure apparatus.

21. An exposure method comprising:

transferring a first mask pattern, which has partial pattern areas, on a substrate, wherein a plurality of first shot areas are arranged on said substrate and the partial pattern areas are formed in each of said first shot areas; and transferring a second mask pattern, which has partial pattern areas, on said substrate, wherein a plurality of second shot areas are arranged on the substrate based on an array of the first shot areas, and wherein a part of the partial pattern areas formed within one first shot of the first shot areas is contained in one second shot of the second shot areas, and another part of the partial pattern areas within said one first shot is contained in another second shot.

22. An exposure method according to claim 21, wherein the partial pattern areas of said first mask pattern and the partial pattern areas of said second mask pattern are different in number.

23. An exposure method according to claim 21, wherein one of said first mask pattern and said second mask pattern has an even number of partial pattern areas and the other mask pattern has an odd number of partial pattern areas.

24. An exposure method according to claim 23, wherein said odd number of partial pattern areas include three partial pattern areas.

25. An exposure method according to claim 23, wherein said even number of partial pattern areas include two partial pattern areas.

26. An exposure method according to claim 21, wherein said second mask pattern and the substrate are rotated relative to each other, based on information relating to an array of said first shot areas.

27. An exposure method according to claim 21, wherein the second shot areas formed on the substrate are arranged such that the shot areas which are adjacent to each other in a direction of an array of said partial pattern areas are displaced from each other in a direction perpendicular to said direction of the array of the partial pattern areas.

28. An exposure method according to claim 21, wherein at least one of said first mask pattern and said second mask pattern is transferred on the substrate by a scanning exposure method.

* * * * *

UNITED STATES PATENT AND TRADEMARK OFFICE
Certificate

Patent No. 5,989,761

Patented: November 23, 1999

On petition requesting issuance of a certificate for correction of inventorship pursuant to 35 U.S.C. 256, it has been found that the above identified patent, through error and without deceptive intent, improperly sets forth the inventorship.

Accordingly, it is hereby certified that the correct inventorship of this patent is: Masaharu Kawakubo, Kanagawa-ken, Japan.

Signed and Sealed this Twelth Day of June, 2001.

MARK F. HUFF
*Supervisory Patent Examiner*
Art Unit 1756

UNITED STATES PATENT AND TRADEMARK OFFICE
CERTIFICATE OF CORRECTION

PATENT NO. : 5,989,761
DATED : November 23, 1999
INVENTOR(S) : Masaharu Kawakubo et al.

It is certified that error appears in the above-identified patent and that said Letters Patent is hereby corrected as shown below:

Claims,
Delete claims 15-20.

Signed and Sealed this

Thirteenth Day of November, 2001

Attest:

*Attesting Officer*

NICHOLAS P. GODICI
*Acting Director of the United States Patent and Trademark Office*